US011579235B2

(12) United States Patent
Adest et al.

(10) Patent No.: US 11,579,235 B2
(45) Date of Patent: Feb. 14, 2023

(54) SAFETY MECHANISMS, WAKE UP AND SHUTDOWN METHODS IN DISTRIBUTED POWER INSTALLATIONS

(75) Inventors: Meir Adest, Raanana (IL); Guy Sella, Bitan Aharon (IL); Lior Handelsman, Givataim (IL); Yoav Galin, Raanana (IL); Amir Fishelov, Tel Aviv (IL); Meir Gazit, Ashkelon (IL); Yaron Binder, Haifa (IL); Nikolay Radimov, Holon (IL)

(73) Assignee: Solaredge Technologies Ltd., Herzeliya (IL)

( * ) Notice: Subject to any disclaimer, the term of this patent is extended or adjusted under 35 U.S.C. 154(b) by 832 days.

(21) Appl. No.: 13/430,388

(22) Filed: Mar. 26, 2012

(65) Prior Publication Data

US 2012/0212066 A1    Aug. 23, 2012

Related U.S. Application Data

(63) Continuation-in-part of application No. 12/329,525, filed on Dec. 5, 2008, now Pat. No. 8,531,055, which
(Continued)

(51) Int. Cl.
*G01S 3/786* (2006.01)
*H02J 3/46* (2006.01)
(Continued)

(52) U.S. Cl.
CPC ...... *G01S 3/7861* (2013.01); *H01L 31/02021* (2013.01); *H02J 1/102* (2013.01);
(Continued)

(58) Field of Classification Search
CPC .. H02J 1/102; H02J 3/383; H02J 3/385; H02J 7/35; H02J 9/00; H02J 3/381; H02J 3/388;
(Continued)

(56) References Cited

U.S. PATENT DOCUMENTS 2,367,925 A    1/1945  Brown
2,758,219 A    8/1956  Miller
(Continued)

FOREIGN PATENT DOCUMENTS

AU    2073800 A        9/2000
AU    2005262278 A1    1/2006
(Continued)

OTHER PUBLICATIONS

Ciobotaru, et al., Control of single-stage single-phase PV inverter, Aug. 7, 2006.
(Continued)

*Primary Examiner* — Hal Kaplan
(74) *Attorney, Agent, or Firm* — Banner & Witcoff, Ltd.

(57) ABSTRACT

A distributed power system including multiple DC power sources and multiple power modules. The power modules include inputs coupled respectively to the DC power sources and outputs coupled in series to form a serial string. An inverter is coupled to the serial string. The inverter converts power input from the serial string to output power. A signaling mechanism between the inverter and the power module is adapted for controlling operation of the power modules.

87 Claims, 15 Drawing Sheets

Related U.S. Application Data is a continuation-in-part of application No. 11/950,271, filed on Dec. 4, 2007, application No. 13/430,388, which is a continuation-in-part of application No. 12/187,335, filed on Aug. 6, 2008, now Pat. No. 8,319,483.

(60) Provisional application No. 60/992,589, filed on Dec. 5, 2007, provisional application No. 60/916,815, filed on May 9, 2007, provisional application No. 60/908,095, filed on Mar. 26, 2007, provisional application No. 60/868,962, filed on Dec. 7, 2006, provisional application No. 60/868,851, filed on Dec. 6, 2006, provisional application No. 60/868,893, filed on Dec. 6, 2006, provisional application No. 60/954,354, filed on Aug. 7, 2007, provisional application No. 60/954,261, filed on Aug. 6, 2007.

(51) Int. Cl.
| | | |
|---|---|---|
| *H02M 7/493* | (2007.01) | |
| *H02J 1/10* | (2006.01) | |
| *H01L 31/02* | (2006.01) | |
| *H04B 3/54* | (2006.01) | |
| *H02J 3/38* | (2006.01) | |
| *H02M 7/44* | (2006.01) | |
| *H02J 7/35* | (2006.01) | |
| *H02M 3/158* | (2006.01) | |
| *H02M 1/00* | (2006.01) | |

(52) U.S. Cl.
CPC ............... *H02J 3/381* (2013.01); *H02J 3/46* (2013.01); *H02M 7/44* (2013.01); *H02M 7/493* (2013.01); *H04B 3/548* (2013.01); *H02J 3/388* (2020.01); *H02J 7/35* (2013.01); *H02J 2300/24* (2020.01); *H02J 2300/26* (2020.01); *H02J 2300/28* (2020.01); *H02M 1/0077* (2021.05); *H02M 3/1582* (2013.01); *Y02E 10/56* (2013.01); *Y02E 10/76* (2013.01)

(58) Field of Classification Search
CPC ...... H02J 3/46; H02J 2300/24; H02J 2300/26; H02J 2300/28; H01L 31/02021; Y02E 10/563; Y02E 10/566; Y02E 10/58; Y02E 10/56; Y02E 10/76; Y10T 307/707; H02M 7/44; H02M 7/493; H02M 1/0077; H02M 3/1582; H04B 3/548; G06F 1/32; G01S 3/7861
USPC .................................................. 307/43, 82
See application file for complete search history.

(56) References Cited

U.S. PATENT DOCUMENTS

| | | |
|---|---|---|
| 2,852,721 A | 9/1958 | Harders et al. |
| 3,369,210 A | 2/1968 | Manickella |
| 3,392,326 A | 7/1968 | Lamberton |
| 3,566,143 A | 2/1971 | Paine et al. |
| 3,569,784 A | 3/1971 | Carroll et al. |
| 3,596,229 A | 7/1971 | Hohorst |
| 3,643,564 A | 2/1972 | Uchiyama |
| 3,696,286 A | 10/1972 | Ule |
| 3,740,652 A | 6/1973 | Burgener |
| 3,958,136 A | 5/1976 | Schroeder |
| 3,982,105 A | 9/1976 | Eberle |
| 4,060,757 A | 11/1977 | McMurray |
| 4,101,816 A | 7/1978 | Shepter |
| 4,104,687 A | 8/1978 | Zulaski |
| 4,127,797 A | 11/1978 | Perper |
| 4,129,788 A | 12/1978 | Chavannes |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,324,225 A | 4/1982 | Hey |
| 4,346,341 A | 8/1982 | Blackburn et al. |
| 4,367,557 A | 1/1983 | Stern et al. |
| 4,375,662 A | 3/1983 | Baker |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,479,175 A | 10/1984 | Gille et al. |
| 4,481,654 A | 11/1984 | Daniels et al. |
| 4,488,136 A | 12/1984 | Hansen et al. |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,772,994 A | 9/1988 | Harada et al. |
| 4,783,728 A | 11/1988 | Hoffman |
| 4,797,803 A | 1/1989 | Carroll |
| 4,819,121 A | 4/1989 | Saito et al. |
| RE33,057 E | 9/1989 | Clegg et al. |
| 4,864,213 A | 9/1989 | Kido |
| 4,868,379 A | 10/1989 | West |
| 4,873,480 A | 10/1989 | Lafferty |
| 4,888,063 A | 12/1989 | Powell |
| 4,888,702 A | 12/1989 | Gerken et al. |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,045,988 A | 9/1991 | Gritter et al. |
| 5,054,023 A | 10/1991 | Kronberg |
| 5,081,558 A | 1/1992 | Mahler |
| 5,138,422 A | 8/1992 | Fujii et al. |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |

(56) References Cited

U.S. PATENT DOCUMENTS

| | | |
|---|---|---|
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,402,060 A | 3/1995 | Erisman |
| 5,404,059 A | 4/1995 | Loffler |
| 5,412,558 A | 5/1995 | Sakurai et al. |
| 5,413,313 A | 5/1995 | Mutterlein et al. |
| 5,446,645 A | 8/1995 | Shirahama et al. |
| 5,460,546 A | 10/1995 | Kunishi et al. |
| 5,475,296 A | 12/1995 | Vinsant et al. |
| 5,477,091 A | 12/1995 | Fiorina et al. |
| 5,493,154 A | 2/1996 | Smith et al. |
| 5,497,289 A | 3/1996 | Sugishima et al. |
| 5,501,083 A | 3/1996 | Kim |
| 5,504,418 A | 4/1996 | Ashley |
| 5,504,449 A | 4/1996 | Prentice |
| 5,517,378 A | 5/1996 | Asplund et al. |
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,576,941 A | 11/1996 | Nguyen et al. |
| 5,585,749 A | 12/1996 | Pace et al. |
| 5,604,430 A | 2/1997 | Decker et al. |
| 5,616,913 A | 4/1997 | Litterst |
| 5,625,539 A | 4/1997 | Nakata et al. |
| 5,636,107 A | 6/1997 | Lu et al. |
| 5,644,219 A | 7/1997 | Kurokawa |
| 5,646,501 A | 7/1997 | Fishman et al. |
| 5,648,731 A | 7/1997 | Decker et al. |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,615 A | 3/1998 | Bloom |
| 5,731,603 A | 3/1998 | Nakagawa et al. |
| 5,734,258 A | 3/1998 | Esser |
| 5,734,565 A | 3/1998 | Mueller et al. |
| 5,747,967 A | 5/1998 | Muljadi et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Coppie |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,959,438 A | 9/1999 | Jovanovic et al. |
| 5,961,739 A | 10/1999 | Osborne |
| 5,963,010 A | 10/1999 | Hayashi et al. |
| 5,963,078 A | 10/1999 | Wallace |
| 5,986,909 A | 11/1999 | Hammond et al. |
| 5,990,659 A | 11/1999 | Frannhagen |
| 6,002,290 A | 12/1999 | Avery et al. |
| 6,002,603 A | 12/1999 | Carver |
| 6,008,971 A | 12/1999 | Duba et al. |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,127,801 A | 10/2000 | Manor |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,191,498 B1 | 2/2001 | Chang |
| 6,215,286 B1 | 4/2001 | Scoones et al. |
| 6,219,623 B1 | 4/2001 | Wills |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |
| 6,281,485 B1 | 8/2001 | Siri |
| 6,285,572 B1 | 9/2001 | Onizuka et al. |
| 6,291,764 B1 | 9/2001 | Ishida et al. |
| 6,292,379 B1 | 9/2001 | Edevold et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,329,808 B1 | 12/2001 | Enguent |
| 6,331,670 B2 | 12/2001 | Takehara et al. |
| 6,339,538 B1 | 1/2002 | Handleman |
| 6,346,451 B1 | 2/2002 | Simpson et al. |
| 6,348,781 B1 | 2/2002 | Midya et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,396,239 B1 | 5/2002 | Benn et al. |

(56) References Cited

U.S. PATENT DOCUMENTS

| | | |
|---|---|---|
| 6,400,579 B2 | 6/2002 | Cuk |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |
| 6,448,489 B2 | 9/2002 | Kimura et al. |
| 6,452,814 B1 | 9/2002 | Wittenbreder |
| 6,469,919 B1 | 10/2002 | Bennett |
| 6,472,254 B2 | 10/2002 | Cantarini et al. |
| 6,479,963 B1 | 11/2002 | Manor et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,512,444 B1 | 1/2003 | Morris, Jr. et al. |
| 6,515,215 B1 | 2/2003 | Mimura |
| 6,515,217 B1 | 2/2003 | Aylaian |
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,603,672 B1 | 8/2003 | Deng et al. |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,636,431 B2 | 10/2003 | Seki et al. |
| 6,650,031 B1 | 11/2003 | Goldack |
| 6,650,560 B1 | 11/2003 | MacDonald et al. |
| 6,653,549 B2 | 11/2003 | Matsushita et al. |
| 6,657,419 B2 | 12/2003 | Renyolds |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,708,507 B1 | 3/2004 | Sem et al. |
| 6,709,291 B1 | 3/2004 | Wallace et al. |
| 6,731,136 B2 | 5/2004 | Knee |
| 6,738,692 B2 | 5/2004 | Schienbein et al. |
| 6,744,643 B2 | 6/2004 | Luo et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |
| 6,810,339 B2 | 10/2004 | Wills |
| 6,812,396 B2 | 11/2004 | Makita et al. |
| 6,828,203 B2 | 12/2004 | Inaba |
| 6,828,503 B2 | 12/2004 | Yoshikawa et al. |
| 6,835,491 B2 | 12/2004 | Gartstein et al. |
| 6,837,739 B2 | 1/2005 | Gorringe et al. |
| 6,838,611 B2 | 1/2005 | Kondo et al. |
| 6,842,354 B1 | 1/2005 | Tallam et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,970,365 B2 | 11/2005 | Turchi |
| 6,980,783 B2 | 12/2005 | Liu et al. |
| 6,984,967 B2 | 1/2006 | Notman |
| 6,984,970 B2 | 1/2006 | Capel |
| 6,985,967 B1 | 1/2006 | Hipp |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,039,941 B1 | 5/2006 | Caporizzo et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,088,595 B2 | 8/2006 | Nino |
| 7,089,780 B2 | 8/2006 | Sunshine et al. |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,142,997 B1 | 11/2006 | Widner |
| 7,148,669 B2 | 12/2006 | Maksimovic et al. |
| 7,157,888 B2 | 1/2007 | Chen et al. |
| 7,158,359 B2 | 1/2007 | Bertele et al. |
| 7,158,395 B2 | 1/2007 | Deng et al. |
| 7,161,082 B2 | 1/2007 | Matsushita et al. |
| 7,174,973 B1 | 2/2007 | Lysaght |
| 7,176,667 B2 | 2/2007 | Chen et al. |
| 7,183,667 B2 | 2/2007 | Colby et al. |
| 7,193,872 B2 | 3/2007 | Siri |
| 7,202,653 B2 | 4/2007 | Pai |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,262,979 B2 | 8/2007 | Wai et al. |
| 7,276,886 B2 | 10/2007 | Kinder et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,282,924 B1 | 10/2007 | Wittner |
| 7,291,036 B1 | 11/2007 | Daily et al. |
| 7,298,113 B2 | 11/2007 | Orikasa |
| RE39,976 E | 1/2008 | Schiff et al. |
| 7,315,052 B2 | 1/2008 | Alter |
| 7,319,313 B2 | 1/2008 | Dickerson et al. |
| 7,324,361 B2 | 1/2008 | Siri |
| 7,336,004 B2 | 2/2008 | Lai |
| 7,336,056 B1 | 2/2008 | Dening |
| 7,339,287 B2 | 3/2008 | Jepsen et al. |
| 7,348,802 B2 | 3/2008 | Kasanyal et al. |
| 7,352,154 B2 | 4/2008 | Cook |
| 7,361,952 B2 | 4/2008 | Miura et al. |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |

(56) References Cited

U.S. PATENT DOCUMENTS

| | | |
|---|---|---|
| 7,388,348 B2 | 6/2008 | Mattichak |
| 7,391,190 B1 | 6/2008 | Rajagopalan |
| 7,394,237 B2 | 7/2008 | Chou et al. |
| 7,405,117 B2 | 7/2008 | Zuniga et al. |
| 7,414,870 B2 | 8/2008 | Rottger et al. |
| 7,420,354 B2 | 9/2008 | Cutler |
| 7,420,815 B2 | 9/2008 | Love |
| 7,432,691 B2 | 10/2008 | Cutler |
| 7,435,134 B2 | 10/2008 | Lenox |
| 7,435,897 B2 | 10/2008 | Russell |
| 7,443,052 B2 | 10/2008 | Wendt et al. |
| 7,443,152 B2 | 10/2008 | Utsunomiya |
| 7,450,401 B2 | 11/2008 | Iida |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |
| 7,485,987 B2 | 2/2009 | Mori et al. |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,596,008 B2 | 9/2009 | Iwata et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,602,626 B2 | 10/2009 | Iwata et al. |
| 7,605,498 B2 | 10/2009 | Ledenev et al. |
| 7,612,283 B2 | 11/2009 | Toyomura et al. |
| 7,615,981 B2 | 11/2009 | Wong et al. |
| 7,626,834 B2 | 12/2009 | Chisenga et al. |
| 7,634,667 B2 | 12/2009 | Weaver et al. |
| 7,646,116 B2 | 1/2010 | Batarseh et al. |
| 7,649,434 B2 | 1/2010 | Xu et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |
| 7,763,807 B2 | 7/2010 | Richter |
| 7,777,570 B2 | 8/2010 | Lai |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,592 B2 | 10/2010 | Prior et al. |
| 7,812,701 B2 | 10/2010 | Lee et al. |
| 7,821,225 B2 | 10/2010 | Chou et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 7,962,249 B1 | 6/2011 | Zhang et al. |
| 7,969,133 B2 | 6/2011 | Zhang et al. |
| 7,977,810 B2 | 7/2011 | Choi et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,237 B2 | 8/2011 | Manor et al. |
| 8,004,866 B2 | 8/2011 | Bucella et al. |
| 8,013,472 B2 | 9/2011 | Adest et al. |
| 8,018,748 B2 | 9/2011 | Leonard |
| 8,039,730 B2 | 10/2011 | Hadar et al. |
| 8,050,804 B2 | 11/2011 | Kemahan |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,080,986 B2 | 12/2011 | Lai et al. |
| 8,089,780 B2 | 1/2012 | Mochikawa et al. |
| 8,089,785 B2 | 1/2012 | Rodriguez |
| 8,090,548 B2 | 1/2012 | Abdennadher et al. |
| 8,093,756 B2 | 1/2012 | Porter et al. |
| 8,093,757 B2 | 1/2012 | Wolfs |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,148,849 B2 | 4/2012 | Zanarini et al. |
| 8,158,877 B2 | 4/2012 | Klein et al. |
| 8,169,252 B2 | 5/2012 | Fahrenbruch et al. |
| 8,179,147 B2 | 5/2012 | Dargatz et al. |
| 8,184,460 B2 | 5/2012 | O'Brien et al. |
| 8,188,610 B2 | 5/2012 | Scholte-Wassink |
| 8,204,709 B2 | 6/2012 | Presher, Jr. et al. |
| 8,212,408 B2 | 7/2012 | Fishman |
| 8,212,409 B2 | 7/2012 | Bettenwort et al. |
| 8,233,301 B1 | 7/2012 | Guo |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,284,574 B2 | 10/2012 | Chapman et al. |
| 8,289,742 B2 | 10/2012 | Adest et al. |
| 8,299,757 B2 | 10/2012 | Yamauchi et al. |
| 8,299,773 B2 | 10/2012 | Jang et al. |
| 8,304,932 B2 | 11/2012 | Ledenev et al. |
| 8,310,101 B2 | 11/2012 | Amaratunga et al. |
| 8,310,102 B2 | 11/2012 | Raju |
| 8,314,375 B2 | 11/2012 | Arditi et al. |
| 8,325,059 B2 | 12/2012 | Rozenboim |
| 8,369,113 B2 | 2/2013 | Rodriguez |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,415,552 B2 | 4/2013 | Hadar et al. |
| 8,415,937 B2 | 4/2013 | Hester |
| 8,436,592 B2 | 5/2013 | Saitoh |
| 8,461,809 B2 | 6/2013 | Rodriguez |
| 8,466,789 B2 | 6/2013 | Muhlberger et al. |
| 8,473,250 B2 | 6/2013 | Adest et al. |
| 8,509,032 B2 | 8/2013 | Rakib |
| 8,570,017 B2 | 10/2013 | Perichon et al. |
| 8,581,441 B2 | 11/2013 | Rotzoll et al. |
| 8,587,151 B2 | 11/2013 | Adest et al. |
| 8,618,692 B2 | 12/2013 | Adest et al. |
| 8,653,689 B2 | 2/2014 | Rozenboim |
| 8,669,675 B2 | 3/2014 | Capp et al. |
| 8,670,255 B2 | 3/2014 | Gong et al. |
| 8,686,333 B2 | 4/2014 | Arditi et al. |
| 8,751,053 B2 | 6/2014 | Hadar et al. |
| 8,773,236 B2 | 7/2014 | Makhota et al. |
| 8,796,884 B2 | 8/2014 | Naiknaware et al. |
| 8,811,047 B2 | 8/2014 | Rodriguez |

(56) References Cited

U.S. PATENT DOCUMENTS

| | | |
|---|---|---|
| 8,823,218 B2 | 9/2014 | Hadar et al. |
| 8,823,342 B2 | 9/2014 | Williams |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,860,241 B2 | 10/2014 | Hadar et al. |
| 8,860,246 B2 | 10/2014 | Hadar et al. |
| 8,922,061 B2 | 12/2014 | Arditi |
| 8,933,321 B2 | 1/2015 | Hadar et al. |
| 8,963,378 B1 | 2/2015 | Fornage et al. |
| 8,963,518 B2 | 2/2015 | Wolfs |
| 9,088,178 B2 | 7/2015 | Adest et al. |
| 9,130,401 B2 | 9/2015 | Adest et al. |
| 9,257,848 B2 | 2/2016 | Coccia et al. |
| 9,362,743 B2 | 6/2016 | Gazit et al. |
| 9,397,497 B2 | 7/2016 | Ledenev |
| 9,401,664 B2 | 7/2016 | Perreault et al. |
| 9,407,161 B2 | 8/2016 | Adest et al. |
| 9,466,737 B2 | 10/2016 | Ledenev |
| 9,647,442 B2 | 5/2017 | Yoscovich et al. |
| 9,660,527 B2 | 5/2017 | Glovinski |
| 9,673,630 B2 | 6/2017 | Ledenev et al. |
| 9,819,178 B2 | 11/2017 | Gazit et al. |
| 9,831,916 B2 | 11/2017 | Behrends |
| 9,843,193 B2 | 12/2017 | Getsla |
| 9,865,411 B2 | 1/2018 | Friebe et al. |
| 9,923,516 B2 | 3/2018 | Har-Shai et al. |
| 9,991,717 B1 | 6/2018 | Rowe et al. |
| 10,032,939 B2 | 7/2018 | Ledenev et al. |
| 10,256,770 B2 | 4/2019 | Hadar et al. |
| 2001/0011881 A1 | 8/2001 | Emori et al. |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0014262 A1 | 2/2002 | Matsushita et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0047693 A1 | 4/2002 | Chang |
| 2002/0056089 A1 | 5/2002 | Houston |
| 2002/0063552 A1 | 5/2002 | Arakawa |
| 2002/0063625 A1 | 5/2002 | Takehara et al. |
| 2002/0078991 A1 | 6/2002 | Nagao et al. |
| 2002/0080027 A1 | 6/2002 | Conley |
| 2002/0105765 A1 | 8/2002 | Kondo et al. |
| 2002/0118559 A1 | 8/2002 | Kurokami et al. |
| 2002/0127980 A1 | 9/2002 | Amanullah et al. |
| 2002/0134567 A1 | 9/2002 | Rasmussen et al. |
| 2002/0148497 A1 | 10/2002 | Sasaoka et al. |
| 2002/0149950 A1 | 10/2002 | Takebayashi |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2003/0001709 A1 | 1/2003 | Visser |
| 2003/0038615 A1 | 2/2003 | Elbanhawy |
| 2003/0043597 A1 | 3/2003 | Betts-LaCroix |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0094931 A1 | 5/2003 | Renyolds |
| 2003/0107352 A1 | 6/2003 | Downer et al. |
| 2003/0121514 A1 | 7/2003 | Davenport et al. |
| 2003/0127126 A1 | 7/2003 | Yang |
| 2003/0140960 A1 | 7/2003 | Baum et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0206424 A1 | 11/2003 | Jungreis et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0027101 A1 | 2/2004 | Vinciarelli et al. |
| 2004/0027112 A1 | 2/2004 | Kondo et al. |
| 2004/0041548 A1 | 3/2004 | Perry |
| 2004/0056642 A1 | 3/2004 | Nebrigic et al. |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0141345 A1 | 7/2004 | Cheng et al. |
| 2004/0150410 A1 | 8/2004 | Schoepf et al. |
| 2004/0164718 A1 | 8/2004 | McDaniel et al. |
| 2004/0165408 A1 | 8/2004 | West et al. |
| 2004/0169499 A1 | 9/2004 | Huang et al. |
| 2004/0170038 A1 | 9/2004 | Ichinose et al. |
| 2004/0189090 A1 | 9/2004 | Yanagida et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211456 A1 | 10/2004 | Brown et al. |
| 2004/0211458 A1 | 10/2004 | Gui et al. |
| 2004/0211459 A1 | 10/2004 | Suenaga et al. |
| 2004/0213169 A1 | 10/2004 | Allard et al. |
| 2004/0223351 A1 | 11/2004 | Kurokami et al. |
| 2004/0230343 A1 | 11/2004 | Zalesski |
| 2004/0233685 A1 | 11/2004 | Matsuo et al. |
| 2004/0246226 A1 | 12/2004 | Moon |
| 2004/0255999 A1 | 12/2004 | Matsushita et al. |
| 2004/0258141 A1 | 12/2004 | Tustison et al. |
| 2004/0262998 A1 | 12/2004 | Kunow et al. |
| 2004/0263119 A1 | 12/2004 | Meyer et al. |
| 2004/0263183 A1 | 12/2004 | Naidu et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0077879 A1 | 4/2005 | Near |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0110454 A1 | 5/2005 | Tsai et al. |
| 2005/0121067 A1 | 6/2005 | Toyomura et al. |
| 2005/0122747 A1 | 6/2005 | Gaksch |
| 2005/0135031 A1 | 6/2005 | Colby et al. |
| 2005/0139258 A1 | 6/2005 | Liu et al. |
| 2005/0162018 A1 | 7/2005 | Realmuto et al. |
| 2005/0163063 A1 | 7/2005 | Kuchler et al. |
| 2005/0172995 A1 | 8/2005 | Rohrig et al. |
| 2005/0179420 A1 | 8/2005 | Satoh et al. |
| 2005/0191528 A1 | 9/2005 | Cortes et al. |
| 2005/0201397 A1 | 9/2005 | Petite |
| 2005/0213272 A1 | 9/2005 | Kobayashi |
| 2005/0218876 A1 | 10/2005 | Nino |
| 2005/0225090 A1 | 10/2005 | Wobben |
| 2005/0226017 A1 | 10/2005 | Kotsopoulos et al. |

(56) References Cited

U.S. PATENT DOCUMENTS

| | | |
|---|---|---|
| 2005/0231183 A1 | 10/2005 | Li et al. |
| 2005/0242795 A1 | 11/2005 | Al-Kuran et al. |
| 2005/0248428 A1 | 11/2005 | Coleman et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2005/0286510 A1 | 12/2005 | Nakajima et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0053447 A1 | 3/2006 | Krzyzanowski et al. |
| 2006/0055384 A1 | 3/2006 | Jordan et al. |
| 2006/0066349 A1 | 3/2006 | Murakami |
| 2006/0068239 A1 | 3/2006 | Norimatsu et al. |
| 2006/0091958 A1 | 5/2006 | Bhatti et al. |
| 2006/0103360 A9 | 5/2006 | Cutler |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0116968 A1 | 6/2006 | Arisawa |
| 2006/0118162 A1 | 6/2006 | Saelzer et al. |
| 2006/0125449 A1 | 6/2006 | Unger |
| 2006/0132102 A1 | 6/2006 | Harvey |
| 2006/0149396 A1 | 7/2006 | Templeton |
| 2006/0152085 A1 | 7/2006 | Flett et al. |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222912 A1 | 10/2006 | Smith |
| 2006/0222916 A1 | 10/2006 | Norimatsu et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0237058 A1 | 10/2006 | McClintock et al. |
| 2006/0238750 A1 | 10/2006 | Shimotomai |
| 2006/0243318 A1 | 11/2006 | Feldmeier et al. |
| 2006/0261751 A1 | 11/2006 | Okabe et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0029636 A1 | 2/2007 | Kanemaru et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0103108 A1 | 5/2007 | Capp et al. |
| 2007/0103297 A1 | 5/2007 | Armstrong et al. |
| 2007/0107767 A1 | 5/2007 | Hayden et al. |
| 2007/0115635 A1 | 5/2007 | Low et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0217178 A1 | 9/2007 | Johnson et al. |
| 2007/0223165 A1 | 9/2007 | Itri et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0246546 A1 | 10/2007 | Yoshida |
| 2007/0247877 A1 | 10/2007 | Kwon et al. |
| 2007/0271006 A1 | 11/2007 | Golden et al. |
| 2007/0273240 A1 | 11/2007 | Steele et al. |
| 2007/0273342 A1 | 11/2007 | Kataoka et al. |
| 2007/0273351 A1 | 11/2007 | Matan |
| 2007/0284451 A1 | 12/2007 | Uramoto |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0023061 A1 | 1/2008 | Clemens et al. |
| 2008/0024098 A1 | 1/2008 | Hojo |
| 2008/0030198 A1 | 2/2008 | Kawata et al. |
| 2008/0036440 A1 | 2/2008 | Garmer |
| 2008/0055941 A1 | 3/2008 | Victor et al. |
| 2008/0072091 A1 | 3/2008 | Hanson et al. |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0156551 A1 | 7/2008 | Kawahara et al. |
| 2008/0164766 A1 | 7/2008 | Adest et al. |
| 2008/0179949 A1 | 7/2008 | Besser et al. |
| 2008/0186004 A1 | 8/2008 | Williams |
| 2008/0191560 A1 | 8/2008 | Besser et al. |
| 2008/0191675 A1 | 8/2008 | Besser et al. |
| 2008/0192510 A1 | 8/2008 | Falk |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266913 A1 | 10/2008 | Brotto et al. |
| 2008/0266919 A1 | 10/2008 | Mallwitz |
| 2008/0283118 A1 | 11/2008 | Rotzoll et al. |
| 2008/0291707 A1 | 11/2008 | Fang |
| 2008/0294472 A1 | 11/2008 | Yamada |
| 2008/0297963 A1 | 12/2008 | Lee et al. |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0012917 A1 | 1/2009 | Thompson et al. |
| 2009/0014050 A1 | 1/2009 | Haaf |
| 2009/0014058 A1 | 1/2009 | Croft et al. |

(56) References Cited

U.S. PATENT DOCUMENTS

| | | |
|---|---|---|
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0039833 A1 | 2/2009 | Kitagawa |
| 2009/0039852 A1 | 2/2009 | Fishelov et al. |
| 2009/0064252 A1 | 3/2009 | Howarter et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0097283 A1 | 4/2009 | Krein et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0179500 A1 | 7/2009 | Ragonese et al. |
| 2009/0179662 A1 | 7/2009 | Moulton et al. |
| 2009/0182532 A1 | 7/2009 | Stoeber et al. |
| 2009/0183763 A1 | 7/2009 | Meyer |
| 2009/0184746 A1 | 7/2009 | Fahrenbruch |
| 2009/0189456 A1 | 7/2009 | Skutt |
| 2009/0190275 A1 | 7/2009 | Gilmore et al. |
| 2009/0195081 A1 | 8/2009 | Quardt et al. |
| 2009/0206666 A1 | 8/2009 | Sella et al. |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284232 A1 | 11/2009 | Zhang et al. |
| 2009/0284240 A1 | 11/2009 | Zhang et al. |
| 2009/0284998 A1 | 11/2009 | Zhang et al. |
| 2009/0295225 A1 | 12/2009 | Asplund et al. |
| 2009/0296434 A1 | 12/2009 | De Rooij et al. |
| 2009/0322494 A1 | 12/2009 | Lee |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0026097 A1 | 2/2010 | Avrutsky et al. |
| 2010/0043781 A1 | 2/2010 | Jones et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0085670 A1 | 4/2010 | Palaniswami et al. |
| 2010/0103579 A1 | 4/2010 | Carkner et al. |
| 2010/0115093 A1 | 5/2010 | Rice |
| 2010/0124027 A1 | 5/2010 | Handelsman et al. |
| 2010/0127570 A1 | 5/2010 | Hadar et al. |
| 2010/0127571 A1 | 5/2010 | Hadar et al. |
| 2010/0131108 A1 | 5/2010 | Meyer |
| 2010/0132757 A1 | 6/2010 | He et al. |
| 2010/0132758 A1 | 6/2010 | Gilmore |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0141153 A1 | 6/2010 | Recker et al. |
| 2010/0176773 A1 | 7/2010 | Capel |
| 2010/0181957 A1 | 7/2010 | Goeltner |
| 2010/0191383 A1 | 7/2010 | Gaul |
| 2010/0195357 A1 | 8/2010 | Fornage et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0213897 A1 | 8/2010 | Tse |
| 2010/0214808 A1 | 8/2010 | Rodriguez |
| 2010/0217551 A1 | 8/2010 | Goff et al. |
| 2010/0229915 A1 | 9/2010 | Ledenev et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0289337 A1 | 11/2010 | Stauth et al. |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0019444 A1 | 1/2011 | Dargatz et al. |
| 2011/0025130 A1 | 2/2011 | Hadar et al. |
| 2011/0031816 A1 | 2/2011 | Buthker et al. |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0049990 A1 | 3/2011 | Amaratunga et al. |
| 2011/0050002 A1 | 3/2011 | De Luca |
| 2011/0050190 A1 | 3/2011 | Avrutsky |
| 2011/0056533 A1 | 3/2011 | Kuan |
| 2011/0061705 A1 | 3/2011 | Croft et al. |
| 2011/0061713 A1 | 3/2011 | Powell et al. |
| 2011/0062784 A1 | 3/2011 | Wolfs |
| 2011/0079263 A1 | 4/2011 | Avrutsky |
| 2011/0080147 A1 | 4/2011 | Schoenlinner et al. |
| 2011/0083733 A1 | 4/2011 | Marroquin et al. |
| 2011/0084553 A1 | 4/2011 | Adest et al. |
| 2011/0088741 A1 | 4/2011 | Dunton et al. |
| 2011/0114154 A1 | 5/2011 | Lichy et al. |
| 2011/0115295 A1 | 5/2011 | Moon et al. |
| 2011/0121441 A1 | 5/2011 | Halstead et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0133556 A1 | 6/2011 | Choi |
| 2011/0139213 A1 | 6/2011 | Lee |
| 2011/0140536 A1 | 6/2011 | Adest et al. |
| 2011/0141644 A1 | 6/2011 | Hastings et al. |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0179726 A1 | 7/2011 | Pao et al. |
| 2011/0181251 A1 | 7/2011 | Porter et al. |
| 2011/0181340 A1 | 7/2011 | Gazit |
| 2011/0183537 A1 | 7/2011 | Fornage et al. |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0245989 A1 | 10/2011 | Makhota et al. |
| 2011/0246338 A1 | 10/2011 | Eich |

(56) References Cited

U.S. PATENT DOCUMENTS

| | | |
|---|---|---|
| 2011/0254372 A1 | 10/2011 | Haines et al. |
| 2011/0260866 A1 | 10/2011 | Avrutsky et al. |
| 2011/0267721 A1 | 11/2011 | Chaintreuil et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273302 A1 | 11/2011 | Fornage et al. |
| 2011/0285205 A1 | 11/2011 | Ledenev et al. |
| 2011/0285375 A1 | 11/2011 | Deboy |
| 2011/0290317 A1 | 12/2011 | Naumovitz et al. |
| 2011/0291486 A1 | 12/2011 | Adest et al. |
| 2011/0298288 A1 | 12/2011 | Cho et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007434 A1 | 1/2012 | Perreault et al. |
| 2012/0007558 A1 | 1/2012 | Pigott |
| 2012/0007613 A1 | 1/2012 | Gazit |
| 2012/0019966 A1 | 1/2012 | DeBoer |
| 2012/0026763 A1 | 2/2012 | Humphrey et al. |
| 2012/0026769 A1 | 2/2012 | Schroeder et al. |
| 2012/0032515 A1 | 2/2012 | Ledenev et al. |
| 2012/0033463 A1 | 2/2012 | Rodriguez |
| 2012/0039099 A1 | 2/2012 | Rodriguez |
| 2012/0042588 A1 | 2/2012 | Erickson, Jr. |
| 2012/0043818 A1 | 2/2012 | Stratakos et al. |
| 2012/0043823 A1 | 2/2012 | Stratakos et al. |
| 2012/0044014 A1 | 2/2012 | Stratakos et al. |
| 2012/0044717 A1 | 2/2012 | Suntio et al. |
| 2012/0048325 A1 | 3/2012 | Matsuo et al. |
| 2012/0049627 A1 | 3/2012 | Matsuo et al. |
| 2012/0049801 A1 | 3/2012 | Chang |
| 2012/0056483 A1 | 3/2012 | Capp et al. |
| 2012/0063177 A1 | 3/2012 | Garrity |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0091817 A1 | 4/2012 | Seymour et al. |
| 2012/0098344 A1 | 4/2012 | Bergveld et al. |
| 2012/0104861 A1 | 5/2012 | Kojori et al. |
| 2012/0113554 A1 | 5/2012 | Paoletti et al. |
| 2012/0119584 A1 | 5/2012 | Hadar et al. |
| 2012/0127764 A1 | 5/2012 | Phadke et al. |
| 2012/0134058 A1 | 5/2012 | Pamer et al. |
| 2012/0146420 A1 | 6/2012 | Wolfs |
| 2012/0146583 A1 | 6/2012 | Gaul et al. |
| 2012/0161526 A1 | 6/2012 | Huang et al. |
| 2012/0161528 A1 | 6/2012 | Mumtaz et al. |
| 2012/0169124 A1 | 7/2012 | Nakashima et al. |
| 2012/0174961 A1 | 7/2012 | Larson et al. |
| 2012/0175961 A1 | 7/2012 | Har-Shai et al. |
| 2012/0175963 A1 | 7/2012 | Adest et al. |
| 2012/0187769 A1 | 7/2012 | Spannhake et al. |
| 2012/0199172 A1 | 8/2012 | Avrutsky |
| 2012/0200311 A1 | 8/2012 | Chaintreuil |
| 2012/0212066 A1 | 8/2012 | Adest et al. |
| 2012/0215367 A1 | 8/2012 | Eizips et al. |
| 2012/0217973 A1 | 8/2012 | Avrutsky |
| 2012/0240490 A1 | 9/2012 | Gangemi |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0268969 A1 | 10/2012 | Cuk |
| 2012/0271576 A1 | 10/2012 | Kamel et al. |
| 2012/0274145 A1 | 11/2012 | Taddeo |
| 2012/0274264 A1 | 11/2012 | Mun et al. |
| 2012/0280571 A1 | 11/2012 | Hargis |
| 2012/0299380 A1 | 11/2012 | Haupt |
| 2012/0318320 A1 | 12/2012 | Robbins |
| 2013/0002335 A1 | 1/2013 | DeGraaff |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0039028 A1 | 2/2013 | Korman et al. |
| 2013/0057223 A1 | 3/2013 | Lee |
| 2013/0062958 A1 | 3/2013 | Erickson, Jr. et al. |
| 2013/0063119 A1 | 3/2013 | Lubomirsky |
| 2013/0069438 A1 | 3/2013 | Liu et al. |
| 2013/0094112 A1 | 4/2013 | Burghardt et al. |
| 2013/0094262 A1 | 4/2013 | Avrutsky |
| 2013/0134790 A1 | 5/2013 | Amaratunga et al. |
| 2013/0181533 A1 | 7/2013 | Capp et al. |
| 2013/0192657 A1 | 8/2013 | Hadar et al. |
| 2013/0193765 A1 | 8/2013 | Yoscovich |
| 2013/0194706 A1 | 8/2013 | Har-Shai et al. |
| 2013/0200710 A1 | 8/2013 | Robbins |
| 2013/0214607 A1 | 8/2013 | Harrison |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0269181 A1 | 10/2013 | McBride et al. |
| 2013/0271096 A1 | 10/2013 | Inagaki |
| 2013/0279210 A1 | 10/2013 | Chisenga et al. |
| 2013/0285459 A1 | 10/2013 | Jaoui et al. |
| 2013/0294126 A1 | 11/2013 | Garrity et al. |
| 2013/0307556 A1 | 11/2013 | Ledenev et al. |
| 2013/0313909 A1 | 11/2013 | Storbeck et al. |
| 2013/0320778 A1 | 12/2013 | Hopf et al. |
| 2013/0332093 A1 | 12/2013 | Adest et al. |
| 2013/0335861 A1 | 12/2013 | Laschinski et al. |
| 2014/0062206 A1 | 3/2014 | Bryson |
| 2014/0077756 A1 | 3/2014 | Kataoka et al. |
| 2014/0097808 A1 | 4/2014 | Clark et al. |
| 2014/0119076 A1 | 5/2014 | Chang et al. |
| 2014/0167715 A1 | 6/2014 | Wu et al. |
| 2014/0169053 A1 | 6/2014 | Ilic et al. |
| 2014/0191583 A1 | 7/2014 | Chisenga et al. |
| 2014/0210485 A1 | 7/2014 | Lang et al. |
| 2014/0233136 A1 | 8/2014 | Heerdt |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265551 A1 | 9/2014 | Willis |
| 2014/0265579 A1 | 9/2014 | Mumtaz |
| 2014/0265638 A1 | 9/2014 | Orr et al. |
| 2014/0293491 A1 | 10/2014 | Robbins |
| 2014/0306543 A1 | 10/2014 | Garrity et al. |
| 2014/0327313 A1 | 11/2014 | Arditi et al. |
| 2014/0327995 A1 | 11/2014 | Panjwani et al. |
| 2014/0354245 A1 | 12/2014 | Batikoff et al. |
| 2015/0022006 A1 | 1/2015 | Garrity et al. |
| 2015/0028683 A1 | 1/2015 | Hadar et al. |
| 2015/0028692 A1 | 1/2015 | Makhota et al. |
| 2015/0061409 A1 | 3/2015 | Dunton et al. |
| 2015/0131187 A1 | 5/2015 | Krein et al. |
| 2015/0161872 A1 | 6/2015 | Beaulieu et al. |
| 2015/0188415 A1 | 7/2015 | Abido et al. |
| 2015/0263609 A1 | 9/2015 | Weida et al. |
| 2015/0318410 A1 | 11/2015 | Higuma |
| 2015/0351264 A1 | 12/2015 | Linderman |
| 2015/0364918 A1 | 12/2015 | Singh et al. |
| 2015/0372490 A1 | 12/2015 | Bakas et al. |
| 2015/0381108 A1 | 12/2015 | Hoft et al. |
| 2015/0381111 A1 | 12/2015 | Nicolescu et al. |
| 2016/0006392 A1 | 1/2016 | Hoft |
| 2016/0036235 A1 | 2/2016 | Getsla |
| 2016/0126367 A1 | 5/2016 | Dunton et al. |
| 2016/0172900 A1 | 6/2016 | Welch, Jr. |
| 2016/0181802 A1 | 6/2016 | Jacobson et al. |
| 2016/0190931 A1 | 6/2016 | Zhang |
| 2016/0211841 A1 | 7/2016 | Harrison |
| 2016/0226252 A1 | 8/2016 | Kravtiz et al. |
| 2016/0226257 A1 | 8/2016 | Porter et al. |
| 2016/0241039 A1 | 8/2016 | Cheng et al. |
| 2016/0268809 A1 | 9/2016 | Ledenev et al. |

(56) References Cited

U.S. PATENT DOCUMENTS

| | | |
|---|---|---|
| 2016/0270245 A1 | 9/2016 | Linderman |
| 2016/0276820 A1 | 9/2016 | Olivas et al. |
| 2016/0329715 A1 | 11/2016 | Orr et al. |
| 2016/0336899 A1 | 11/2016 | Ledenev et al. |
| 2016/0380436 A1 | 12/2016 | Porter et al. |
| 2017/0104413 A1 | 4/2017 | Busch et al. |
| 2017/0179876 A1 | 6/2017 | Freeman et al. |
| 2017/0184343 A1 | 6/2017 | Freer et al. |
| 2017/0207746 A1 | 7/2017 | Yoscovich et al. |
| 2017/0211190 A1 | 7/2017 | Glasscock et al. |
| 2017/0222542 A1 | 8/2017 | Adest et al. |
| 2017/0271879 A1 | 9/2017 | Ledenev et al. |
| 2017/0278375 A1 | 9/2017 | Galin et al. |
| 2017/0288384 A1 | 10/2017 | Loewenstern et al. |
| 2017/0331325 A1 | 11/2017 | Ristau |
| 2018/0145593 A1 | 5/2018 | Xi et al. |
| 2018/0191292 A1 | 7/2018 | Ehlmann |
| 2019/0379279 A1 | 12/2019 | Adest et al. |
| 2020/0176937 A1 | 6/2020 | Azad |
| 2020/0279963 A1 | 9/2020 | Yoscovich et al. |
| 2020/0373841 A1 | 11/2020 | Xie et al. |
| 2021/0036557 A1 | 2/2021 | Haug et al. |

FOREIGN PATENT DOCUMENTS

| | | |
|---|---|---|
| AU | 2009202125 A1 | 12/2009 |
| CA | 1183574 A1 | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CA | 2702392 C | 9/2015 |
| CN | 1106523 A | 8/1995 |
| CN | 2284479 Y | 6/1998 |
| CN | 1188453 A | 7/1998 |
| CN | 2305016 Y | 1/1999 |
| CN | 1244745 A | 2/2000 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 2579063 Y | 10/2003 |
| CN | 1474492 A | 2/2004 |
| CN | 1523726 A | 8/2004 |
| CN | 1551377 A | 12/2004 |
| CN | 1185782 C | 1/2005 |
| CN | 2672668 Y | 1/2005 |
| CN | 2672938 Y | 1/2005 |
| CN | 1201157 C | 5/2005 |
| CN | 1614854 A | 5/2005 |
| CN | 1245795 C | 3/2006 |
| CN | 1787717 A | 6/2006 |
| CN | 1794537 A | 6/2006 |
| CN | 1841254 A | 10/2006 |
| CN | 1841823 A | 10/2006 |
| CN | 1848588 A | 10/2006 |
| CN | 1892239 A | 1/2007 |
| CN | 1902809 A | 1/2007 |
| CN | 1929276 A | 3/2007 |
| CN | 1930925 A | 3/2007 |
| CN | 2891438 Y | 4/2007 |
| CN | 101030752 A | 9/2007 |
| CN | 101050770 A | 10/2007 |
| CN | 100371843 C | 2/2008 |
| CN | 101128974 A | 2/2008 |
| CN | 101136129 A | 3/2008 |
| CN | 101257221 A | 9/2008 |
| CN | 100426175 C | 10/2008 |
| CN | 201203438 Y | 3/2009 |
| CN | 100487970 C | 5/2009 |
| CN | 101488271 A | 7/2009 |
| CN | 101523230 A | 9/2009 |
| CN | 101647172 A | 2/2010 |
| CN | 101672252 A | 3/2010 |
| CN | 101697462 A | 4/2010 |
| CN | 101779291 A | 7/2010 |
| CN | 101847939 A | 9/2010 |
| CN | 201601477 U | 10/2010 |
| CN | 201623478 U | 11/2010 |
| CN | 201623651 U | 11/2010 |
| CN | 101904015 A | 12/2010 |
| CN | 101951011 A | 1/2011 |
| CN | 101953060 A | 1/2011 |
| CN | 101976952 A | 2/2011 |
| CN | 102084584 A | 6/2011 |
| CN | 102117815 A | 7/2011 |
| CN | 102148584 A | 8/2011 |
| CN | 201926948 U | 8/2011 |
| CN | 102273039 A | 12/2011 |
| CN | 202103601 U | 1/2012 |
| CN | 102386259 A | 3/2012 |
| CN | 202178274 U | 3/2012 |
| CN | 102474112 A | 5/2012 |
| CN | 102565635 A | 7/2012 |
| CN | 102771017 A | 11/2012 |
| CN | 202871823 U | 4/2013 |
| CN | 103227475 A | 7/2013 |
| CN | 103280768 A | 9/2013 |
| CN | 103299501 A | 9/2013 |
| CN | 203367304 U | 12/2013 |
| CN | 103548226 A | 1/2014 |
| CN | 103875144 A | 6/2014 |
| CN | 104143916 A | 11/2014 |
| CN | 104158482 A | 11/2014 |
| CN | 104253585 A | 12/2014 |
| CN | 104488155 A | 4/2015 |
| CN | 104685785 A | 6/2015 |
| CN | 104779636 A | 7/2015 |
| CN | 105075046 A | 11/2015 |
| CN | 105164915 A | 12/2015 |
| CN | 105490298 A | 4/2016 |
| CN | 105553422 A | 5/2016 |
| CN | 205609261 U | 9/2016 |
| CN | 106093721 A | 11/2016 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 9312710 U1 | 10/1993 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19538946 C1 | 4/1997 |
| DE | 19614861 A1 | 7/1997 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 | 3/1999 |
| DE | 19737286 A1 | 3/1999 |
| DE | 19838230 A1 | 2/2000 |
| DE | 19846818 A1 | 4/2000 |
| DE | 19859732 A1 | 6/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10222621 A1 | 11/2003 |
| DE | 202004001246 U1 | 4/2004 |
| DE | 10345302 A1 | 4/2005 |

(56) References Cited

FOREIGN PATENT DOCUMENTS

| | | |
|---|---|---|
| DE | 102004043478 A1 | 4/2005 |
| DE | 102004037446 A1 | 6/2006 |
| DE | 69734495 T2 | 7/2006 |
| DE | 69735169 T2 | 8/2006 |
| DE | 102005012213 A1 | 8/2006 |
| DE | 102005018173 A1 | 10/2006 |
| DE | 102005020937 A1 | 11/2006 |
| DE | 102005030907 | 1/2007 |
| DE | 102005030907 A1 | 1/2007 |
| DE | 102005032864 A1 | 1/2007 |
| DE | 102006023563 A1 | 11/2007 |
| DE | 102006026073 A1 | 12/2007 |
| DE | 602004011201 T2 | 12/2008 |
| DE | 102007050031 B3 | 4/2009 |
| DE | 102008042199 A1 | 4/2010 |
| DE | 102008057874 | 5/2010 |
| DE | 102008057874 A1 | 5/2010 |
| DE | 102010023549 A1 | 12/2011 |
| DE | 102013101314 A1 | 8/2014 |
| DE | 102013106255 A1 | 12/2014 |
| DE | 102013106808 A1 | 12/2014 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |
| EP | 0340006 A2 | 11/1989 |
| EP | 0419093 | 3/1991 |
| EP | 419093 A2 | 3/1991 |
| EP | 0420295 | 4/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 0604777 | 7/1994 |
| EP | 604777 A1 | 7/1994 |
| EP | 0628901 A2 | 12/1994 |
| EP | 0642199 A1 | 3/1995 |
| EP | 653692 A2 | 5/1995 |
| EP | 0670915 A1 | 9/1995 |
| EP | 677749 A2 | 10/1995 |
| EP | 0677749 A3 | 1/1996 |
| EP | 0756178 | 1/1997 |
| EP | 756178 A2 | 1/1997 |
| EP | 0756372 A1 | 1/1997 |
| EP | 0780750 A2 | 6/1997 |
| EP | 0809293 A1 | 11/1997 |
| EP | 824273 A2 | 2/1998 |
| EP | 0827254 | 3/1998 |
| EP | 827254 A2 | 3/1998 |
| EP | 0895146 A1 | 2/1999 |
| EP | 0906660 A1 | 4/1999 |
| EP | 0947904 A2 | 10/1999 |
| EP | 0947905 A2 | 10/1999 |
| EP | 964415 A1 | 12/1999 |
| EP | 964457 A2 | 12/1999 |
| EP | 0978884 A3 | 3/2000 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1291997 A2 | 3/2003 |
| EP | 1330009 | 7/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1120895 A3 | 5/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 | 2/2005 |
| EP | 1503490 A1 | 2/2005 |
| EP | 1521345 A1 | 4/2005 |
| EP | 1526633 A2 | 4/2005 |
| EP | 1531542 A2 | 5/2005 |
| EP | 1531545 | 5/2005 |
| EP | 1531545 A2 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 0964457 A3 | 5/2006 |
| EP | 1657557 | 5/2006 |
| EP | 1657557 A1 | 5/2006 |
| EP | 1657797 | 5/2006 |
| EP | 1657797 A1 | 5/2006 |
| EP | 1684397 A2 | 7/2006 |
| EP | 1691246 A2 | 8/2006 |
| EP | 1706937 A1 | 10/2006 |
| EP | 1708070 A1 | 10/2006 |
| EP | 1716272 A2 | 11/2006 |
| EP | 1728413 A1 | 12/2006 |
| EP | 1734373 A2 | 12/2006 |
| EP | 1750193 A1 | 2/2007 |
| EP | 1766490 A1 | 3/2007 |
| EP | 1782146 A2 | 5/2007 |
| EP | 1785800 A1 | 5/2007 |
| EP | 1837985 A2 | 9/2007 |
| EP | 1842121 A2 | 10/2007 |
| EP | 1859362 A1 | 11/2007 |
| EP | 1609250 B1 | 1/2008 |
| EP | 1887675 | 2/2008 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 2048679 A1 | 4/2009 |
| EP | 2054944 A2 | 5/2009 |
| EP | 2061088 A2 | 5/2009 |
| EP | 2092625 A2 | 8/2009 |
| EP | 2092631 A2 | 8/2009 |
| EP | 2135348 A2 | 12/2009 |
| EP | 2144133 A1 | 1/2010 |
| EP | 2048679 | 4/2010 |
| EP | 2179451 A1 | 4/2010 |
| EP | 2206159 A2 | 7/2010 |
| EP | 2232690 A1 | 9/2010 |
| EP | 2234237 A1 | 9/2010 |
| EP | 2315328 A2 | 4/2011 |
| EP | 2355268 A1 | 8/2011 |
| EP | 2374190 A1 | 10/2011 |
| EP | 2393178 A2 | 12/2011 |
| EP | 2395648 A2 | 12/2011 |
| EP | 2495766 A1 | 9/2012 |
| EP | 2515424 A2 | 10/2012 |
| EP | 2533299 A1 | 12/2012 |
| EP | 2549635 A1 | 1/2013 |
| EP | 2561596 A2 | 2/2013 |
| EP | 2581941 A2 | 4/2013 |
| EP | 2615644 A2 | 7/2013 |
| EP | 2621045 A2 | 7/2013 |

(56) References Cited

FOREIGN PATENT DOCUMENTS

| | | | |
|---|---|---|---|
| EP | 2666222 A1 | 11/2013 |
| EP | 2722979 A1 | 4/2014 |
| EP | 2779251 A1 | 9/2014 |
| EP | 3176933 A1 | 6/2017 |
| EP | 2139104 B1 | 10/2017 |
| EP | 3252909 A1 | 12/2017 |
| ES | 2249147 | 3/2006 |
| ES | 2249147 A1 | 3/2006 |
| ES | 2249149 | 3/2006 |
| ES | 2249149 A1 | 3/2006 |
| FR | 2796216 A1 | 1/2001 |
| FR | 2819653 A1 | 7/2002 |
| FR | 2894401 A1 | 6/2007 |
| GB | 310362 A | 9/1929 |
| GB | 612859 A | 11/1948 |
| GB | 1211885 A | 11/1970 |
| GB | 1231961 A | 5/1971 |
| GB | 1261838 A | 1/1972 |
| GB | 1571681 A | 7/1980 |
| GB | 1597508 A | 9/1981 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2434490 A | 7/2007 |
| GB | 2476508 A | 6/2011 |
| GB | 2480015 A | 11/2011 |
| GB | 2480015 A | 11/2011 |
| GB | 2480015 B | 11/2011 |
| GB | 2480015 B | 12/2011 |
| GB | 2482653 A | 2/2012 |
| GB | 2483317 A | 3/2012 |
| GB | 2485527 A | 5/2012 |
| GB | 2486408 A | 6/2012 |
| GB | 2487368 A | 7/2012 |
| GB | 2497275 A | 6/2013 |
| GB | 2498365 A | 7/2013 |
| GB | 2498790 A | 7/2013 |
| GB | 2498791 A | 7/2013 |
| GB | 2499991 A | 9/2013 |
| JP | S56042365 A | 4/1981 |
| JP | S60027964 A | 2/1985 |
| JP | S60148172 A | 8/1985 |
| JP | 61065320 A | 4/1986 |
| JP | 6165320 | 5/1986 |
| JP | S62154121 A | 7/1987 |
| JP | S62154122 A | 7/1987 |
| JP | H01311874 A | 12/1989 |
| JP | H04219982 A | 8/1992 |
| JP | H04364378 A | 12/1992 |
| JP | H05003678 A | 1/1993 |
| JP | H06035555 A | 2/1994 |
| JP | H06141261 A | 5/1994 |
| JP | H07026849 A | 1/1995 |
| JP | H07058843 A | 3/1995 |
| JP | H07-222436 A | 8/1995 |
| JP | 8009557 A | 1/1996 |
| JP | H08033347 A | 2/1996 |
| JP | H08066050 A | 3/1996 |
| JP | H0897460 A | 4/1996 |
| JP | 08138754 A | 5/1996 |
| JP | H08116628 A | 5/1996 |
| JP | H08181343 A | 7/1996 |
| JP | H08185235 A | 7/1996 |
| JP | H08204220 A | 8/1996 |
| JP | H08227324 A | 9/1996 |
| JP | H08316517 A | 11/1996 |
| JP | H08317664 A | 11/1996 |
| JP | 097644 A | 1/1997 |
| JP | H094692 A | 1/1997 |
| JP | H09097918 A | 4/1997 |
| JP | H09148611 A | 6/1997 |
| JP | H09148613 A | 6/1997 |
| JP | H09275644 A | 10/1997 |
| JP | 2676789 B2 | 11/1997 |
| JP | H1017445 A | 1/1998 |
| JP | H1075580 A | 3/1998 |
| JP | H10201086 A | 7/1998 |
| JP | H10201105 A | 7/1998 |
| JP | H10285966 A | 10/1998 |
| JP | H1110353 A | 1/1999 |
| JP | 11041832 | 2/1999 |
| JP | 11041832 | 2/1999 |
| JP | H1146457 A | 2/1999 |
| JP | 11103538 | 4/1999 |
| JP | 11103538 A | 4/1999 |
| JP | 2892183 B2 | 5/1999 |
| JP | 11206038 | 7/1999 |
| JP | H11266545 A | 9/1999 |
| JP | 11289891 A | 10/1999 |
| JP | 11318042 A | 11/1999 |
| JP | H11332088 A | 11/1999 |
| JP | 2000020150 A | 1/2000 |
| JP | 2000051074 A | 2/2000 |
| JP | 3015512 B2 | 3/2000 |
| JP | 2000-112545 A | 4/2000 |
| JP | 2000-116010 A | 4/2000 |
| JP | 2000160789 A | 6/2000 |
| JP | 2000166097 A | 6/2000 |
| JP | 2000174307 A | 6/2000 |
| JP | 2000232791 A | 8/2000 |
| JP | 2000232793 A | 8/2000 |
| JP | 2000316282 A | 11/2000 |
| JP | 2000324852 A | 11/2000 |
| JP | 2000339044 A | 12/2000 |
| JP | 2000341974 A | 12/2000 |
| JP | 2000347753 A | 12/2000 |
| JP | 2000358330 A | 12/2000 |
| JP | 2001060120 A | 3/2001 |
| JP | 2001075662 A | 3/2001 |
| JP | 2001086765 A | 3/2001 |
| JP | 2001178145 A | 6/2001 |
| JP | 2001189476 A | 7/2001 |
| JP | 2001224142 A | 8/2001 |
| JP | 2001238466 A | 8/2001 |
| JP | 2001250964 A | 9/2001 |
| JP | 2001-320827 A | 11/2001 |
| JP | 2002073184 A | 3/2002 |
| JP | 2002231578 A | 8/2002 |
| JP | 2002238246 A | 8/2002 |
| JP | 2002-262461 A | 9/2002 |
| JP | 2002270876 A | 9/2002 |
| JP | 2002300735 A | 10/2002 |
| JP | 2002339591 A | 11/2002 |
| JP | 2002354677 A | 12/2002 |
| JP | 2003068312 A | 3/2003 |
| JP | 2003102134 A | 4/2003 |
| JP | 2003124492 | 4/2003 |
| JP | 2003124492 A | 4/2003 |
| JP | 2003132959 A | 5/2003 |
| JP | 2003132960 A | 5/2003 |
| JP | 2003134661 A | 5/2003 |
| JP | 2003134667 | 5/2003 |
| JP | 2003134667 A | 5/2003 |
| JP | 2003168487 A | 6/2003 |
| JP | 2003289674 A | 10/2003 |
| JP | 3499941 B2 | 2/2004 |
| JP | 2004047279 A | 2/2004 |
| JP | 2004055603 A | 2/2004 |
| JP | 2004-096090 A | 3/2004 |
| JP | 2004111754 A | 4/2004 |
| JP | 2004-147465 A | 5/2004 |
| JP | 2004194500 A | 7/2004 |
| JP | 2004260944 A | 9/2004 |
| JP | 2004312994 A | 11/2004 |
| JP | 2004334704 A | 11/2004 |
| JP | 2005-151662 A | 6/2005 |
| JP | 3656531 B2 | 6/2005 |
| JP | 2005192314 A | 7/2005 |
| JP | 2005-235082 A | 9/2005 |

(56) References Cited

FOREIGN PATENT DOCUMENTS

| | | |
|---|---|---|
| JP | 2005251039 A | 9/2005 |
| JP | 2005-276942 A | 10/2005 |
| JP | 2005283516 A | 10/2005 |
| JP | 2005-312287 A | 11/2005 |
| JP | 2006041440 A | 2/2006 |
| JP | 2006262619 A | 9/2006 |
| JP | 2006271083 A | 10/2006 |
| JP | 2007058845 | 3/2007 |
| JP | 2007058845 A | 3/2007 |
| JP | 2007104872 A | 4/2007 |
| JP | 2007225625 A | 9/2007 |
| JP | 2010-146047 A | 7/2010 |
| JP | 2010245532 A | 10/2010 |
| JP | 2011-055634 A | 3/2011 |
| JP | 2012-60714 A | 3/2012 |
| JP | 2012511299 A | 5/2012 |
| JP | 2012178535 A | 9/2012 |
| JP | 2015-233386 A | 12/2015 |
| KR | 20010044490 A | 6/2001 |
| KR | 20030050390 A | 6/2003 |
| KR | 20040086088 A | 10/2004 |
| KR | 100468127 B1 | 1/2005 |
| KR | 200402282 Y1 | 11/2005 |
| KR | 20060060825 A | 6/2006 |
| KR | 20070036528 A | 4/2007 |
| KR | 100725755 B1 | 5/2007 |
| KR | 20080092747 A | 10/2008 |
| KR | 100912892 B1 | 8/2009 |
| NL | 1011483 C2 | 9/2000 |
| TW | 497326 B | 8/2002 |
| WO | 8202134 A1 | 6/1982 |
| WO | 1982002134 A1 | 6/1982 |
| WO | 1984003402 A1 | 8/1984 |
| WO | 1988004801 A1 | 6/1988 |
| WO | 9003680 A1 | 4/1990 |
| WO | 1992007418 A1 | 4/1992 |
| WO | 1993013587 | 7/1993 |
| WO | 1993013587 A1 | 7/1993 |
| WO | 95/25374 A1 | 9/1995 |
| WO | 1996007130 A1 | 3/1996 |
| WO | 1996013093 | 5/1996 |
| WO | 1996013093 A1 | 5/1996 |
| WO | 9823021 | 5/1998 |
| WO | 1998023021 | 5/1998 |
| WO | 1998023021 A2 | 5/1998 |
| WO | 1999028801 A1 | 6/1999 |
| WO | 00/00839 A1 | 1/2000 |
| WO | 0000839 | 1/2000 |
| WO | 00/21178 A1 | 4/2000 |
| WO | 0021178 | 4/2000 |
| WO | 0042689 A1 | 7/2000 |
| WO | 0075947 | 12/2000 |
| WO | 0075947 A1 | 12/2000 |
| WO | 0077522 A1 | 12/2000 |
| WO | 01047095 A2 | 6/2001 |
| WO | 02/17469 A1 | 2/2002 |
| WO | 0231517 | 4/2002 |
| WO | 02056126 A1 | 7/2002 |
| WO | 2002073785 A1 | 9/2002 |
| WO | 0278164 A1 | 10/2002 |
| WO | 02078164 A1 | 10/2002 |
| WO | 02093655 A1 | 11/2002 |
| WO | 03012569 A1 | 2/2003 |
| WO | 2003012569 | 2/2003 |
| WO | 03/026114 A2 | 3/2003 |
| WO | 2003036688 A2 | 5/2003 |
| WO | 2003050938 | 6/2003 |
| WO | 2003050938 A2 | 6/2003 |
| WO | 2003071655 | 8/2003 |
| WO | 2003071655 A1 | 8/2003 |
| WO | 03084041 A1 | 10/2003 |
| WO | 2004001942 A1 | 12/2003 |
| WO | 2004006342 A1 | 1/2004 |
| WO | 2004008619 A2 | 1/2004 |
| WO | 2004023278 | 3/2004 |
| WO | 2004023278 A2 | 3/2004 |
| WO | 2004053993 A1 | 6/2004 |
| WO | 2004090993 | 10/2004 |
| WO | 2004090993 A2 | 10/2004 |
| WO | 2004098261 A2 | 11/2004 |
| WO | 2004100344 A2 | 11/2004 |
| WO | 2004100348 A1 | 11/2004 |
| WO | 2004107543 | 12/2004 |
| WO | 2004107543 A2 | 12/2004 |
| WO | 2005015584 A2 | 2/2005 |
| WO | 2005027300 A1 | 3/2005 |
| WO | 2005036725 A1 | 4/2005 |
| WO | 2005053189 A1 | 6/2005 |
| WO | 2005069096 A1 | 7/2005 |
| WO | 2005076444 | 8/2005 |
| WO | 2005076444 A1 | 8/2005 |
| WO | 2005076445 | 8/2005 |
| WO | 2005076445 A1 | 8/2005 |
| WO | 2005089030 A1 | 9/2005 |
| WO | 2005112551 A2 | 12/2005 |
| WO | 2005119609 A2 | 12/2005 |
| WO | 2005124498 A1 | 12/2005 |
| WO | 2006002380 A2 | 1/2006 |
| WO | 2006005125 | 1/2006 |
| WO | 2006005125 A1 | 1/2006 |
| WO | 2006007198 | 1/2006 |
| WO | 2006007198 A1 | 1/2006 |
| WO | 2006011071 A2 | 2/2006 |
| WO | 2006011359 A1 | 2/2006 |
| WO | 2006013600 A2 | 2/2006 |
| WO | 2006033143 A1 | 3/2006 |
| WO | 2006045016 A2 | 4/2006 |
| WO | 2006/013600 A3 | 5/2006 |
| WO | 2006048688 A1 | 5/2006 |
| WO | 2006048689 A2 | 5/2006 |
| WO | 2006071436 A2 | 7/2006 |
| WO | 2006078685 | 7/2006 |
| WO | 2006078685 A2 | 7/2006 |
| WO | 2006079503 A2 | 8/2006 |
| WO | 2006089778 A2 | 8/2006 |
| WO | 2006110613 A2 | 10/2006 |
| WO | 2006/125664 A1 | 11/2006 |
| WO | 2006117551 A2 | 11/2006 |
| WO | 2006137948 A2 | 12/2006 |
| WO | 2007006564 | 1/2007 |
| WO | 2007006564 A2 | 1/2007 |
| WO | 2007007360 A2 | 1/2007 |
| WO | 2007010326 A1 | 1/2007 |
| WO | 2007048421 | 5/2007 |
| WO | 2007048421 A2 | 5/2007 |
| WO | 2007072517 A1 | 6/2007 |
| WO | 2007073951 | 7/2007 |
| WO | 2007073951 A1 | 7/2007 |
| WO | 2007080429 A2 | 7/2007 |
| WO | 2007084196 | 7/2007 |
| WO | 2007084196 A2 | 7/2007 |
| WO | 2007090476 | 8/2007 |
| WO | 2007090476 A2 | 8/2007 |
| WO | 2006124130 A9 | 10/2007 |
| WO | 2007113358 | 10/2007 |
| WO | 2007113358 A1 | 10/2007 |
| WO | 2007124518 A1 | 11/2007 |
| WO | 2007129808 A1 | 11/2007 |
| WO | 2007142693 A2 | 12/2007 |
| WO | 2008008528 A2 | 1/2008 |
| WO | 2008026207 A2 | 3/2008 |
| WO | 2008041983 A2 | 4/2008 |
| WO | 2008077473 A2 | 7/2008 |
| WO | 2008069926 A3 | 8/2008 |
| WO | 2008097591 A2 | 8/2008 |
| WO | 2008125915 A2 | 10/2008 |
| WO | 2008132551 | 11/2008 |
| WO | 2008132551 A2 | 11/2008 |
| WO | 2008132553 | 11/2008 |
| WO | 2008132553 A2 | 11/2008 |
| WO | 2008142480 A2 | 11/2008 |
| WO | 2009003680 A1 | 1/2009 |
| WO | 2009006879 A2 | 1/2009 |
| WO | 2009007782 A2 | 1/2009 |

(56) References Cited

FOREIGN PATENT DOCUMENTS

| | | |
|---|---|---|
| WO | 2009020917 A2 | 2/2009 |
| WO | 2009007782 A3 | 3/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009051854 A1 | 4/2009 |
| WO | 2009055474 A1 | 4/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072076 A2 | 6/2009 |
| WO | 2009072077 A1 | 6/2009 |
| WO | 2009073995 A1 | 6/2009 |
| WO | 2009075985 A2 | 6/2009 |
| WO | 2009/075985 A3 | 7/2009 |
| WO | 2009114341 A2 | 9/2009 |
| WO | 2009118682 | 10/2009 |
| WO | 2009118682 A2 | 10/2009 |
| WO | 2009118683 | 10/2009 |
| WO | 2009118683 A2 | 10/2009 |
| WO | 2009073868 A1 | 11/2009 |
| WO | 2009118683 A3 | 11/2009 |
| WO | 2009136358 | 11/2009 |
| WO | 2009136358 A1 | 11/2009 |
| WO | 2009140536 A2 | 11/2009 |
| WO | 2009140539 A2 | 11/2009 |
| WO | 2009140543 A2 | 11/2009 |
| WO | 2009140551 A2 | 11/2009 |
| WO | 2009118682 A3 | 12/2009 |
| WO | 2009155392 A1 | 12/2009 |
| WO | 2010/002960 A1 | 1/2010 |
| WO | 2010/003941 A2 | 1/2010 |
| WO | 2009136358 A4 | 1/2010 |
| WO | 2009/140536 A3 | 2/2010 |
| WO | 2009/140543 A3 | 2/2010 |
| WO | 2009/140551 A3 | 2/2010 |
| WO | 2010014116 A1 | 2/2010 |
| WO | 2010/042124 A1 | 4/2010 |
| WO | 2010037393 A1 | 4/2010 |
| WO | 2010056777 A1 | 5/2010 |
| WO | 2010062410 A1 | 6/2010 |
| WO | 2010062662 A2 | 6/2010 |
| WO | 2010065043 | 6/2010 |
| WO | 2010065043 A1 | 6/2010 |
| WO | 2010065388 | 6/2010 |
| WO | 2010065388 A1 | 6/2010 |
| WO | 2010072717 | 7/2010 |
| WO | 2010072717 A1 | 7/2010 |
| WO | 2010078303 A2 | 7/2010 |
| WO | 2010091025 A2 | 8/2010 |
| WO | 2010094012 A1 | 8/2010 |
| WO | 2010120315 A1 | 10/2010 |
| WO | 2010/132369 A1 | 11/2010 |
| WO | 2010134057 A1 | 11/2010 |
| WO | 20100134057 | 11/2010 |
| WO | 20100134057 A1 | 11/2010 |
| WO | 2011005339 A1 | 1/2011 |
| WO | 2011011711 | 1/2011 |
| WO | 2011011711 A2 | 1/2011 |
| WO | 2011014275 A1 | 2/2011 |
| WO | 2011017721 | 2/2011 |
| WO | 2011017721 A1 | 2/2011 |
| WO | 2011023732 A2 | 3/2011 |
| WO | 2011028456 A2 | 3/2011 |
| WO | 2011028457 A2 | 3/2011 |
| WO | 2011049985 A1 | 4/2011 |
| WO | 2011059067 A1 | 5/2011 |
| WO | 2011074025 A1 | 6/2011 |
| WO | 2011076707 A2 | 6/2011 |
| WO | 2011085259 A2 | 7/2011 |
| WO | 2011109746 A2 | 9/2011 |
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2012024538 A3 | 5/2012 |
| WO | 2012100263 A2 | 7/2012 |
| WO | 2013015921 A1 | 1/2013 |
| WO | 2013019899 A2 | 2/2013 |
| WO | 1998023021 A | 7/2013 |
| WO | 2013130563 A1 | 9/2013 |
| WO | 2014143021 A1 | 9/2014 |
| WO | 2017/125375 A1 | 7/2017 |
| WO | 2018122835 A1 | 7/2018 |

OTHER PUBLICATIONS

International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Converence, Feb. 2001, Colorado Power Electronics Center Publications.
Chen, et al., "Buck-Boost PWM Converters Having Two Independently Controlled Switches", IEEE Power Electronics Specialists Converence, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies-Design and Optimisation", 37th IEEE Power Electronics Specialists Converence, Jun. 18-22, 2006, Jeju, Korea.
Geoffrey R. Walker Affidavit re: U.S. Appl. No. 11/950,271, submitted in an IDS for U.S. Appl. No. 11/950,271, filed Mar. 9, 2010.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Faade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.

(56) References Cited

OTHER PUBLICATIONS

Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), dated Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.

Sandia Report SAND96-2797 | UC-1290 Unlimited Release, Printed Dec. 1996, "Photovoltaic Power Systems and the National Electrical Code: Suggested Practices", by John Wiles, Southwest Technology Development Instutte New Mexico State University Las Cruces, NM.
United Kingdom Intellectual Property Office, Combined Search and Examination Report Under Sections 17 and 18(3), GB1020862.7, dated Jun. 16, 2011.
IPRP PCT/IB2007/004610—dated Jun. 10, 2009.
Fairchild Semiconductor, Application Note 9016, IGBT Basics 1, by K.S. OH Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
IPRP for PCT/IL2007/001064 dated Mar. 17, 2009, with Written Opinion dated Mar. 25, 2008.
ISR for PCT/IL07/01064 dated Mar. 25, 2008.
IPRP for PCT/IB2007/004584 dated Jun. 10, 2009, with Written Opinion.
IPRP for PCT/IB2007/004586 dated Jun. 10, 2009, with Written Opinion.
IPRP for PCT/IB2007/004591 dated Jul. 13, 2010, with Written Opinion.
IPRP for PCT/IB2007/004610 dated Jun. 10, 2009, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), dated Sep. 16, 2011.
UK Intellectual Property Office, Patents Act 1977: Patents Rules Notification of Grant: Patent Serial No. GB2480015, dated Nov. 29, 2011.
Geoffrey R. Walker Affidavit re: U.S. Appl. No. 11/950,307.
Geoffrey R. Walker Affidavit re: U.S. Appl. No. 11/950,271.
Alonso, "A New Distributed Converter Interface for PV Panels", 20th European Photovoltaic Solar Energy Conference, 6-10, Jun. 2005, Barcelona, Spain, pp. 2288-2291.
QT Technical Application Papers, "ABB Circuit-Breakers for Direct current Applications", Abb Sace S.p.A., An ABB Group Coupany, L.V. Breakers, Via Baioni, 35, 24123 Bergamo-Italy, Tel.: +39 035.395.111—Telefax: +39 035.395.306-433.

(56) References Cited

OTHER PUBLICATIONS

Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Extended European Search Report—EP12176089.6—dated Nov. 8, 2012.
Gwon-Jong Yu et al: "Maximum power point tracking with temperature compensation of photovoltaic for air conditioning system with fuzzy controller", May 13, 1996; May 13, 1996-May 17, 1996, May 13, 1996 ( May 13, 1996), pp. 1429-1432, XP010208423.
Extended European Search Report—EP12177067.1—dated Dec. 7, 2012.
GB Combined Search and Examination Report—GB1200423.0—dated Apr. 30, 2012.
GB Combined Search and Examination Report—GB1201499.9—dated May 28, 2012.
GB Combined Search and Examination Report—GB1201506.1—dated May 22, 2012.
QT Technical Application Papers, "ABB Circuit-Breakers for Direct current Applications", ABB SACE S.p.A., An ABB Group Coupany, L.V. Breakers, Via Baioni, 35, 24123 Bergamo-Italy, Tel.: +39 035.395.111—Telefax: +39 035.395.306-433, Sep. 2007.
Walker, "A DC Circuit Breaker for an Electric Vehicle Battery Pack", Australasian Universities Power Engineering Conference and IEAust Electric Energy Conference, Sep. 26-29, 1999.
UK Intellectual Property Office, Application No. GB1109618.7, Patents Act 1977, Examination Report Under Section 18(3), Sep. 16, 2011.
UK Intellectual Property Office, Patents Act 1977: Patents Rules Notification of Grant: Patent Serial No. GB2480015, Nov. 29, 2011.
Walker, et al. "PV String Per-Module Maximim Power Point Enabling Converters", School of Information Technology and Electrical Engineering the Univiversity of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. CAIRNS, Queensland, Australia, Jun. 23-27, 2002 [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International the Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.

Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodríguez et al., IEEE Transactions on Industrial Electronics, vol. 49, No. 4, Aug. 2002.
Extended European Search Report—EP 08878650.4—dated Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W. Erickson, "Future of Power Electronics for Photovoltaics", IEEE Applied Power Electronics Conference, Feb. 2009.
GB Combined Search and Examination Report—GB1203763.6—dated Jun. 25, 2012.
Mohammad Reza Amini et al., "Quasi Resonant DC Link Inverter with a Simple Auxiliary Circuit", Journal of Power Electronics, vol. 11, No. 1, Jan. 2011.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
Cheng K.W.E., "New Generation of Switched Capacitor Converters", Department of Electrical Engineering, The Hong Kong Polytechnic University, Hung Hom, Hong Kong, Power Electronics Conference, 1998, PESC 98.
Per Karlsson, "Quasi Resonant DC Link Converters—Analysis and Design for a Battery Charger Application", Universitetstryckeriet, Lund University, 1999, ISBN 91-88934-14-4.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Yuang-Shung Lee et al., "A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions On Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
Chihchiang Hua and Chihming Shen, "Study of Maximum Power Tracking Techniques and Control of DC/DC Converters for Photovoltaic Power System", IEEE 1998.
Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Gridinteractive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids-state of the art and future trends", 3rd World Conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / Sep. 12 a 16, 2010, Bonito-MS.
Sergio Busquets-Monge et al., "Multilevel Diode-clamped Converter for Photovoltaic Generators With Independent Voltage Con-

(56) References Cited

OTHER PUBLICATIONS trol of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—dated Mar. 26, 2013.
Supplementary European Search Report—EP08857456—dated Dec. 6, 2013.
Extended European Search Report—EP14151651.8—dated Feb. 25, 2014.
Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http:jjscholar.lib.vt.edu/theses/available/etd-012299-165108/unrestricted/THESIS.PDF, [retrieved on Mar. 5, 2013].
Yoshida M et al: "Actual efficiency and electromagnetic noises evaluations of a single inductor resonant AC link snubber-assisted three-phase soft-switching inverter", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—Mailing date: Aug. 6, 2011.
Extended European Search Report—EP 13152967.9—dated Aug. 28, 2014.
Extended European Search Report—EP 14159696—dated Jun. 20, 2014.
Gow Ja A et al: "A Modular DC-DC Converter and Maximum Power Tracking Controller Formedium to Large Scale Photovoltaic Generating Plant"8<SUP>th </SUP> European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.
Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Miltiple-input DC-DC Converter" 20<SUP>th</SUP> International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.
Chihchiang Hua et al: "DSP-based controller application in battery storage of photovoltaic system" Industrial Electronics, Control, and Instrumentation, 1996, Proceedings of the 1996 IEEE IECON 22<SUP>nd</SUP> International Conference on Taipei, Taiwan Aug. 5-10, 1996, New York, NY, USA, IEEE, US, Aug. 5, 1996, pp. 1705-1710, XP010203239.
Hua C et al: "Implementation of a DSP-Controlled Photovoltaic System with Peak Power Tracking" IEEE Transactions on industrial Electronics, IEEE, Inc. New York, US, vol. 45, No. 1, Feb. 1, 1998, pp. 99-107, XP000735209.
I. Weiss et al.: "A new PV system technology—the development of a magnetic power transmission from the PV module to the power bus" 16th European Photovoltaic Solar Energy Conference, vol. III, May 1-5, 2000, pp. 2096-2099, XP002193468 Glasgow,UK cited in the application.

Basso, Tim, "IEEE Standard for Interconnecting Distributed Resources With the Electric Power System," IEEE PES Meeting, Jun. 9, 2004.
Boostbuck.com, "The Four Boostbuck Topologies," located at http://www.boostbuck.com/TheFourTopologies.html, 2003.
Gautam, Nalin K. et al., "An Efficient Algorithm to Simulate the Electrical Performance of Solar Photovoltaic Arrays," Energy, vol. 27, No. 4, pp. 347-361, 2002.
Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.
Wiles, John, "Photovoltaic Power Systems and the National Electrical Code: Suggested Practices," Sandia National Laboratories, document No. SAND2001-0674, Mar. 2001.
Hewes, J. "Relays," located at http://web.archive.org/web/20030816010159/www.kpsec.freeuk.com/components/relay.htm, Aug. 16, 2003.
Advanced Energy Group, "The Basics of Solar Power Systems," located at http://web.archive.org/web/20010331044156/http://www.solar4power.com/solar-power-basics.html, Mar. 31, 2001.
International Patent Application No. PCT/AU2005/001017, International Search Report and Written Opinion, dated Aug. 18, 2005.
Baek, Ju-Won et al., "High Boost Converter using Voltage Multiplier," 2005 IEEE Conference, IECON 05, pp. 567-572, Nov. 2005.
Wikimedia Foundation, Inc., "Electric Power Transmission," located at http://web.archive.org/web/20041210095723/en.wikipedia.org/wiki/Electric-power-transmission, Nov. 17, 2004.
Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.
Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.
Storfer, Lior, "Enhancing Cable Modem TCP Performance," Texas Instruments Inc. white paper, Jul. 2003.
International Preliminary Report on Patentability Issued in corresponding international application No. PCT/US04/16668, filed May 27, 2004.
International Application No. PCT/US13/27965, International Preliminary Examination Report, dated Sep. 2, 2014.
International Patent Application PCT/US13/027965, International Search Report and Written Opinion, dated Jun. 2, 2013.
International Application No. PCT/US12/44045, International Preliminary Examination Report, dated Jan. 28, 2014.
International Patent Application No. PCT/US2012/044045, International Search Report and Written Opinion, dated Jan. 2, 2013.
International Patent Application No. PCT/US2009/047734, International Search Report and Written Opinion, dated May 4, 2010.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
International Patent Application No. PCT/US2010/029929, International Search Report and Written Opinion, dated Oct. 27, 2010.
International Patent Application No. PCT/US2011/020591, International Search Report and Written Opinion, dated Aug. 8, 2011.
International Patent Application No. PCT/US2011/033544, International Search Report and Written Opinion, dated Nov. 24, 2011.
J. Keller and B. Kroposki, titled, "Understanding Fault Characteristics of Inverter-Based Distributed Energy Resources", in a Technical Report NREL/TP-550-46698, published Jan. 2010, pp. 1 through 48.
International Patent Application No. PCT/US2008/081827, International Search Report and Written Opinion, dated Jun. 24, 2009.
International Patent Application No. PCT/US2010/046274 International Search Report and Written Opinion, dated Apr. 22, 2011.
International Patent Application No. PCT/US2011/033658, International Search Report and Written Opinion, dated Jan. 13, 2012.
International Patent Application No. PCT/US2011/029392, International Search Report and Written Opinion, dated Oct. 24, 2011.

(56) References Cited

OTHER PUBLICATIONS

European Patent Application No. 09829487.9, Extended Search Report, dated Apr. 21, 2011.
International Patent Application No. PCT/US2009/062536, International Search Report and Written Opinion, dated Jun. 17, 2010.
International Patent Application No. PCT/US2010/022915, International Search Report and Written Opinion, dated Aug. 23, 2010.
International Patent Application No. PCT/US2010/046272, International Search Report and Written Opinion, dated Mar. 31, 2011.
International Patent Application No. PCT/US2010/029936, International Search Report and Written Opinion, dated Nov. 12, 2010.
International Patent Application No. PCT/US08/75127, International Search Report and Written Opinion, dated Apr. 28, 2009.
International Patent Application No. PCT/US09/35890, International Search Report and Written Opinion, dated Oct. 1, 2009.
European Patent Application No. 08845104.2, Extended Search Report, dated Jul. 31, 2014.
European Patent Application No. 11772811.3, Extended Search Report, dated Dec. 15, 2014.
International Patent Application No. PCT/US2008/082935, International Search Report and Written Opinion, dated Jun. 25, 2009.
Rodriguez, C., and G. A. J. Amaratunga. "Dynamic stability of grid-connected photovoltaic systems." Power Engineering Society General Meeting, 2004. IEEE, pp. 2194-2200.
Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.
Nonaka, Sakutaro, et al. "Interconnection system with single phase IGBT PWM CSI between photovoltaic arrays and the utility line." Industry Applications Society Annual Meeting, 1990., Conference Record of the 1990 IEEE.
Calais, Martina, et al. "Inverters for single-phase grid connected photovoltaic systems—an overview." Power Electronics Specialists Conference, 2002. pesc 02. 2002 IEEE 33rd Annual. vol. 4. IEEE, 2002.
Marra, Enes Goncalves, and José Antenor Pomilio. "Self-excited induction generator controlled by a VS-PWM bidirectional converter for rural applications." Industry Applications, IEEE Transactions on 35.4 (1999): 877-883.
Xiaofeng Sun, Weiyang Wu, Xin Li, Qinglin Zhao: A Research on Photovoltaic Energy Controlling System with Maximum Power Point Tracking:; Proceedings of the Power Conversion Conference—Osaka 2002 (Cat. No. 02TH8579) IEEE—Piscataway, NJ, USA, ISBN 0-7803-7156-9, vol. 2, p. 822-826, XP010590259: the whole document.
International Search Report for corresponding PCT/GB2005/050198 completed Jun. 28, 2006 by C. Wirner of the EPO.
Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.
Cordonnier, Charles-Edouard, et al., "Application Considerations for Sensefet Power Devices," PCI Proceedings, May 11, 1987, pp. 47-65.
Kotsopoulos, Andrew, et al., "Predictive DC Voltage Control of Single-Phase PV Inverters with Small DC Link Capacitance," IEEE International Symposium, Month Unknown, 2003, pp. 793-797.
Meinhardt, Mike, et al., "Multi-String-Converter with Reduced Specific Costs and Enhanced Functionality," Solar Energy, May 21, 2001, pp. 217-227, vol. 69, Elsevier Science Ltd.
Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, ©2005 IEEE; pp. 1473-1477.
Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.

International Search Report for corresponding PCT/GB2005/050197, completed Dec. 20, 2005 by K-R Zettler of the EPO.
Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.
Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference, Month Unknown, 2002, pp. 1483-1488, vol. 3, IEEE.
Written Opinion of PCT/GB2005/050197, dated Feb. 14, 2006 (mailing date), Enecsys Limited.
Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.
International Search Report for corresponding PCT/GB2004/001965, completed Aug. 16, 2004 by A. Roider.
Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.
Mumtaz, Asim, et al., "Grid Connected PV Inverter Using a Commercially Available Power IC," PV in Europe Conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.
Chinese Office Action—CN Application 201210334311.2—dated Jan. 20, 2016.
European Search Report—EP App. 14159457.2—dated Jun. 12, 2015.
Chinese Office Action—CN Appl. 201210007491.3—dated Nov. 23, 2015.
Chinese Office Action—CN Appl. 201280006369.2—dated Aug. 4, 2015.
Chinese Office Action—CN Appl. 201210253614.1—dated Aug. 18, 2015.
European Office Action—EP Appl. 09725443.7—dated Aug. 18, 2015.
Chinese Office Action—CN Appl. 201110349734.7—dated Oct. 13, 2015.
Chinese Office Action—CN Appl. 201310035223.7—dated Dec. 29, 2015.
European Office Action—EP Appl. 12176089.6—dated Dec. 16, 2015.
European Search Report and Written Opinion—EP Appl. 12150819.6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Jun. 30, 2022—Extended EP Search Report—EP App. No. 22150308.9.
Zhou, Wilson and Theo Phillips—"Industry's First 4-Switch Buck-Boost Controller Achieves Highest Efficiency Using a Single Inducutor—Design Note 369"—Linear Technology Corporation—www.linear.com—2005.
Micropower Synchronous Buck-Boost DC/DC Converter—Linear Technology Corporation—www.linear.com/LTC3440—2001.
Caricchi, F. et al—20 kW Water-Cooled Prototype of a Buck-Boost Bidirectional DC-DC Converter Topology for Electrical Vehicle Motor Drives—University of Rome—IEEE 1995—pp. 887-892.
Roy, Arunanshu et al—"Battery Charger using Bicycle"—EE318 Electronic Design Lab Project Report, EE Dept, IIT Bombay, Apr. 2006.
Viswanathan, K. et al—Dual-Mode Control of Cascade Buck-Boost PFC Converter—35th Annual IEEE Power Electronics Specialists Conference—Aachen, Germany, 2004.

(56) References Cited

OTHER PUBLICATIONS

Zhang, Pei et al.—"Hardware Design Experiences in ZebraNet"—Department of Electrical Engineering, Princeton University—SenSys '04, Nov. 3-5, 2004.
"High Efficiency, Synchronous, 4-Switch Buck-Boost Controller"—Linear Technology Corporation—www.linear.com/LTC3780—2005.
Chomsuwan, Komkrit et al. "Photovoltaic Grid-Connected Inverter Using Two-Switch Buck-Boost Converter"—Department of Electrical Engineering, King Mongkut's Institute of Technology Ladkrabang, Thailand, National Science and Technology Development Agency, Thailand—IEEE—2002.
Midya, Pallab et al.—"Buck or Boost Tracking Power Converter"—IEEE Power Electronics Letters, vol. 2, No. 4—Dec. 2004.
Maxouris, et al. "United States sets record for most Covid-19 deaths reported in one day," Jan. 13, 2021, CNN, https://www.cnn.com/2021/01/12/health/US-coronavirus-tuesday/index.html.
Texas Instruments, CMOS Ripple-Carry Binary Counter/Dividers, acquired from Harris Semiconductor SCHS030D—Revised Dec. 2003.
Excerpts from IEEE 100—The Authoritative Dictionary of IEEE Standards Terms (7th Ed. 2000).
Excerpts from Paul Horowitz & Winfield Hill—The Art of Electronics (2d. Ed. 1989).
Webeck, Evan, "Coronavirus: California sets another daily case record in possible first sign of 'surge on top of a surge,'" Jan. 5, 2021, The Mercury News (California).
Declaration of Randy R. Dunton in Support of Petition for Inter Partes Review of U.S. Pat. No. 8,933,321, Petitioner *Altenergy Power Systems, Inc.* v. *Tigo Energy Inc.*, IPR2021-00541.
Declaration of Randy R. Dunton in Support of Petition for Inter Partes Review of U.S. Pat. No. 10,256,770, Petitioner *Altenergy Power Systems, Inc.* v. *Tigo Energy Inc.*, IPR2021-00540.
Declaration of Randy R. Dunton in Support of Petition for Inter Partes Review of U.S. Pat. No. 8,933,321, Petitioner *SunSpec Alliance* v. Patent Owner *Tigo Energy Inc.*, IPR2021-01286.
Declaration of Randy R. Dunton in Support of Petition for Inter Partes Review of U.S. Pat. No. 10,256,770, Petitioner *SunSpec Alliance* v. Patent Owner *Tigo Energy Inc.*, IPR2021-01287.
Nov. 17, 2021—CN Office Action—CN App No. 201810025083.8.
Dec. 31, 2020—CN Invalidation Decision—CN 200780045351.2.
Dec. 31, 2020—CN Invalidation Decision—CN 201210253614.1.
PV Balancers: Concept, Architectures, and Realization—Huimmin Zhou—IEEE Transactions on Power Electronics vol. 30 No. 7—Jul. 7, 2015.
Petition for Inter Partes Review of U.S. Patent 10,256,770; IPR 2021-00540; Petitioner *Altenergy Power Systems Inc* vs. Patent Owner *Tigo Energy Inc.*
Declaration in Support of Petition for Inter Partes Review of U.S. Pat. No. 10,256,770; IPR 2021-00540; Petitioner *Altenergy Power Systems Inc* vs. Patent Owner *Tigo Energy Inc.*
Petition for Inter Partes Review of U.S. Pat. No. 8,988,321; IPR 2021-00541; Petitioner *Altenergy Power Systems Inc* vs. Patent Owner *Tigo Energy Inc.*
Declaration in Support of Petition for Inter Partes Review of U.S. Pat. No. 8,933,321; IPR 2021-00541; Petitioner *Altenergy Power Systems Inc* vs. Patent Owner *Tigo Energy Inc.*
Petition for Inter Partes Review of U.S. Pat. No. 8,933,321; IPR 2021-01286; Petitioner *SunSpec Alliance* vs. Patent Owner *Tigo Energy Inc.*
Declaration in Support of Petition for Inter Partes Review of U.S. Pat. No. 8,933,321; IPR 2021-01286; Petitioner *SunSpec Alliance* vs. Patent Owner *Tigo Energy Inc.*
Petition for Inter Partes Review of U.S. Pat. 10,256,770; IPR 2021-01287; Petitioner *SunSpec Alliance* vs. Patent Owner *Tigo Energy Inc.*
Declaration in Support of Petition for Inter Partes Review of U.S. Pat. No. 10,256,770; IPR 2021-01287; Petitioner *SunSpec Alliance* vs. Patent Owner *Tigo Energy Inc.*
Jun. 21, 2021—Japanese Office Action—JP 2017-158887.
Sep. 4, 2019—Extended European Search Report—EP 19181247.8.
Jan. 30, 2020—EP Office Action—EP 18204177.2.
Feb. 3, 2020—Chinese Office Action—201710749388.9.
Oct. 12, 2020—CN Office Action—CN 201610946835.5.
May 12, 2020—Extended European Search Report—EP 20161381.7.
Dec. 24, 2019—CN Office Action—CN Application 201610946835.5.
Sep. 17, 2020—Extended European Search Report—EP Application 20176744.9.
Nov. 12, 2020—Preliminary Opinion by EPO—EP 12188944.8.
Jan. 29, 2019—European Search Report for EP App No. 18199117.5.
May 7, 2021—Chinese Office Action—CN 20181025083.8.
Oct. 8-12, 2000 Hashimoto, et al., "A Novel High Peforamance Utility Interactive Photovoltain Inverter System"—Industry Applications Conference, 2000. Conference Record of the 2000 IEEE.
Feb. 22-26, 2004—Ho, et al., "An Integrated Inverter with Maximum Power Tracking for Grid-Connected PV Systems"—Applied Power Electronics Conference and Exposition, 2004. APEC '04. Nineteenth Annual IEEE.
Nov. 14, 1997, Hua et al., "Control of DC/DC Converters for Solar Energy System with Maximum Power Tracking"—Industrial Electronics, Control and Instrumentation, 1997. IECON 97. 23rd International Conference on Industrial Electronics, Control and Instrumentation vol. 4 of 4.
Sep. 1-3, 2008, Lee et al., "Soft Switching Mutli-Phase Boost Converter for Photovoltaic System"—Power Electronics and Motnion Control Conference, 2008. EPE-PEMC 2008.
Jul. 5, 2005, Yao et al., "Tapped-lnductor Buck Converter for High-Step-Down DC-DC Conversion" IEEE Transactions an Power Electronics (vol. 20, Issue 4, Jul. 2005).
Sep. 21-23, 1998, Kretschmar, et al., "An AC Converter with a Small DC Link Capacitor for a 15KW Permanent Magnet Synchronous Integral Motor"—Power Electronics and Variable Speed Drives, 1998. Sevent International Converterest (Conf. Publ. No. 456).
May 25, 2000—Hong Lim, et al., "Simple Maximum Power Point Tracker for Photovoltaic Arrays"—Electronics Letters (vol. 36, Issue 11, May 25, 2000).
Aug. 14-16, 2004, Nishida et al., "A Novel Type of Utility-Interactive Inverter for Phtovoltaic System"—Power Electronics and Mtion Control Conference, 2004. IPEMC 2004.
May 30-Jun. 3, 2011, Jung, et al., "DC-Link Ripple Reduction of Series-connected Module Integrated Converter for Photovoltaic Systems"—Power Electronics and ECCE Asia (ICPE & ECCE).
Jan. 8, 2007, Li et al., "An Analysis of ZVS Two-Inductor Boost Converter under Variable Frequency Operation"—IEEE Transactions on Power Electronics (vol. 22, Issue 1, Jan. 2007).
Sep. 17, 2007, Rodriguez et al., "Analytic Solution to the Photovoltaic Maximum Power Point Problem"—IEEE Transactions on Circuits and Systems I: Regular Papers (vol. 54, Issue 9, Sep. 2007).
Jun. 27, 1997, Reimann et al., "A Novel Control Principle of Bi-Directional DC-DC Power Conversion"—Powre Electronics Specialists Conference 1997. PESC '97 Record.
Sep. 15-22, 2000, Russell et al., "The Massachusetts Electric Solar Project: A Pilot Project to Commercialize Residential PV Systems"—Photovoltaic Specialists Conference, 2000, Conference Record of the Twenty-Eighth IEEE Photovoltaic Specialists Conference—2000.
May 2001, Shimizu et al., "Generation Control Circuit for Photvoltaic Modules"—IEEE Transactions of Power Electronics (vol. 16, Issue 3, May 2001).
Feb. 6-10, 2000, Siri, Kasemsan "Study of System Instability in Current-Mode Converter Power Systems Operating in Solar Array Voltage Regulation Mode"—Applied Power Electronics Conference and Exposition, 2000. APEC 2000. Fiftheenth Annual IEEE.
Aug. 13-16, 1990—Rajan, Anita "A Maximum Power Point Tracker Optimized for Solar Powered Cars"—Future Transportation Technology Conference and Expostion.
Jul. 10, 1995—"Battery I.D. chip from Dallas Semiconductor monitors and reports battery pack temperature"—Business Wire.

(56) References Cited

OTHER PUBLICATIONS

Nov. 3, 1999—Takahashi et al., "Development of a Long-Life Three-Phase Flywheel UPS Using an Electrolytic Capacitorless Converter/Inverter"—Electrical Engineering in Japan, vol. 127.
Jan. 2001—Walker, Geoffrey "Evaluating MPPT Converter Topologies Using a Matlab PV Model"—"Journal of Electrical and Electronics Engineering, Australia".
Feb. 13, 2007—Roman et al., "Experimental Results of Controlled PV Module for Building Integrated PV Systems"—Solar Energy 82 (2008) 471-480.
2006—Bower et al., "Innovative PV Micro-Inverter Topology Eliminates Electrolytic Capacitors for Longer Lifetime"—IEEE 1-4244-0016-3/06/ pp. 2038-2041.
Aug. 23-27, 1993—Case et al., "A Minimum Component Photovoltaic Array Maximum Power Point Tracker"—European Space Power Conference vol. 1 Power Systems, Power Electronics.
Jun. 4, 1997—Maranda et al., "Optimization of the Master-Slave Inverter System for Grid-Connected Photovoltaic Plants"—Energy Convers Mgmt. vol. 39, No. 12 pp. 1239-1246.
2005—Kang et al., "Photovoltaic Power Interface Circuit Incorporated with a Buck-Boost Converter and a Full-Bridge Inverter"—Applied Energy 82, pp. 266-283.
Nov. 21, 1997—Feuermann et al., "Reversable Low Soalr Heat Gain Windows for Energy Savings"—Solar Energy vol. 62, No. 3 pp. 169-175.
May 16, 2005—Enrique et al., "Theoretical assessment of the maximum power point tracking efficiency of photovoltaic facilities with different converter topologies"—Solar Energy 81 (2007) p. 31-38.
Dehbonei, Hooman "Power Conditioning for Distrbuted Renewable Energy Generation"—Curtin University of Technology, School of Electrical and Computer Engineering, 2003 568 pages Dissertation: Thesis. Abstract, 1 page—retrieved on Nov. 13, 2017 on https://books.google.com/books/about/Power_Conditioning_for_Distributed_Renew.html?id=3WVXuAAACAAJ.
Korean Patent Application No. 102005-7008700, filed May 13, 2015. Applicant: Exar Corporation.
Jan. 23, 2018—EP Search Report, EP App No. 17187230.2.
Apr. 16, 2018—EP Examination Report 12707899.6.
Aug. 9, 2010, Hong, Wei, et al., "Charge Equalization of Battery POwer Modules in Series" The 2010 International Power Electronics Conference, IEEE, p. 1568-1572.
Jun. 6, 2018—EP Search Report EP App No. 18151594.1.
Jun. 29, 2018—EP Search Report—EP App No. 18175980.4.
Mar. 3, 2021—EP Office Action—EP 17188365.5.
Chinese Office Action—CN 201510423458.2—dated Jan. 3, 2017 (english translation provided).
Chinese Office Action—CN 201410098154.9—dated Mar. 3, 2017 (english translation provided).
European Search Report—EP Appl. 13150911.9—dated Apr. 7, 2017.
Howard et al., "Relaxation on a Mesh: a Formalism for Generalized Localization." Proceedings of the IEEE/RSJ International Conference on Intelligent Robots and Systems (IROS 2001). Wailea, Hawaii, Oct. 2001.
Chinese Office Action and Search Report—CN 201510578586.4—dated Apr. 19, 2017.
Jul. 13, 2017—Chinese Office Action—CN201210007491.3.
Jul. 31, 2014—Huimin Zhou et al.—"PV Balancers: Concept, Architectures, and Realization"—IEEE Transactions on Power Electronics, vol. 30, No. 7, pp. 3479-3487.
Sep. 15, 2012—Huimin Zhou et al.—"PV balancers: Concept, architectures, and realization"—Energy Conversion Congress and Exposition (ECCE), 2012 IEEE, IEEE pp. 3749-3755.
Jul. 17, 2017—International Search Report—PCT/US2017/031571.
Aug. 4, 2017—European Search Report—EP 17165027.
Jul. 19, 2016—Notice of Opposition—EP 2374190—EP App No. 08878650.4.
Sep. 28, 2017—European Office Action—EP 08857835.6.
Nov. 2, 2017—EP Search Report App No. 13157876.7.
Nov. 11, 2017—EP Search Report—App No. 17171489.2.
Dec. 14, 2017—EP Search Report App No. 17188362.2.
Dec. 15, 2017—EP Search Report App No. 17188365.5.
2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.
Jan. 20, 2005; Duncan, Joseph, A Global Maximum Power Point Tracking DC-DC Converter, Massachussetts Institute of Technology, Dept. of Electrical Engineering and Computer Science Dissertation; 8 pages.
2005; Edelmoser, K.H. et al.; High Efficiency DC-to-AC Power Inverter with Special DC Interface; Professional Paper, ISSN 0005-1144, Automatika 46 (2005) 3-4, 143-148, 6 pages.
2006; Esmaili, Gholamreza; "Application of Advanced Power Electomics in Renewable Energy Sources and Hygrid Generating Systems" Ohio State Univerty, Graduate Program in Electrical and Computer Engineering, Dissertation. 169 pages.
Nov. 13, 2007; Gomez, M; "Consulting in the Solar Power Age," IEEE-CNSV: Consultants' Network of Scilion Valley; 30 pages.
Jul. 25, 1995-Jun. 30, 1998; Kern, G; "SunSine (TM)300: Manufacture of an AC Photovoltaic Module," Final Report, Phases I & II; National Renewable Energy Laboratory, Mar. 1999; NREL-SR-520-26085; 33 pages.
May 1, 2000; Kroposki, H. Thomas and Witt, B & C; "Progress in Photovoltaic Components and Systems," National Renewable Energy Laboratory; NREL-CP-520-27460; 7 pages.
Jan. 22-23, 1998 Oldenkamp, H. et al.; "AC Modules: Past, Present and Future" Workshop Installing the Solar Solution; Hatfield, UK; 6 pages.
Linear Technology Specification Sheet, LTC3443—"High Current Micropower 600kHz Synchronous Buck-Boost DC/DC Converter"—2004.
Linear Technology Specification Sheet, LTC3780—"High Efficiency Synchronous, 4-Switch Buck-Boost Controller"—2005.
Apr. 22, 2004—MICREL—MIC2182 High Efficiency Synchronous Buck Controller.
Apr. 1972—Methods for Utilizing Maximum Power From a Solar Array—Decker, DK.
2000—Evaluating MPPT converter topologies using a MATLAB PV model—Walker, Geoffrey.
Jun. 30, 2008—Wang, Ucilia; Greentechmedia; "National Semi Casts Solarmagic"; www.greentechmedia.com; 3 pages; accessed Oct. 24, 2017.
Sep. 2004; Yuvarajan, S; Dchuan Yu; Shanguang, Xu;" A Novel Power Converter for PHotovoltaic Applications," Journal of Power Sources; vol. 135, No. 1-2, pp. 327-331.
Jun. 1998—Stem M., et al., "Development of a Low-Cost Integrated 20-kW-AC Solar Tracking Subarray for Grid-Connected PV Power System Applications—Final Technical Report"—National Renewable Energy Laboratory; 41 pages.
1997; Verhoeve, C.W.G., et al., "Recent Test Results of AC_Module inverters," Netherlands Energy Research Foundation ECN, 1997; 3 pages.
2004—Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.
Feb. 23-27, 1992—Miwa, Brett et al., "High Efficiency Power Factor Correction Using Interleaving Techniques"—Applied Power Electronics Conference and Exposition, 1992. APEC '92. Conference Proceedings 1992., Seventh Annual.
Mar. 4-8, 2001—Andersen Gert, et al.,—Aalborg University, Institute of Energy Technology, Denmark—"Currect Programmed Control of a Single Phase Two-Switch Buck-Boost Power Factor Correction Circut"—Applied Power Electronics Conference and Exposition, 2001. APEC 2001. Sixteenth Annual IEEE.
Feb. 22-26, 2004—Andersen, Gert et al., —"Utilizing the free running Current Programmed Control as a Power Factor Correction Technique for the two switch Buck-Boost converter"—Applied Power Electronic Conference and Exposition, 2004. APEC '04. Nineteenth Annual IEEE.

(56) References Cited

OTHER PUBLICATIONS

Mar. 3-7, 1996—Caricchi F et al.,—"Prototype of Innovative Wheel Direct Drive With Water-Cooled Exial-Flux Motor for Electric Vehicle Applications"—Applied Power Electronics Conference and Expositions, 1996. APEC '96. Conference Proceedings 1996., Eleventh Annual IEEE.
Feb. 15-19, 1998—Caricchi, F. et al.,—"Study of Bi-Directional Buck-Boost Converter Topologies for Application in Electrical Vehicle Motor Drives"—Applied Power Electronics Conference and Exposition, 1998, APEC '98. Conference Proeedings 1998., Thirteenth Annual IEEE.
Nov. 27-30, 1990—Ensling, JHR—"Maximum Power Point Tracking: A Cost Saving Necessity in Solar Energy Systems"—Industrial Electomics Society, 1990. IECON '90., 16th Annual Conference of IEEE.
Feb. 22-26, 2004—Gaboriault, Mark et al.,—"A High Efficiency, Non-Inverting, Buck-Boost DC-DC Converter"—Applied Power Electronics Conference and Exposition, 2004. APEC '04. Nineteenth Annual IEEE.
Feb. 15-18, 1998—Hua, et al.,—"Comparative Study of Peak Power Tracking Techniques for Solar Storage System"—Applied POwer Electronics Conference and Exposition, 1998. APEC'98. Conferenced Proceedings 1998., Thirteenth Annual IEEE.
Jun. 20-24, 1993—Sullivan, et al., "A High-Efficiency Maximum Power Point Tracker for Photovoltaic Arrays in a Solar-Powered Race Vehicle"—University of California, Berkeley, Department of Electrical Engineering and OCmputer Sciences—Power Electronics Specialists Conference, 1993. PESC '93 Record., 24th Annual IEEE.
May 19-24, 2002—Bower et at.,—"Certification of Photovoltaic Inverters: The Initial Step Toward PV System Certification"—Photovoltaic Specialists Conferences, 2002 Conference Record of the Twenty-Ninth IEEE.
Jun. 17-21, 2001—Tse et al., "A Novel Maximum Power Point Tracking Technique for PV Panels"—Power Electronics Specialists Conferences, 2001. PESC. 2001 IEEE 32nd Annual.
May 12-18, 2008—Cuadras et al., "Smart Interfaces for Low Power Energy Harvesting Systems"—Instrumentation and Measurement Technology Conferences Proceedings, 2008. IMTC 2008. IEEE.
Dec. 5-9, 1994—Haan, et al.,"Test Results of a 130 W AC Module; a modular solar as power station"—Photovoltaic Energy Conversion 1994 Conference Record of the Twenty Fourth. IEEE Phtovoltaic Specialists Conference—1994.
Sep. 1-3, 2008—Jung, et al., "Soft Switching Boost Converter for Photovoltaic Power Generation System"—Power Electronics and Motion Control Conference, 2008. EPE-PEMC 2008.
Jun. 3-5, 2008—Duan, et al., "A Novel High-Efficiency Inverter for Stand Alone and Grid-Connected Systems"—Industrial Electronics and Applications, 2008. ICIEA 2008.
Nov. 7, 2002—Ertl, et al., "A Novel Multicell DC-AC Converter for Applicaiton in Renewable Energy Systems"—IEEE Transactions on Industrial Electronics (vol. 49, Issue 5, Oct. 2002).
Apr. 20, 2020—European Search Report—EP 20151729.9.
Apr. 23, 2020—European Search Report—EP 19217486.0.
Jul. 8, 2020—CN Office Action—CN 201710362679.2.
Noguchi, Short-Current Pulse-Based Maximum-Power-Point Tracking Method for Multiple Photovoltaic-and-Converter Module System, IECON, Febuary 2002.
Siri, Maximum Power Tracking in Parallel Connected Converters, IEEE, Jul. 1993.
Solera, Performance of a 10 kW Power Electronic Interface for Combined Wind/PV Isolated Generating Systems, PESC, 1996.
Wu, An Improved Dynamic Power Distribution Control Scheme for PWM Controlled Converter Modules, IEEE, 1992.
Nov. 27, 2019—European Search Report—3567562.
Baocheng, DC to AC Inverter with Improved One Cycle Control, 2003.
Brekken, Utility-Connected Power Converter for Maximizing Power Transfer From a Photovoltaic Source While Drawing Ripple-Free Current, 2002.

Cramer, Modulorientierter Stromrichter Geht in Serienfertigung , SPVSE, 1994.
Cramer, Modulorientierter Stromrichter, Juelich, Dec. 31, 1995.
Cramer, String-Wechselrichter Machen Solarstrom Billiger, Elektronik, Sep. 1996.
Dehbonei, A Combined Voltage Controlled and Current Controlled "Dual Converter" for a Weak Grid Connected Photovoltaic System with Battery Energy Storage, 2002.
Engler, Begleitende Untersuchungen zur Entwicklung eines Multi-String-Wechselrichters, SPVSE, Mar. 2002.
Geipel, Untersuchungen zur Entwicklung modulorientierter Stromrichter Modulorientierter Stromrichter für netzgekoppelte Photovoltaik-Anlagen, SPVSE, 1995.
Hoor, DSP-Based Stable Control Loops Design for a Single Stage Inverter, 2006.
Isoda, Battery Charging Characteristics in Small Scaled Photovoltaic System Using Resonant DC-DC Converter With Electric Isolation, 1990.
Jones, Communication Over Aircraft Power lines, Dec. 2006/ Jan. 2007.
Kalaivani, A Novel Control Strategy for the Boost DC-AC Inverter, 2006.
Lee, Powering the Dream, IET Computing & Control Engineering, Dec. 2006/ Jan. 2007.
Lee, A Novel Topology for Photovoltaic Series Connected DC/DC Converter with High Efficiency Under Wide Load Range, Jun. 2007.
Lin, LLC DC/DC Resonant Converter with PLL Control Scheme, 2007.
Niebauer, Solarenergie Optimal Nutzen, Stromversorgung, Elektronik, 1996.
Rodrigues, Experimental Study of Switched Modular Series Connected DC-DC Converters, 2001.
Sanchis, Buck-Boost DC-AC Inverter: Proposal for a New Control Strategy, 2004.
Sen, A New DC-to-AC Inverter With Dynamic Robust Performance, 1998.
Shaojun, Research on a Novel Inverter Based on DC/DC Converter Topology, 2003.
Siri, Sequentially Controlled Distributed Solar-Array Power System with Maximum Power Tracking, 2004.
Walko, Poised for Power, IEE Power Engineer, Feb./ Mar. 2005.
White, Elecliical Isolation Requirements in Power-Over-Ethernet (PoE) Power Sourcing Equipment (PSE), 2006.
Yu, Power Conversion and Control Methods for Renewable Energy Sources, May 2005.
Zacharias, Modularisierung in der PV-Systemtechnik—Schnittstellen zur Standardisierung der Komponenten, Institut für Solare Energieversorgungstechnik (ISET), 1996.
Aug. 6, 2019—Notice of Opposition of European Patent 2232663—Fronius International GmbH.
Sep. 5, 2019—Notice of Opposition of European Patent 2549635—Huawei Technologies Co.
Sep. 5, 2019—Notice of Opposition of European Patent 2549635—Fronius International GmbH.
Solide Arbeit, Heinz Neuenstein, Dec. 2007.
Spitzenwirkungsgrad mit drei Spitzen, Heinz Neuenstien and Andreas Schlumberger, Jan. 2007.
Technical Information, Temperature Derating for Sunny Boy, Sunny Mini Central, Sunny Tripower, Aug. 9, 2019.
Prinout from Energy Matters online Forum, Jul. 2011.
Wayback Machine Query for Energy Matters Online Forum Jul. 2011.
Dec. 16, 2021—EP Office Action—EP App. No. 19178054.3.
Zhao Junjian & al.: "Analysis of high efficiency DC/DC converter processing partial input/output power", 14th Workshop on Control and Modeling for Power Electronics, Jun. 23, 2013 (Jun. 23, 2013), DOI: 10.1109/COMPEL.2013.6626440.
Apr. 14, 2021—European Summons to Oral Proceedings—EP 17724234.4.
Jul. 12, 2019—European Search Report—EP 19170538.3.

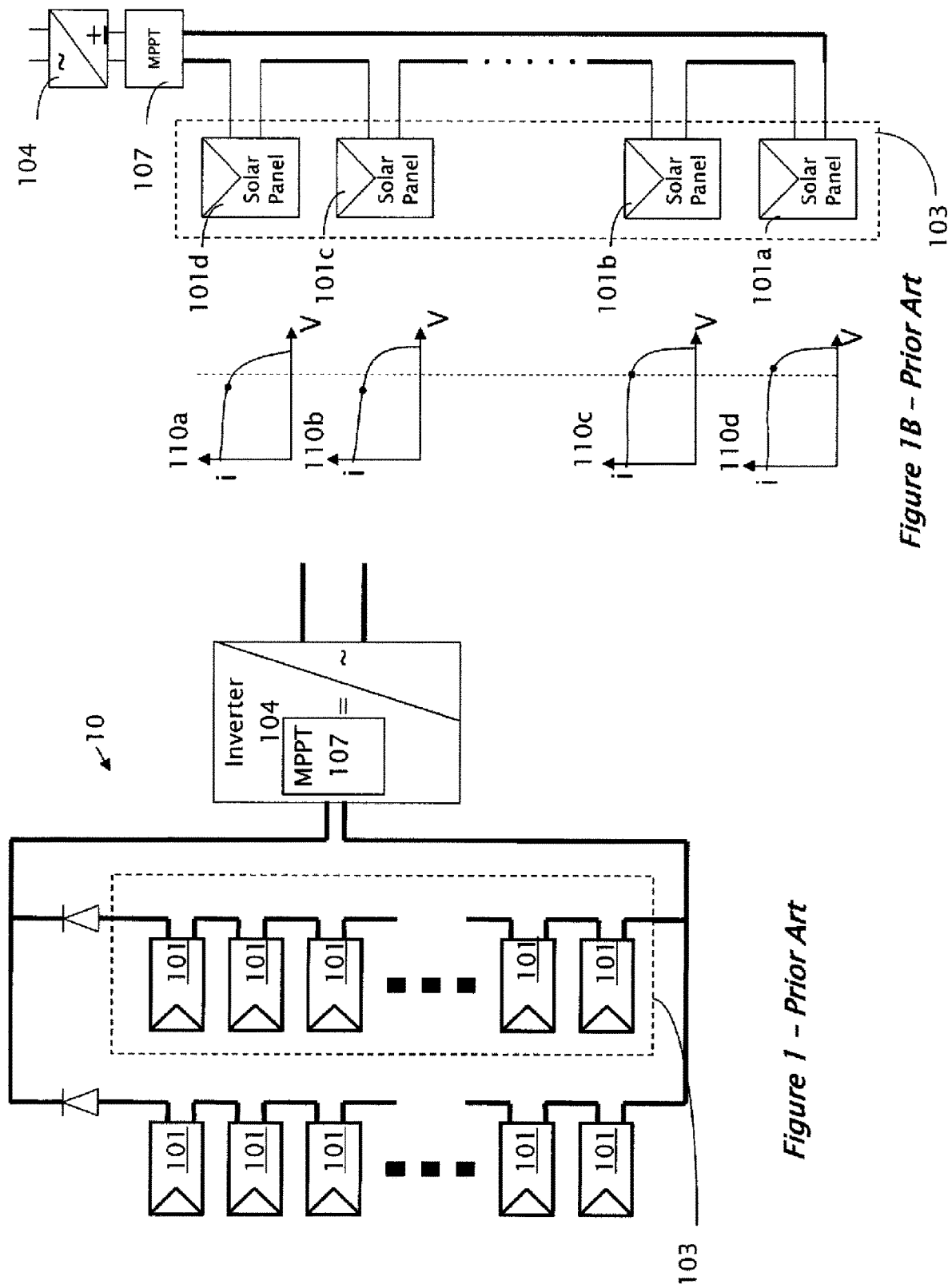

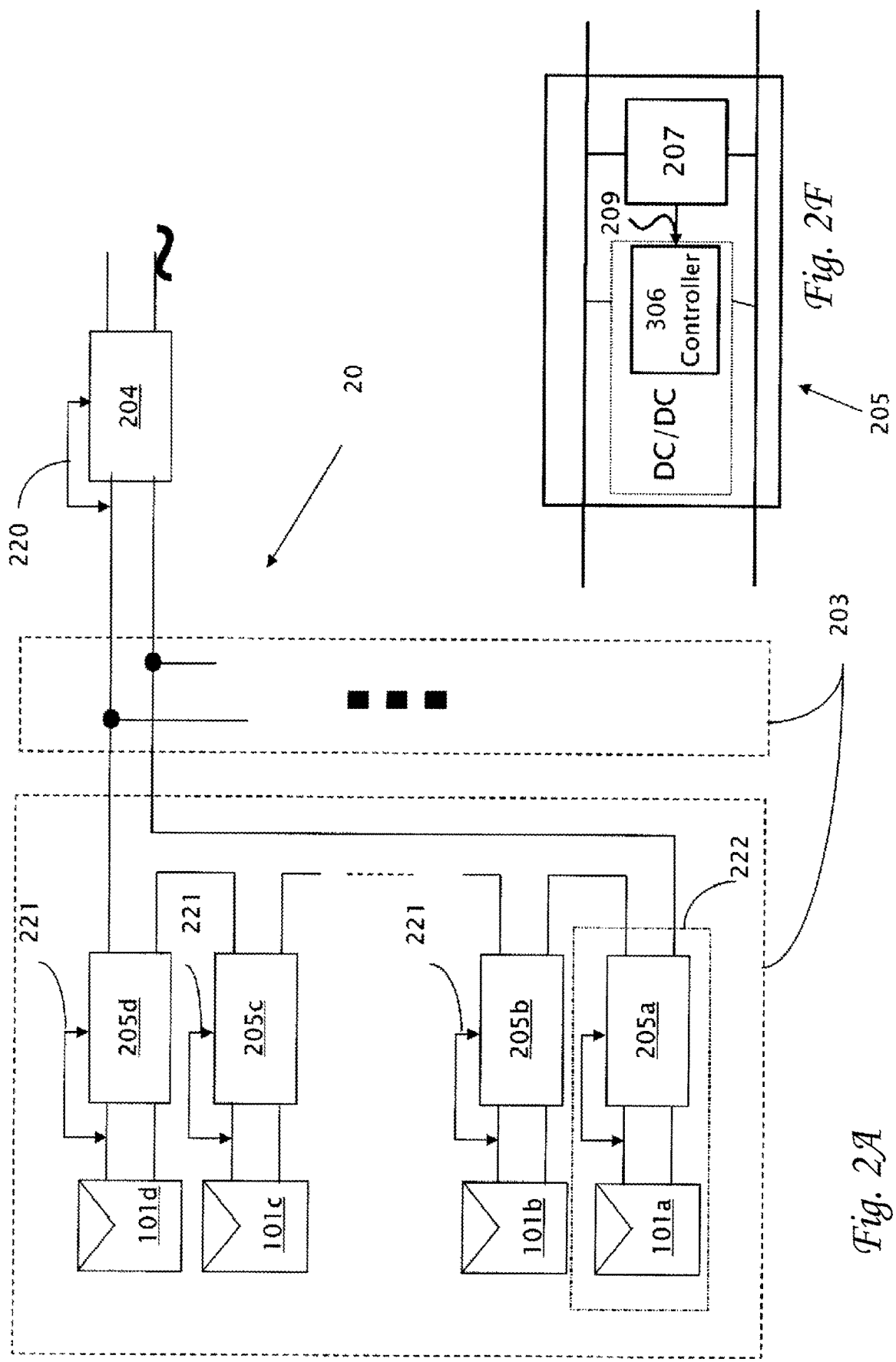

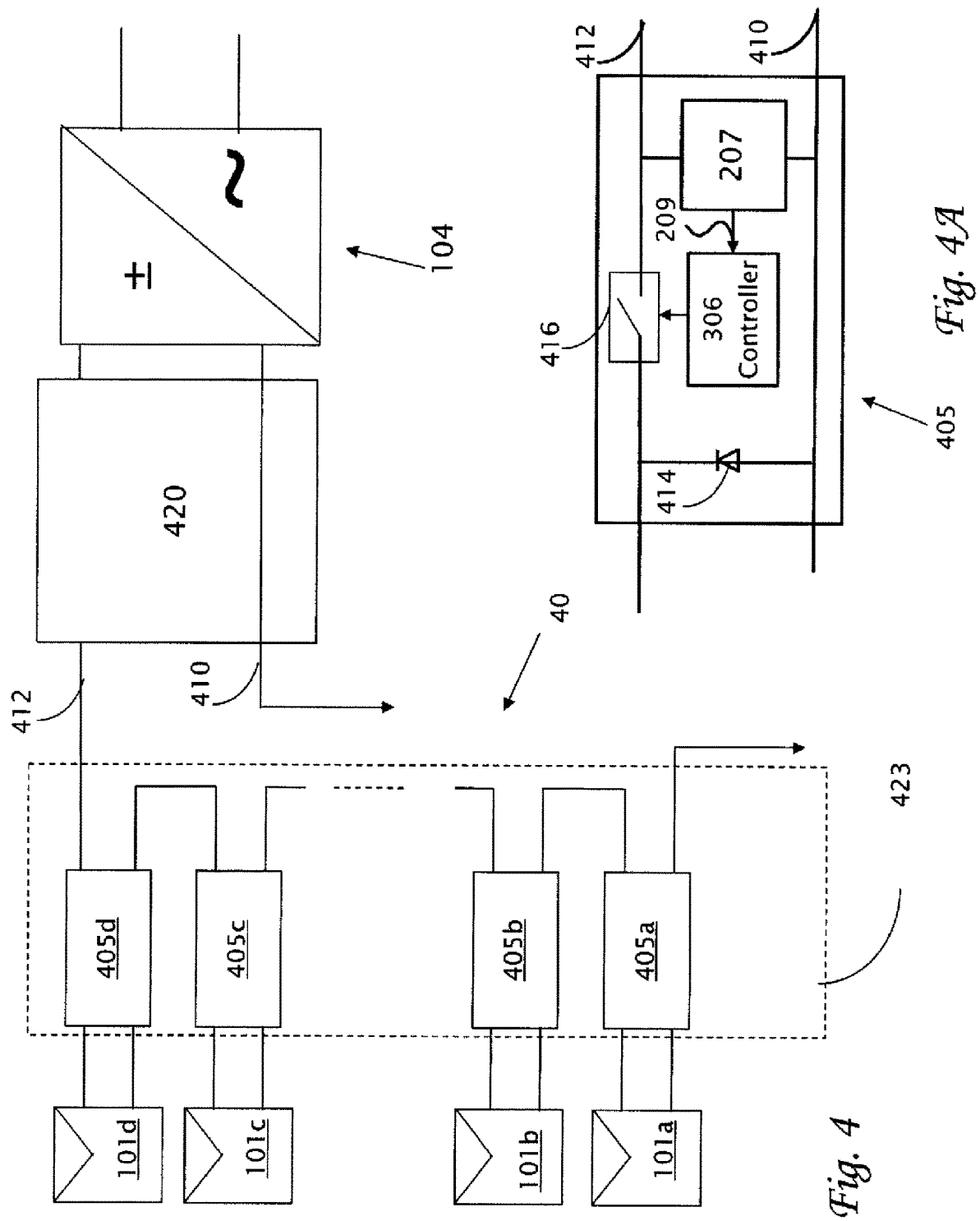

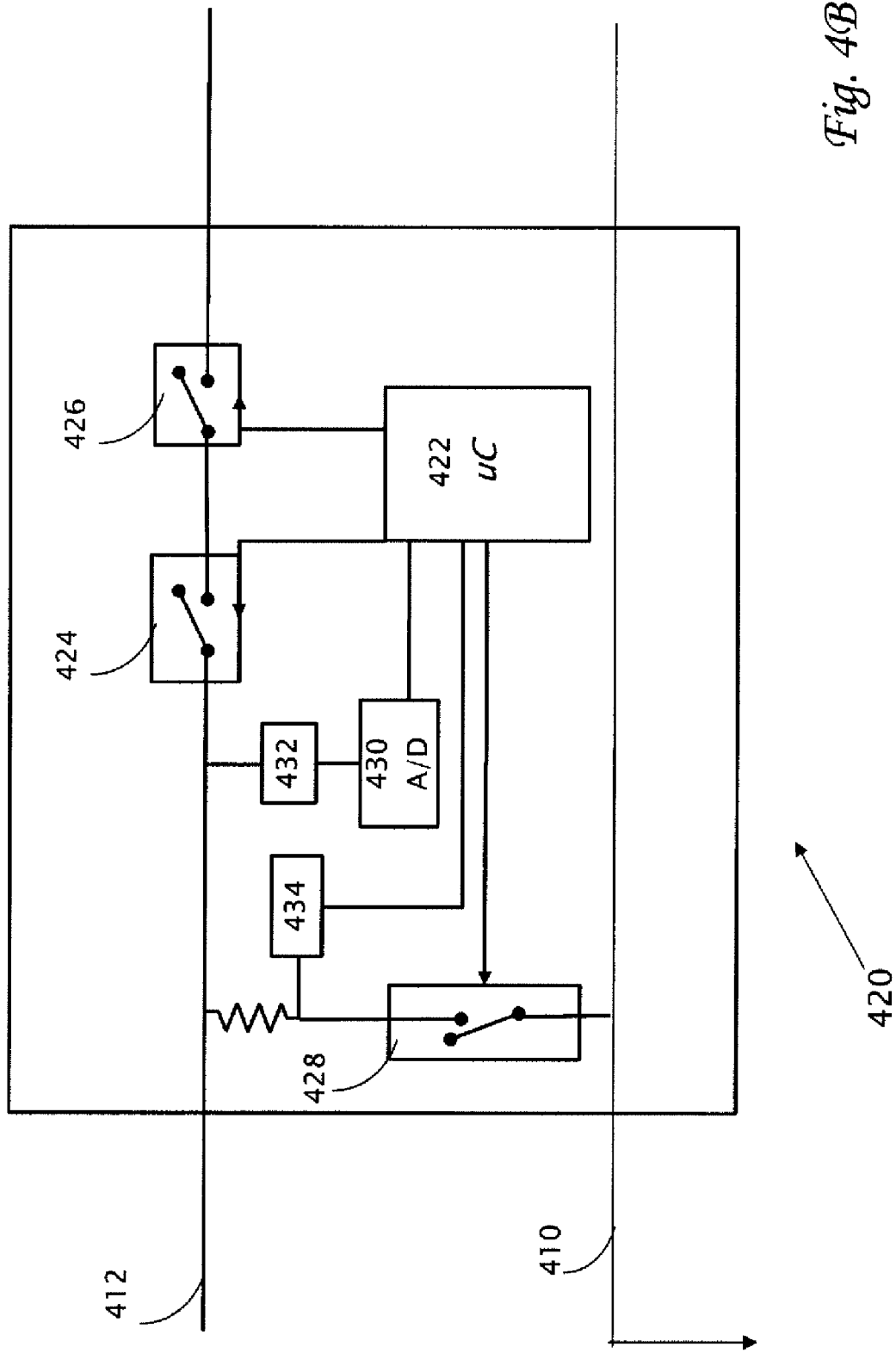

SAFETY MECHANISMS, WAKE UP AND SHUTDOWN METHODS IN DISTRIBUTED POWER INSTALLATIONS

CROSS REFERENCE TO RELATED APPLICATIONS

The present application is a continuation-in-part of co-pending U.S. patent application Ser. No. 12/329,525 filed Dec. 5, 2008 (issued as U.S. Pat. No. 8,531,055 on Sep. 10, 2013), which is a continuation-in-part of co-pending U.S. application Ser. No. 11/950,271 filed Dec. 4, 2007 (issued as U.S. Pat. No. 9,088,178 on Jul. 21, 2015), which claims the benefit of U.S. Provisional Application Ser. No. 60/868,851 filed Dec. 6, 2006, U.S. Provisional Application Ser. No. 60/868,962 filed Dec. 7, 2006, U.S. Provisional Application Ser. No. 60/868,893 filed Dec. 6, 2006, U.S. Provisional Application Ser. No. 60/908,095 filed Mar. 26, 2007, and U.S. Provisional Application Ser. No. 60/916,815 filed May 9, 2007. U.S. patent application Ser. No. 12/329,525 also claims the benefit from U.S. provisional application 60/992,589 filed Dec. 5, 2007. The disclosures of each of the above-identified applications are incorporated herein by reference for all purposes as if entirely set forth herein.

The present application is also a continuation-in-part of co-pending U.S. patent application Ser. No. 12/187,335 filed Aug. 6, 2008 (issued as U.S. Pat. No. 8,319,483 on Nov. 27, 2012), which claims the benefit of U.S. Provisional Application Ser. No. 60/954,261 filed Aug. 6, 2007 and U.S. Provisional Application Ser. No. 60/954,354 filed Aug. 7, 2007. The disclosures of each of the above-identified applications are incorporated herein by reference for all purposes as if entirely set forth herein.

FIELD AND BACKGROUND

The present invention relates to distributed power systems and, more particularly, wake-up and shutdown algorithms for the photovoltaic distributed power systems.

Utility networks provide an electrical power system to utility customers. The distribution of electric power from utility companies to customers utilizes a network of utility lines connected in a grid-like fashion, referred to as an electrical grid. The electrical grid may consist of many independent energy sources energizing the grid in addition to utility companies energizing the grid, with each independent energy source being referred to as a distributed power (DP) generation system. The modern utility network includes the utility power source, consumer loads, and the distributed power generation systems which also supply electrical power to the network. The number and types of distributed power generation systems is growing rapidly and can include photovoltaics, wind, hydro, fuel cells, storage systems such as battery, super-conducting flywheel, and capacitor types, and mechanical devices including conventional and variable speed diesel engines, Stirling engines, gas turbines, and micro-turbines. These distributed power generation systems are connected to the utility network such that they operate in parallel with the utility power sources.

A conventional installation of a solar distributed power system 10, including multiple solar panels 101, is illustrated in FIG. 1. Since the voltage provided by each individual solar panel 101 is low, several panels 101 are connected in series to form a string 103 of panels 101. For a large installation, when higher current is required, several strings 103 may be connected in parallel to form overall system 10. The interconnected solar panels 101 are mounted outdoors, and connected to a maximum power point tracking (MPPT) module 107 and then to an inverter 104. MPPT 107 is typically implemented as part of inverter 104 as shown in FIG. 1. The harvested power from DC sources 101 is delivered to inverter 104, which converts the direct-current (DC) into alternating-current (AC) having a desired voltage and frequency, which is usually 110V or 220V at 60 Hz, or 220V at 50 Hz. The AC current from inverter 104 may then be used for operating electric appliances or fed to the power grid.

As noted above, each solar panel 101 supplies relatively very low voltage and current. A problem facing the solar array designer is to produce a standard AC current at 120V or 220V root-mean-square (RMS) from a combination of the low voltages of the solar panels. The delivery of high power from a low voltage requires very high currents, which cause large conduction losses on the order of the second power of the current $i^2$. Furthermore, a power inverter, such as inverter 104, which is used to convert DC current to AC current, is most efficient when its input voltage is slightly higher than its output RMS voltage multiplied by the square root of 2 (which is the peak voltage). Hence, in many applications, the power sources, such as solar panels 101, are combined in order to reach the correct voltage or current. A large number of panels 101 are connected into a string 103 and strings 103 are connected in parallel to power inverter 104. Panels 101 are connected in series in order to reach the minimal voltage required for inverter 104. Multiple strings 103 are connected in parallel into an array to supply higher current, so as to enable higher power output.

FIG. 1B illustrates one serial string 103 of DC sources, e.g., solar panels 101a-101d, connected to MPPT circuit 107 and inverter 104. The current versus voltage (IV) characteristics is plotted (110a-110d) to the left of each DC source 101. For each DC power source 101, the current decreases as the output voltage increases. At some voltage value, the current goes to zero, and in some applications the voltage value may assume a negative value, meaning that the source becomes a sink. Bypass diodes (not shown) are used to prevent the source from becoming a sink. The power output of each source 101, which is equal to the product of current and voltage (P=i*V), varies depending on the voltage drawn from the source. At a certain current and voltage, close to the falling off point of the current, the power reaches its maximum. It is desirable to operate a power generating cell at this maximum power point (MPP). The purpose of the MPPT is to find this point and operate the system at this point so as to draw the maximum power from the sources.

In a typical, conventional solar panel array, different algorithms and techniques are used to optimize the integrated power output of system 10 using MPPT module 107. MPPT module 107 receives the current extracted from all of solar panels 101 together and tracks the maximum power point for this current to provide the maximum average power such that if more current is extracted, the average voltage from the panels starts to drop, thus lowering the harvested power. MPPT module 107 maintains a current that yields the maximum average power from system 10.

However, since power sources 101a-101d are connected in series to single MPPT 107, MPPT 107 selects a maximum power point which is some average of the maximum power points of the individual serially connected sources 101. In practice, it is very likely that MPPT 107 would operate at an I-V point that is optimum for only a few or none of sources 101. In the example of FIG. 1B, the selected point is the maximum power point for source 101b, but is off the maximum power point for sources 101*a*, 101*c* and 101*d*. Consequently, the arrangement is not operated at best achievable efficiency.

The present applicant has disclosed in co-pending U.S. application Ser. No. 11/950,271 entitled "Distributed Power Harvesting Systems Using DC Power Sources", the use of an electrical power converter, e.g. DC-to-DC converter, attached to the output of each power source, e.g. photovoltaic panel. The electrical power converter converts input power to output power by monitoring and controlling the input power at a maximum power level.

The term "signaling" or "signaling mechanism" as used herein refers to either a signal modulated on an electromagnetic carrier signal or a simple unmodulated signal such as an on/off signal "keep alive" signal or "dry contact" signal. For a modulated signal, the modulation method may be by any such method known in the art by way of example, frequency modulation (FM) transmission, amplitude modulation (AM), FSK (frequency shift keying) modulation, PSK (phase shift keying) modulation, various QAM (Quadrature amplitude modulation) constellations, or any other method of modulation.

The term "power module" as used herein includes power converters such as a DC-DC power converter but also includes modules adapted to control the power passing through the module or a portion of the power, whether by switching or other means.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the present invention, there is provided a distributed power system including a DC power source and a power module. The power module includes an input coupled respectively to the DC power source and an output. An inverter is coupled to the output. The inverter converts power input from the output of the power module to output power. A signaling mechanism between the inverter and the power module is adapted for controlling operation of the power module. During operation of the distributed power system, in some embodiments, the signaling mechanism may superimpose a signal on the output of the power module. The signaling mechanism may include a switch integrated with the inverter, the switch modulating the signal onto the output of the power module. A receiver integrated with the power modules receives the signal from the inverter. Alternatively a detection mechanism in the power module detects a signal at the frequency of the electrical grid. Alternatively, a signal from the electrical grid is detected in the output of the power module at a higher frequency up-converted from the frequency of the electrical grid. Alternatively, a detection mechanism in the power module detects a switching frequency of the inverter. The power modules are may be configured for operation in a safety mode, and during the safety mode, the power at the output of the power module, the voltage across the output of the power module, and/or the current flowing through it, are limited so as not to endanger personnel. The power module may include a detection mechanism wherein during operation of the distributed power system, the detection mechanism detects a signal from the inverter. Based on the signal, the operation of the power module is varied from the safety mode of operation to a normal mode of operation for converting power of the DC power source from the input to the output of the power module.

According to another aspect of the present invention there is provided a method for operating a distributed power system. The system includes a DC power source and a power module. The power module includes an input coupled to the DC power source. The power module includes an output. An inverter is coupled to the output of the power module. The inverter converts a power output from the power module to an output power. The method includes operating the power modules in a safety mode by limiting the power output from the power module. The safety mode is characterized by having less than a predetermined amount (e.g. ten milliamperes) of current flow and/or less than a predetermined amount (e.g. 2 Volts) through the output of the power module. A signal from the inverter is preferably monitored and upon detecting the signal from the inverter, the power input to the inverter is increased by operating the power module in a normal mode of operation for converting power of the DC power source from the input to the output of the power module. Upon detecting the signal and prior to the operation of the power module in the normal mode of operation, the voltage of the output of the power module is preferably ramped up slowly. The normal mode of operation of the power module may include controlling a maximum peak power at the input coupled to the DC power sources.

The foregoing and/or other aspects will become apparent from the following detailed description when considered in conjunction with the accompanying drawing figures.

BRIEF DESCRIPTION OF THE DRAWINGS

The accompanying drawings, which are incorporated in and constitute a part of this specification, exemplify embodiments of the present invention and, together with the description, serve to explain and illustrate principles of the invention. The drawings are intended to illustrate various features of the illustrated embodiments in a diagrammatic manner. The drawings are not intended to depict every feature of actual embodiments nor relative dimensions of the depicted elements, and are not necessarily drawn to scale.

The invention is herein described, by way of example only, with reference to the accompanying drawings, wherein:

FIG. 1 is a block diagram of a conventional power harvesting system using photovoltaic panels as DC power sources;

FIG. 1B illustrates current versus voltage characteristic curves for one serial string the DC power sources of FIG. 1;

FIGS. 2A-2E are simplified block diagrams illustrating distributed power harvesting circuits, based on the disclosure in U.S. application Ser. No. 11/950,271, according to an aspect of the present invention;

FIG. 2F is a simplified block diagram of a DC-to-DC converter, including a feature of the present invention;

FIG. 4 is a simplified block diagram of another exemplary system, according to an embodiment of the present invention;

FIG. 4A is a simplified block diagram illustrating in more detail, a power module according to the embodiment of FIG. 4;

FIG. 4B is a simplified block diagram illustrating in more detail, a signaling mechanism attached to a conventional inverter, according to embodiments of the present invention;

DETAILED DESCRIPTION

Figure 2B:
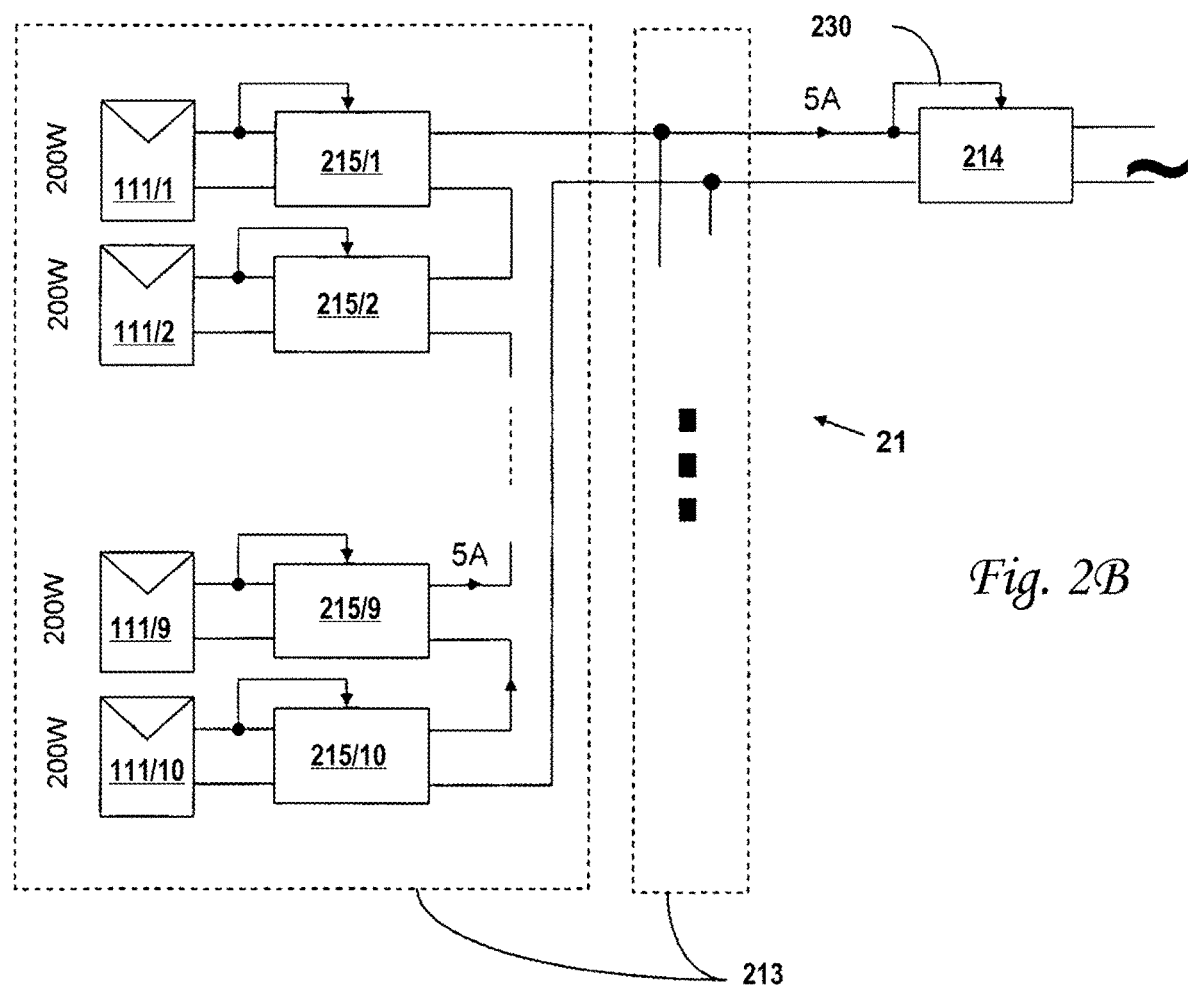

Reference will now be made in detail to embodiments of the present invention, examples of which are illustrated in the accompanying drawings, wherein like reference numerals refer to the like elements throughout. The embodiments are described below to explain the present invention by referring to the figures.

It should be noted, that although the discussion herein relates primarily to wake-up and shutdown methods in photovoltaic systems and more particularly to those systems previously disclosed in U.S. application Ser. No. 11/950, 271, the present invention may, by non-limiting example, alternatively be configured as well using conventional photovoltaic distributed power systems and other distributed power systems including (but not limited to) wind turbines, hydroturbines, fuel cells, storage systems such as battery, super-conducting flywheel, and capacitors, and mechanical devices including conventional and variable speed diesel engines, Stirling engines, gas turbines, and micro-turbines.

By way of introduction, it is important to note that aspects of the present invention have important safety benefits. While installing or performing maintenance on photovoltaic systems according to certain aspects of the present invention, installers are protected from danger of shock or electrocution since systems according to embodiments of the present invention do not output potentially dangerous high voltage and/or currents when an operational inverter is not connected during installation and maintenance procedures.

Before explaining embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Reference is now made to FIG. 2A which illustrates a distributed power harvesting circuit 20, based on the disclosure in U.S. application Ser. No. 11/950,271. Circuit 20 enables connection of multiple distributed power sources, for example solar panels 101a-101d, to a single power supply. Series string 203 of solar panels 101 may be coupled to an inverter 204 or multiple connected strings 203 of solar panels 101 may be connected to a single inverter 204. In configuration 20, each solar panel 101a-101d is connected individually to a separate power converter circuit or a module 205a-205d. Each solar panel 101 together with its associated power converter circuit 205 forms a power generating element 222. (Only one such power generating element 222 is marked in FIG. 2A.) Each converter 205a-205d adapts optimally to the power characteristics of the connected solar panel 101a-101d and transfers the power efficiently from input to output of converter 205. Converters 205a-205d are typically microprocessor controlled switching converters, e.g. buck converters, boost converters, buck/boost converters, flyback or forward converters, etc. The converters 205a-205d may also contain a number of component converters, for example a serial connection of a buck and a boost converter. Each converter 205a-205d includes a control loop 221, e.g. MPPT loop that receives a feedback signal, not from the converter's output current or voltage, but rather from the converter's input coming from solar panel 101. The MPPT loop of converter 205 locks the input voltage and current from each solar panel 101a-101d at its optimal power point, by varying one or more duty cycles of the switching conversion typically by pulse width modulation (PWM) in such a way that maximum power is extracted from each attached panel 101a-101d. The controller of converter 205 dynamically tracks the maximum power point at the converter input. Feedback loop 221 is closed on the input power in order to track maximum input power rather than closing a feedback loop on the output voltage as performed by conventional DC-to-DC voltage converters.

As a result of having a separate MPPT circuit in each converter 205a-205d, and consequently for each solar panel 101a-101d, each string 203 may have a different number or different specification, size and/or model of panels 101a-101d connected in series. System 20 of FIG. 2A continuously performs MPPT on the output of each solar panel 101a-101d to react to changes in temperature, solar radiance, shading or other performance factors that effect one or more of solar panels 101a-101d. As a result, the MPPT circuit within the converters 205a-205d harvests the maximum possible power from each panel 101a-101d and transfers this power as output regardless of the parameters effecting other solar panels 101a-101d.

As such, the aspects of the invention shown in FIG. 2A continuously track and maintain the input current and the input voltage to each converter at the maximum power point of the DC power source providing the input current and the input voltage to the converter. The maximum power of the DC power source that is input to the converter is also output from the converter. The converter output power may be at a current and voltage different from the converter input current and voltage. The output current and voltage from the converter are responsive to requirements of the series connected portion of the circuit.

The outputs of converters 205a-205d are series connected into a single DC output that forms the input to inverter 204. Inverter 204 converts the series connected DC output of converters 205a-205d into an AC power supply. Inverter 204, regulates the voltage at the input of inverter 204. In this example, an independent control loop 220 holds the voltage input to inverter 204 at a set value, say 400 volts. The current at the input of inverter 204 is typically fixed by the power available and generated by photovoltaic panels 101, and this is the current that flows through all serially connected DC sources. On the other hand, while the output of the DC-DC converters must be at the inverter's current input, the current and voltage input to the converter is independently controlled using the MPPT.

In the prior art, the input voltage to the load was allowed to vary according to the available power. For example, when a lot of sunshine is available in a solar installation, the voltage input to the inverter can vary even up to 1000 volts. Consequently, as sunshine illumination varies, the voltage varies with it, and the electrical components in the inverter (or other power supplier or load) are exposed to varying voltage. This tends to degrade the performance of the components and ultimately causes them to fail. On the other hand, by fixing the voltage or current to the input of the load or power supplier, here the inverter, the electrical components are always exposed to the same voltage or current and therefore would have extended service life. For example, the components of the load (e.g., capacitors, switches and coil of the inverter) may be selected so that at the fixed input voltage or current they operate at, say, 60% of their rating. This would improve the reliability and prolong the service life of the component, which is critical for avoiding loss of service in applications such as solar power systems.

Figure 2C:
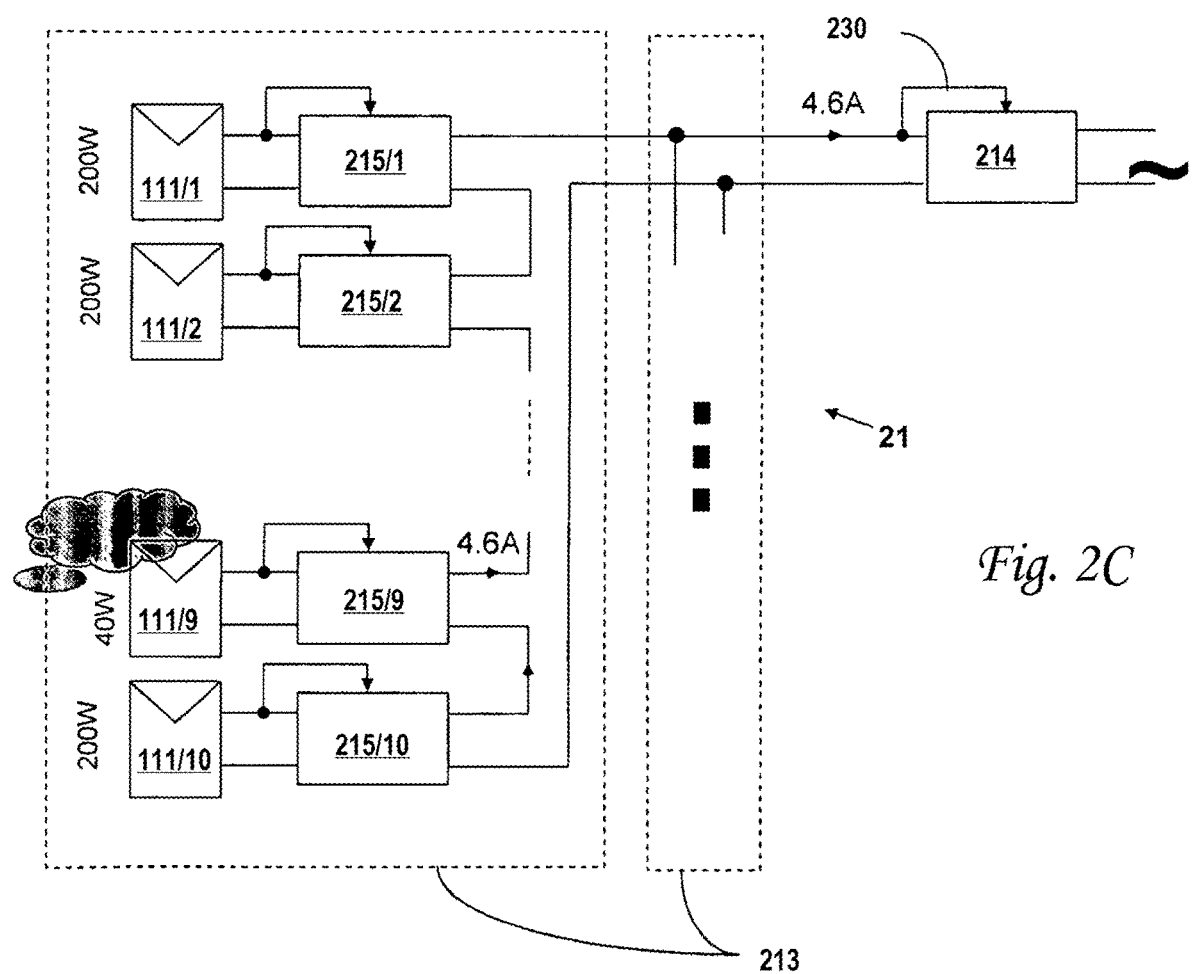

FIGS. 2B and 2C illustrate the operation of the system of FIG. 2A under different conditions, according to aspects of the invention. The exemplary configuration 21 is similar to configuration 20 of FIG. 2A. In the example shown, ten DC power sources 111/1 through 111/10 are connected to ten power converters 215/1 through 215/10, respectively. The modules formed by the DC power sources and their corresponding converters are coupled together in series to form a string 213. In one aspect of the invention, the series-connected converters 215 are coupled to a DC-to-AC inverter 214.

The DC power sources may be solar panels and the example is discussed with respect to solar panels as one illustrative case. Each solar panel 111 may have a different power output due to manufacturing tolerances, shading, or other factors. For the purpose of the present example, an ideal case is illustrated in FIG. 2B, where efficiency of the DC-to-DC conversion is assumed to be 100% and the panels 121 are assumed to be identical. In some aspects of the invention, efficiencies of the converters may be quite high and range at about 95%-99%. So, the assumption of 100% efficiency is not unreasonable for illustration purposes. Moreover, according to embodiments of the subject invention, each of the DC-DC converters is constructed as a power converter, i.e., it transfers to its output the entire power it receives in its input with very low losses.

Power output of each solar panel 111 is maintained at the maximum power point for the panel by a control loop within the corresponding power converter 215. In the example shown in FIG. 2B, all of the panels are exposed to full sun illumination and each solar panel 111 provides 200W of power. Consequently, the MPPT loop will draw current and voltage level that will transfer the entire 200W from the panel to its associated converter. That is, the current and voltage dictated by the MPPT form the input current $I_{in}$ and input voltage $V_{in}$ to the converter. The output voltage is dictated by the constant voltage set at the inverter 214, as will be explained below. The output current $I_{out}$ would then be the total power, i.e., 200W, divided by the output voltage $V_{out}$.

As noted above, according to a feature of the invention, the input voltage to inverter 214 is controlled by the inverter (in this example, kept constant), by way of control loop 230. For the purpose of this example, assume the input voltage is kept as 400V (ideal value for inverting to 220V AC). Since we assume that there are ten serially connected power converters, each providing 200W, we can see that the input current to the inverter 214 is 2000W /400V =5A. Thus, the current flowing through each of the converters 111/1-111/10 must be 5A. This means that in this idealized example each of the converters provides an output voltage of 200W/5A =40V. Now, assume that the MPPT for each panel (assuming perfect matching panels) dictates $V_{MPP}$ =32V. This means the input current would be 200W /32V =6.25A.

We now turn to another example, wherein the system is still maintained at an ideal mode (i.e., perfectly matching DC sources and entire power is transferred to the inverter), but the environmental conditions are not ideal. For example, one DC source is overheating, is malfunctioning, or, as in the example of FIG. 2C, the ninth solar panel 111/9 is shaded and consequently produces only 40W of power. Since we keep all other conditions as in the example of FIG. 2B, the other nine solar panels 111 are unshaded and still produce 200W of power. The power converter 215/9 includes MPPT to maintain the solar panel 121/9 operating at the maximum power point, which is now lowered due to the shading.

The total power available from the string is now 9×200W + 40W = 1840W. Since the input to the inverter is still maintained at 400V, the input current to the inverter will now be 1840W/40V =4.6A. This means that the output of all of the power converters 215/1-215/10 in the string must be at 4.6A. Therefore, for the nine unshaded panels, the converters will output 200W/4.6A = 43.5V. On the other hand, the converter 215/9 attached to the shaded panel 111/9 will output 40W/4.6A = 8.7V. Checking the math, the input to the inverter can be obtained by adding nine converters providing 43.5V and one converter providing 8.7V, i.e., (9×43.5V) + 8.7V = 400V.

The output of the nine non-shaded panels would still be controlled by the MPPT as in FIG. 2B, thereby standing at 32V and 6.25A. On the other hand, since the nines panel 111/9 is shaded, lets assume its MPPT dropped to 28V. Consequently, the output current of the ninth panel is 40W/28V = 1.43A. As can be seen by this example, all of the panels are operated at their maximum power point, regardless of operating conditions. As shown by the example of FIG. 2C, even if the output of one DC source drops dramatically, the system still maintains relatively high power output by fixing the voltage input to the inverter, and controlling the input to the converters independently so as to draw power from the DC source at the MPP.

As can be appreciated, the benefit of the topology illustrated in FIGS. 2B and 2C are numerous. For example, the output characteristics of the serially connected DC sources, such as solar panels, need not match. Consequently, the serial string may utilize panels from different manufacturers or panels installed on different parts of the roofs (i.e., at different spatial orientation). Moreover, if several strings are connected in parallel, it is not necessary that the strings match, rather each string may have different panels or different number of panels. This topology also enhances reliability by alleviating the hot spot problem. That is, as shown in FIG. 2B the output of the shaded panel 111/9 is 1.43A, while the current at the output of the unshaded panels is 6.25A. This discrepancy in current when the components are series connected causes a large current being forced through the shaded panel that may cause overheating and malfunction at this component. However, by the inventive topology wherein the input voltage is set independently, and the power draw from each panel to its converter is set independently according to the panels MPP at each point in time, the current at each panel is independent on the current draw from the serially connected converters.

It is easily realized that since the power is optimized independently for each panel, panels could be installed in different facets and directions in building-integrated photovoltaics (BIPV) installations. Thus, the problem of low power utilization in building-integrated installations is solved, and more installations may now be profitable.

The described system could also easily solve the problem of energy harvesting in low light conditions. Even small amounts of light are enough to make the converters 215 operational, and they then start transferring power to the inverter. If small amounts of power are available, there will be a low current flow - but the voltage will be high enough for the inverter to function, and the power will indeed be harvested.

According to aspects of the invention, the inverter 214 includes a control loop 230 to maintain an optimal voltage at the input of inverter 214. In the example of FIG. 2C, the input voltage to inverter 214 is maintained at 400V by the control loop 230. The converters 215 are transferring substantially all of the available power from the solar panels to the input of the inverter 214. As a result, the input current to the inverter 214 is dependent only on the power provided by the solar panels and the regulated set, i.e., constant, voltage at the inverter input.

The conventional inverter 104, shown in FIG. 1 and FIG. 2, is required to have a very wide input voltage to accommodate for changing conditions, for example a change in luminance, temperature and aging of the solar array. This is in contrast to the inverter 214 that is designed according to aspects of the present invention. The inverter 214 does not require a wide input voltage and is therefore simpler to design and more reliable. This higher reliability is achieved, among other factors, by the fact that there are no voltage spikes at the input to the inverter and thus the components of the inverter experience lower electrical stress and may last longer.

When the inverter 214 is a part of the circuit, the power from the panels is transferred to a load that may be connected to the inverter. To enable the inverter 214 to work at its optimal input voltage, any excess power produced by the solar array, and not used by the load, is dissipated. Excess power may be handled by selling the excess power to the utility company if such an option is available. For off-grid solar arrays, the excess power may be stored in batteries. Yet another option is to connect a number of adjacent houses together to form a micro-grid and to allow load-balancing of power between the houses. If the excess power available from the solar array is not stored or sold, then another mechanism may be provided to dissipate excess power.

Figure 2D:
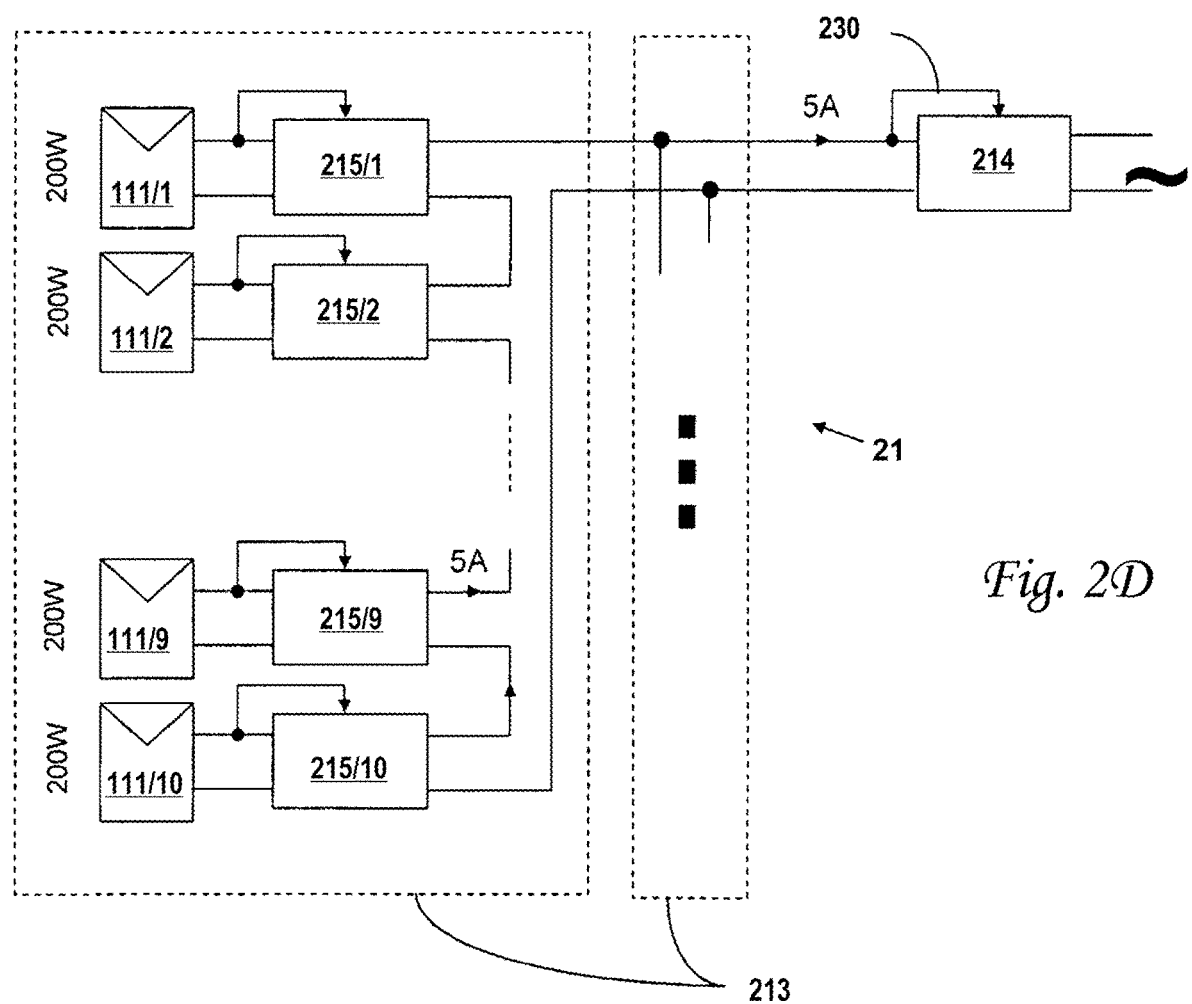

The features and benefits explained with respect to FIGS. 2B and 2C stem, at least partially, from having the inverter dictates the voltage provided at its input. Conversely, a design can be implemented wherein the inverter dictates the current at its input. Such an arrangement is illustrated in FIG. 2D. FIG. 2D illustrates an embodiment of the invention wherein the inverter controls the input current. Power output of each solar panel 111 is maintained at the maximum power point for the panel by a control loop within the corresponding power converter 215. In the example shown in FIG. 2D, all of the panels are exposed to full sun illumination and each solar panel 111 provides 200W of power. Consequently, the MPPT loop will draw current and voltage level that will transfer the entire 200W from the panel to its associated converter. That is, the current and voltage dictated by the MPPT form the input current $I_{in}$ and input voltage $V_{in}$ to the converter. The output voltage is dictated by the constant current set at the inverter 214, as will be explained below. The output voltage $V_{out}$ would then be the total power, i.e., 200W, divided by the output current $I_{out}$.

As noted above, according to a feature of the invention, the input current to inverter 214 is dictated by the inverter by way of control loop 230. For the purpose of this example, assume the input current is kept as 5A. Since we assume that there are ten serially connected power converters, each providing 200W, we can see that the input voltage to the inverter 214 is 2000W/5A = 400V. Thus, the current flowing through each of the converters 111/1-111/10 must be 5A. This means that in this idealized example each of the converters provides an output voltage of 200W/5A = 40V. Now, assume that the MPPT for each panel (assuming perfect matching panels) dictates $V_{MPP}$ = 32V. This means that the input current would be 200W/32V = 6.25A.

Consequently, similar advantages have been achieved by having the inverter control the current, rather than the voltage. However, unlike the prior art, changes in the output of the panels will not cause in changes in the current flowing to the inverter, as that is dictated by the inverter itself. Therefore, if the inverter is designed to keep the current or the voltage constant, then regardless of the operation of the panels, the current or voltage to the inverter will remain constant.

Figure 2E:
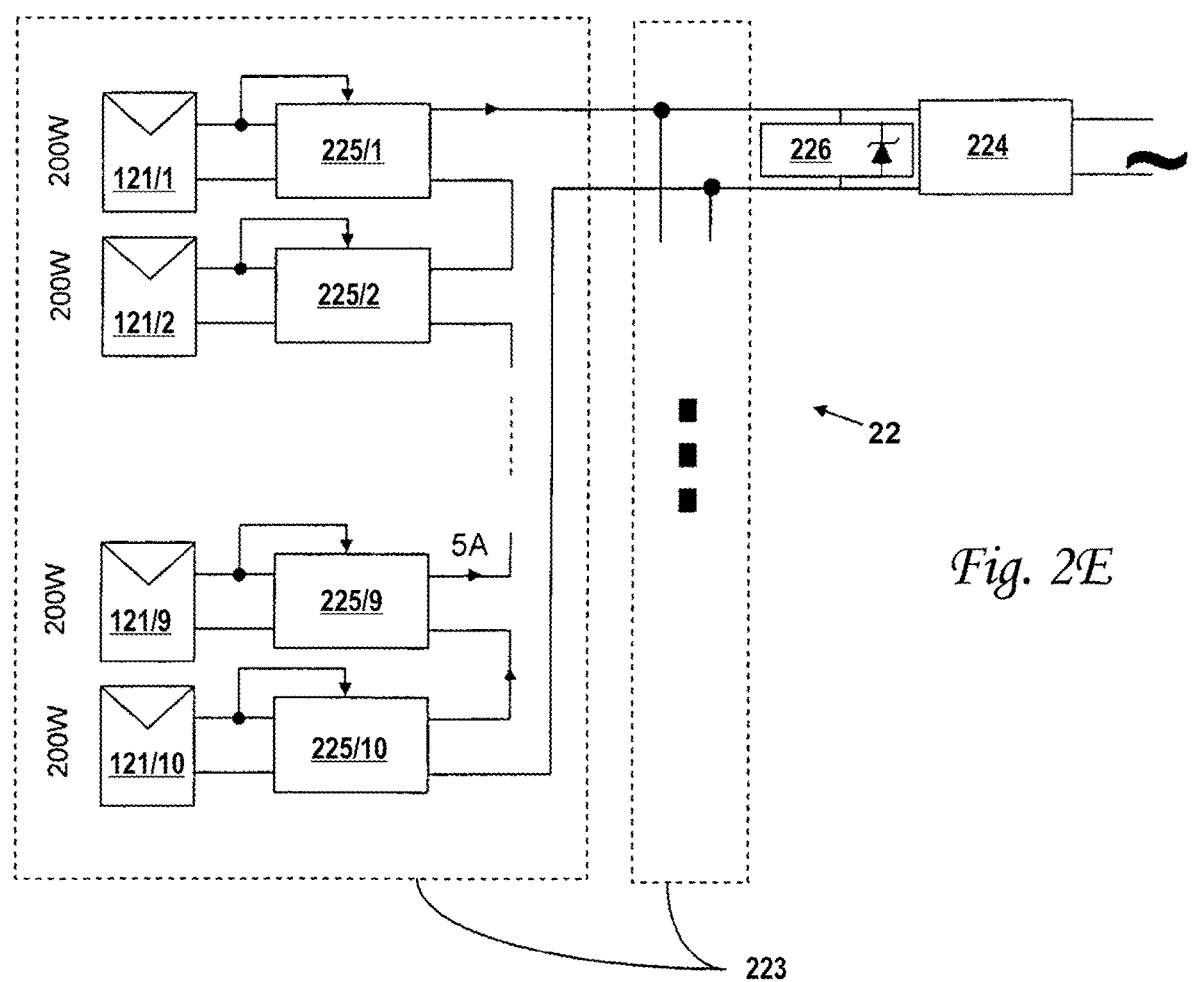

FIG. 2E illustrates a distributed power harvesting system 22, according to other aspects of the invention, using DC power sources. FIG. 2E illustrates multiple strings 223 coupled together in parallel. Each of the strings is a series connection of multiple modules and each of the modules includes a DC power source 121 that is coupled to a converter 225. The DC power source may be a solar panel. The output of the parallel connection of the strings 223 is connected, again in parallel, to a shunt regulator 226 and a load controller 224. The load controller 224 may be an inverter as with the embodiments of FIGS. 2B and 2C. Shunt regulators automatically maintain a constant voltage across its terminals. The shunt regulator 226 is configured to dissipate excess power to maintain the input voltage at the input to the inverter 224 at a regulated level and prevent the inverter input voltage from increasing. The current which flows through shunt regulator 226 complements the current drawn by inverter 224 in order to ensure that the input voltage of the inverter is maintained at a constant level, for example at 400V.

By fixing the inverter input voltage, the inverter input current is varied according to the available power draw. This current is divided between the strings 223 of the series connected converters. When each converter includes a controller loop maintaining the converter input voltage at the maximum power point of the associated DC power source, the output power of the converter is determined. The converter power and the converter output current together determine the converter output voltage. The converter output voltage is used by a power conversion circuit in the converter for stepping up or stepping down the converter input voltage to obtain the converter output voltage from the input voltage as determined by the MPPT.

According to a feature of the present invention, information regarding wakeup or shut-down may be conveyed from inverter 204 to converters 205. The information may be transmitted using any of the methods well known to those experienced in the art. According to certain embodiments, a modulation method may be used, by way of example, frequency modulation (FM) transmission, amplitude modulation (AM), FSK (frequency shift keying) modulation, PSK (phase shift keying) modulation, various QAM (Quadrature amplitude modulation) constellations, or any other method of modulation. Alternatively, inverter 204, while converting power from its input to its output, actively creates a frequency ripple in serial string 203. During normal operation, the 100 Hz (or 120 Hz in USA) ripple is detectable in serial string 203 since the capacitors of inverter 204 do not entirely block the alternating current (AC), and an additional signaling mechanism is not required to produce the 100/120 Hz signal in serial string 203. Alternatively or in addition, one or more switching frequencies of inverter 204, typically 16 Khz or 32 KHz may be detectable as leakage or provided intentionally to serial string 203.

Reference is now made to FIG. 2F which illustrates a feature of the present invention. In FIG. 2F, converter 205 is shown in more detail. Integrated with power converter 205 is a detector/receiver 207, according to a feature of the present invention which is configured to receive, optionally amplify and detect the signal, e.g. at 100/120 Hz originating in inverter 204.

Controller 306 preferably either polls a signal input 209 from receiver/detector 207 or uses signal input 209 as an interrupt so that only when detector/receiver 207 detects the 100/120 Hz signal, is module 205 in a normal operating mode converting power from its input to its output. Receiver 207 is alternatively configured to detect the 16/32 KHz inverter switching frequency and provides an enabling signal to controller on signal input 209 while inverter 204 is operating.

Figure 3:
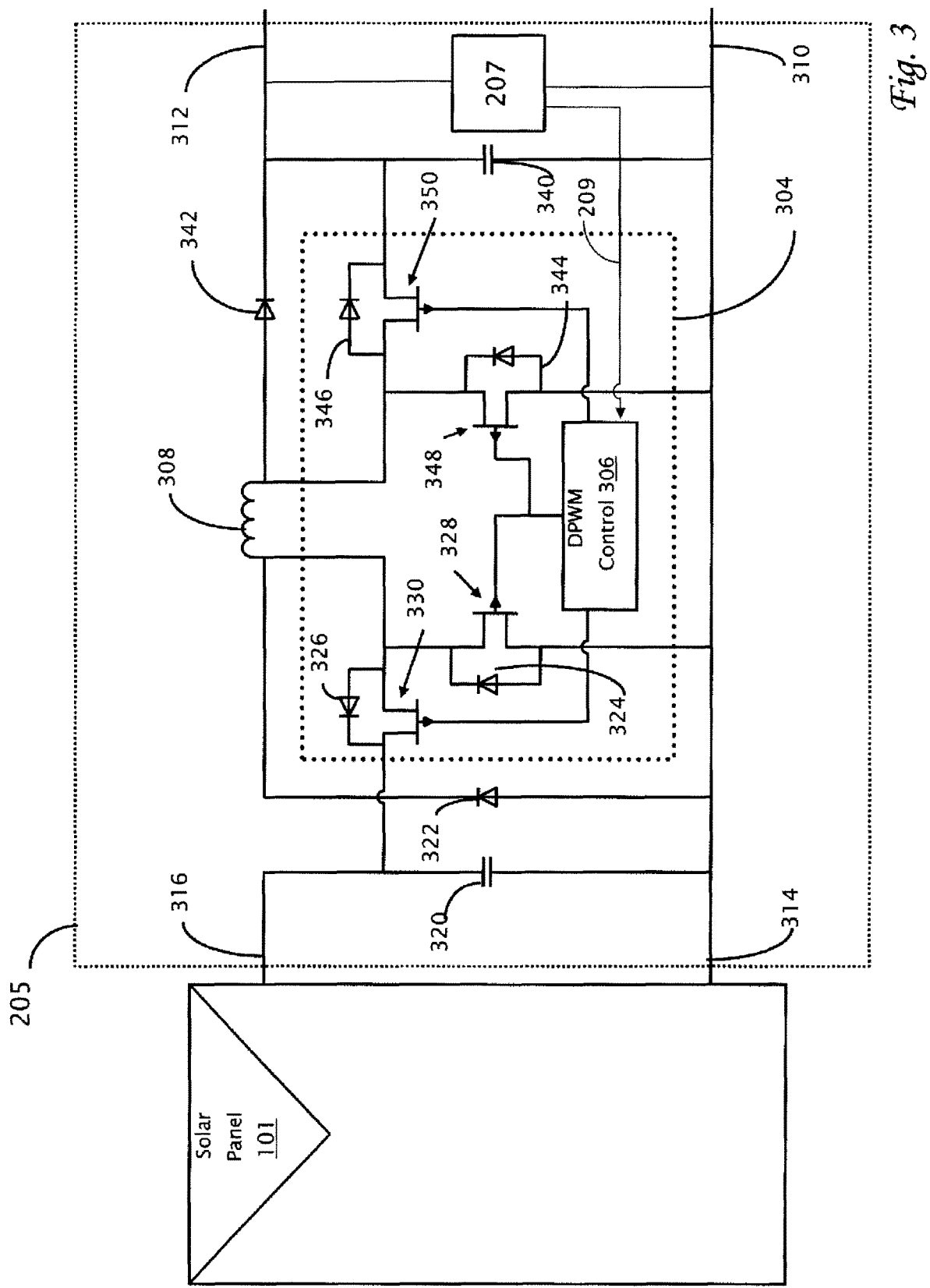
FIG. 3 illustrates an exemplary DC-to-DC converter, is a simplified block diagram illustrating in more detail.

Reference is now made to FIG. 3 which illustrates an exemplary DC-to-DC converter 205, according to a feature of the present invention. DC-to-DC converters are used to either step down or step up a DC voltage input to a higher or a lower DC voltage output, depending on the requirements of the output circuit. However, in the embodiment of FIG. 3 the DC-DC converter 205 is used as a power converter, i.e., transferring the input power to output power, the input voltage varying according to the MPPT at the input, while the output current is dictated by the constant input voltage to inverter 104, 204. That is, the input voltage and current may vary at any time and the output voltage and current may vary at any time, depending on the operating condition of DC power sources 101.

Converter 205 is connected to a corresponding DC power source 101 at input terminals 314 and 316. The converted power of the DC power source 101 is output to the circuit through output terminals 310, 312. Between the input terminals 314, 316 and the output terminals 310, 312, the converter circuit includes input and output capacitors 320, 340, backflow prevention diodes 322, 342 and a power conversion circuit including a controller 306 and an inductor 308.

Diode 342 is in series with output 312 with a polarity such that current does not backflow into the converter 205. Diode 322 is coupled between the positive output lead 312 through inductor 308 which acts a short fol. DC current and the negative input lead 314 with such polarity to prevent a current from the output 312 to backflow into solar panel 101.

A potential difference exists between wires 314 and 316 due to the electron-hole pairs produced in the solar cells of panel 101. Converter 205 maintains maximum power output by extracting current from the solar panel 101 at its peak power point by continuously monitoring the current and voltage provided by panel 101 and using a maximum power point tracking algorithm. Controller 306 includes an MPPT circuit or algorithm for performing the peak power tracking. Peak power tracking and pulse width modulation (PWM) are performed together to achieve the desired input voltage and current. The MPPT in controller 306 may be any conventional MPPT, such as, e.g., perturb and observe (P&O), incremental conductance, etc. However, notably the MPPT is performed on panel 101 directly, i.e., at the input to converter 205, rather than at the output of converter 205. The generated power is then transferred to the output terminals 310 and 312. The outputs of multiple converters 205 may be connected in series, such that the positive lead 312 of one converter 205 is connected to the negative lead 310 of the next converter 205.

In FIG. 3, converter 205 is shown as a buck plus boost converter. The term "buck plus boost" as used herein is a buck converter directly followed by a boost converter as shown in FIG. 3, which may also appear in the literature as "cascaded buck-boost converter". If the voltage is to be lowered, the boost portion is substantially shorted. If the voltage is to be raised, the buck portion is substantially shorted. The term "buck plus boost" differs from buck/boost topology which is a classic topology that may be used when voltage is to be raised or lowered, and sometimes appears in the literature as "cascaded buck-boost". The efficiency of "buck/boost" topology is inherently lower than a buck or a boost. Additionally, for given requirements, a buck-boost converter will need bigger passive components then a buck plus boost converter in order to function. Therefore, the buck plus boost topology of FIG. 3 has a higher efficiency than the buck/boost topology. However, the circuit of FIG. 3 continuously decides whether it is bucking or boosting. In some situations when the desired output voltage is similar to the input voltage, then both the buck and boost portions may be operational. For each converter, substantially all the input power is converted to the output power, such that the conversion efficiency may be 90% or higher in some situations. Further, the controlling is performed by fixing the input current or input voltage of the converter to the maximum power point and allowing output voltage of the converter to vary. For each power source, one or more sensors perform the monitoring of the input power level to the associated converter. In some aspects of the invention, efficiencies of the converters may be quite high and range at about 95%-99%. Moreover, according to embodiments of the subject invention, each of the DC-DC converters is constructed as a power converter, i.e., it transfers to its output the entire power it receives in its input with very low losses.

The controller 306 may include a pulse width modulator, PWM, or a digital pulse width modulator, DPWM, to be used with the buck and boost converter circuits. Controller 306 controls both the buck converter and the boost converter and determines whether a buck or a boost operation is to be performed. In some circumstances both the buck and boost portions may operate together. That is, the input voltage and current are selected independently of the selection of output current and voltage. Moreover, the selection of either input or output values may change at any given moment depending on the operation of the DC power sources. Therefore, in the embodiment of FIG. 3, converter 205 is constructed so that at any given time a selected value of input voltage and current may be up converted or down converted depending on the output requirement.

In one implementation, an integrated circuit (IC) 304 may be used that incorporates some of the functionality of converter 205. IC 304 is optionally a single ASIC able to withstand harsh temperature extremes present in outdoor solar installations. ASIC 304 may be designed for a high mean time between failures (MTBF) of more than 25 years.

However, a discrete solution using multiple integrated circuits may also be used in a similar manner. In the exemplary embodiment shown in FIG. 3, the buck plus boost portion of the converter 305 is implemented as the IC 304. Practical considerations may lead to other segmentations of the system. For example, in one aspect of the invention, the IC 304 may include two ICs, one analog IC which handles the high currents and voltages in the system, and one simple low-voltage digital IC which includes the control logic. The analog IC may be implemented using power FETs which may alternatively be implemented in discrete components, FET drivers, A/Ds, and the like. The digital IC may form controller 306.

In the exemplary circuit 205 shown, the buck converter includes input capacitor 320, transistors 328 and 330, diode 322 positioned in parallel to transistor 328, and inductor 308. Transistors 328, 330 each have a parasitic body diode 324, 326. The boost converter includes inductor 308, which is shared with the buck converter, transistors 348 and 350 a diode 342 positioned in parallel to transistor 350, and output capacitor 340. Transistors 348, 350 each have a parasitic body diode 344, 346.

System 20 includes converters 205 which are connected in series and carry the current from string 203. If a failure in one of the serially connected converters 205 causes an open circuit in failed converter 205, current ceases to flow through the entire string 203 of converters 205, thereby causing system 20 to stop functioning. Aspects of the present invention provide a converter circuit 205 in which electrical components have one or more bypass routes associated with them that carry the current in case of an electrical component failing within one of converters 205. For example, each switching transistor of either the buck or the boost portion of the converter has its own diode bypass. Also, upon failure of inductor 308, the current bypasses the failed inductor 308 through parasitic diodes 344,346.

In FIG. 3, detector/receiver block 207 is shown which is configured to provide an enable signal 209 to microcontroller 306 when the communications signal originating in inverter 104,204 is detected.

Reference in now made to FIG. 4, which illustrate system 40, according to an embodiment of the present invention. For simplicity, a single string 423 is shown of distributed power sources, e.g. solar panels 101a-101d connected to respective power modules 405a-d. Serial string 423 is input to conventional inverter 104 through wires 412 and 410. The output of inverter 104 is connected to and supplies electrical power to the electrical grid. At the input of inverter 104, is connected a signaling mechanism 420 which superimposes a signal on serial string 423 through wires 412 and 410 when inverter 104 is converting power to the grid.

Reference is now also made to FIG. 4B which illustrates in more detail signaling mechanism 420. Signaling mechanism 420 includes a relay 428 which is normally open and controlled by a microcontroller 422. Relay 428 is switched at a given rate, e.g. 100 Hz, and the signal is superimposed by action of relay 428 onto serial string 423 over wires 410 and 412. Microcontroller 422 typically provides the control of the signal, e.g. 100 Hz, during normal operation of distributed power system 40. Microcontroller 422 is typically connected to one or more sensors in order to monitor the operation of inverter 104. In the example of FIG. 4B, microcontroller 422 monitors over-voltage of the input DC voltage to inverter 104. The example shown in FIG. 4B includes an input DC voltage tap 432 connected to an analog to digital converter (A/D) 430, the output of which is provided to microcontroller 422. The tap 432 may be, e.g., a Hall-effect sensors, series connected resistor across which the voltage drop is measured, etc. In one embodiment, an over-voltage condition as measured by microcontroller 422, results in microcontroller 422 stopping the signaling through relay 428 and/or opening one or more protective relays 424, 426 in series with the input DC voltage to inverter 104. Note that one switch 424 or 426 may be enough for performing the required action, and two switches in series are shown solely for the purpose of illustration that double protection might be required by some regulatory bodies. A power management block 434 taps voltage for powering microcontroller 422 and any other active electronics components (not shown) in block 420.

Reference is now made to FIG. 4A which illustrates in more detail certain aspects of power module 405. Integrated with power module 405 is detector/receiver 207 which is configured to receive, optionally amplify and detect the signal, e.g. at 100 Hz, produced by signal mechanism 420. Controller 306 preferably either polls signal input 209 or uses signal input 209 as an interrupt so that only when detector/receiver 207 detects the 100 Hz signal, is module 405 operating in a normal operating mode. Power module 405 is shown to include a bypass diode 414. Optionally, power module 405 may include a conventional DC/DC switching converter with a control loop based on output power. Power module 405 includes at least one switch 416 controlled by controller 306 which functions to stop normal operation of power from the input of module 405 to the output of 405 when signal input 209 is absent indicating that inverter 104 is not transferring power to the electrical grid.

Figure 5:
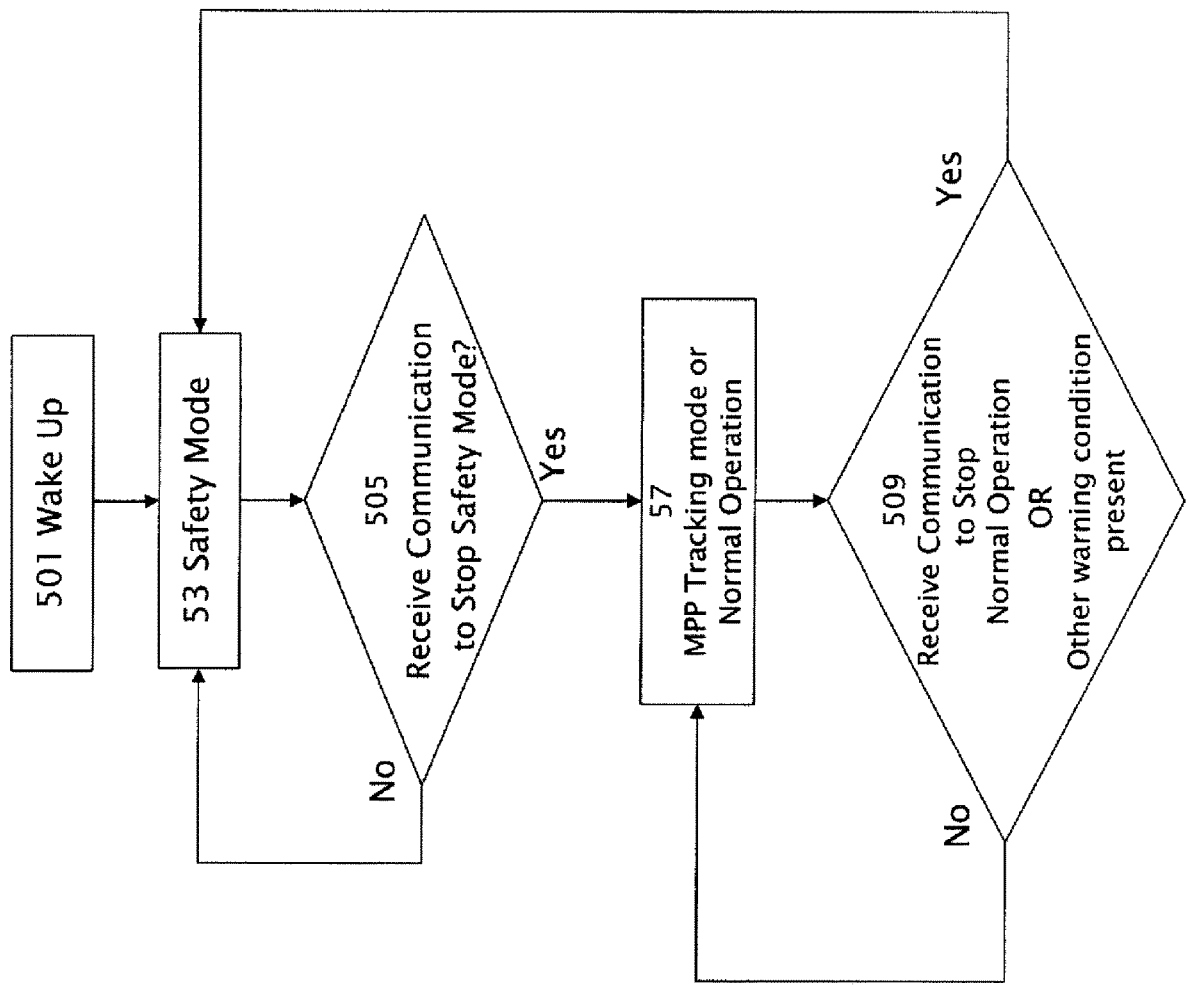
FIG. 5 is a simplified flow diagram illustrating a method for wake-up and shutdown of a power harvesting system with a safety mode, according to a feature of the present invention.

Reference is now made to FIG. 5 which illustrates a simplified method for safe operation of system 40, according to an aspect of the present invention. In step 501, active control circuits, e.g. microcontroller 306, are turned on. Module 205, 405 begins operation (step 53) in a safety mode. In safety mode, output current and/or voltage from module 405 is limited, for instance output voltage is limited to 2 volts and output current is limited to 10 mA so that a person can touch the wires of serial string 203, 423 without any danger of electrocution.

Controller 306 maintains safety mode operation (step 53) until a communications signal, e.g. 100 Hz, is received (decision box 505) by receiver/detector 207 from inverter 204 or signaling block 420. When the communications signal is received (decision block 505) indicating inverter 104 or 204 is connected and converting power, safety mode (step 53) of operation ends. When the communications signal is received (decision block 505), module 405 preferably enters a normal operation mode (step 57), typically with maximum power point tracking. The normal operation of transferring power is maintained as long as the communications signal, e.g. 100 Hz is received from inverter 204 or signal mechanism 420, and no other warning condition is present. If the communications signal is not detected, or another warning condition is present, the normal mode (step 57) is typically ended and power conversion of modules 405 is typically turned off. If in decision box 509, the communications signal is not detected, or another warning condition is present, the normal mode (step 57) is typically ended and power conversion of modules 405 is typically turned off.

Figure 5A:
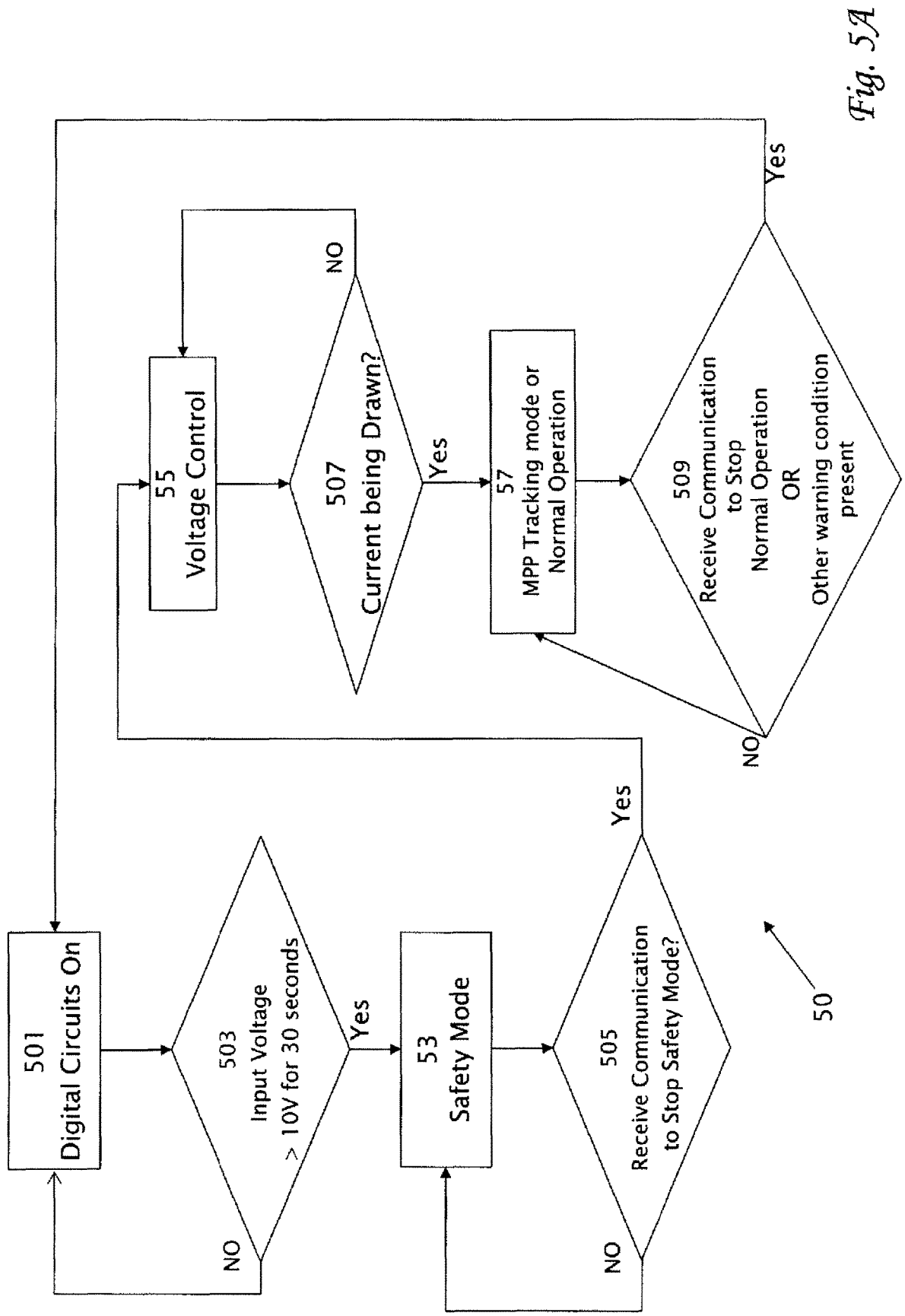
FIG. 5A is a flow diagram illustrating methods for wake-up and shutdown of a power harvesting system, according to embodiments of the present invention, the flow diagram including method steps performed by the power converters/modules.

Reference is now made to FIG. 5A, which illustrates a method 50 for wake-up and shutdown of module 405, according to embodiments of the present invention. Method 50 is applicable to both systems 20 and 40. In step 501, active control circuits, e.g. microcontroller 306, are turned on. Active control circuits are typically turned on (step 501) in the early morning when there is sufficient light to power the active control circuits typically with voltage of DC voltage source 101 reaching three volts. In decision block 503, when voltage output—or power output—from DC voltage source 101 is sufficiently high and stable (e.g. voltage input to module 405 is ten volts for a period of 30 seconds), then module 205,405 begins operation (step 53) in a safety mode. In safety mode, output current and/or voltage from module 405 is limited, for instance output voltage is limited to 2 volts and output current is limited to 10 mA so that a person can touch the wires of serial string 203,423 without any danger of electrocution. Note also, that in this case even if 25 modules are connected in series, the maximum output voltage of the string doesn't exceed 50V— which means the string voltage is still safe. Referring back to FIG. 3, safety mode may be achieved by controller 306 in module 405 by turning on FET 330 and turning off FETS 328, 348, and 350. Output wire 412 is held close to zero volts. Alternatively, the controller 306 may alternate the switches (e.g. switches 324 & 326 of buck converter) at a low duty-cycle in order to maintain a low output voltage.

Referring back to FIG. 5A, controller 306 maintains safety mode operation (step 53) until a communications signal, e.g. 100 Hz, is received by receiver/detector 207 from inverter 204 or signaling block 420. When the communications signal is received (decision block 505) indicating inverter 104 or 204 is connected and converting power, safety mode (step 53) of operation ends. When the communications signal is received (decision block 505), module 405 preferably enters a voltage control mode (step 55) and voltage output between wires 412,410 is slowly ramped up. Voltage continues to ramp up, typically as high as +60V until module 205,405 detects that current is being drawn (step 507). When sufficient current is drawn (step 507), module 205, 405 begins normal operation, (step 57) e.g. for module 205, the normal mode is the maximum power point (MPP) tracking mode of converting DC power from its input to its output by maintain maximum power at its input. The normal operation of transferring power is maintained as long as the communications signal, e.g. 100 Hz is received from inverter 204 or signal mechanism 420, and no other warning condition is present. If the communications signal is not detected, or another warning condition is present, the normal mode (step 57) is typically ended and power conversion of modules 405 is typically turned off. Exemplary warning conditions in decision box 509, which cause module 205, 405 to end normal mode (step 57) and to stop transferring power to its output include: (i) input voltage less than predetermined value, e.g. about 10 volts for 5 seconds, (ii) rapid change in output voltage, for instance greater than 20% in 100 milliseconds, (iii) reception of signal requesting to stop producing power, (iv) not receiving a signal to produce power (in the case where recurring "allow production" signals are required for the converter to function), or (v) output exceeds over voltage threshold caused for instance when multiple modules 205 in string 203 are converting power (step 57) and one of modules 205 of string 203 shuts down, then the other modules 205 of string 203 have a raise of output voltage.

Figure 6:
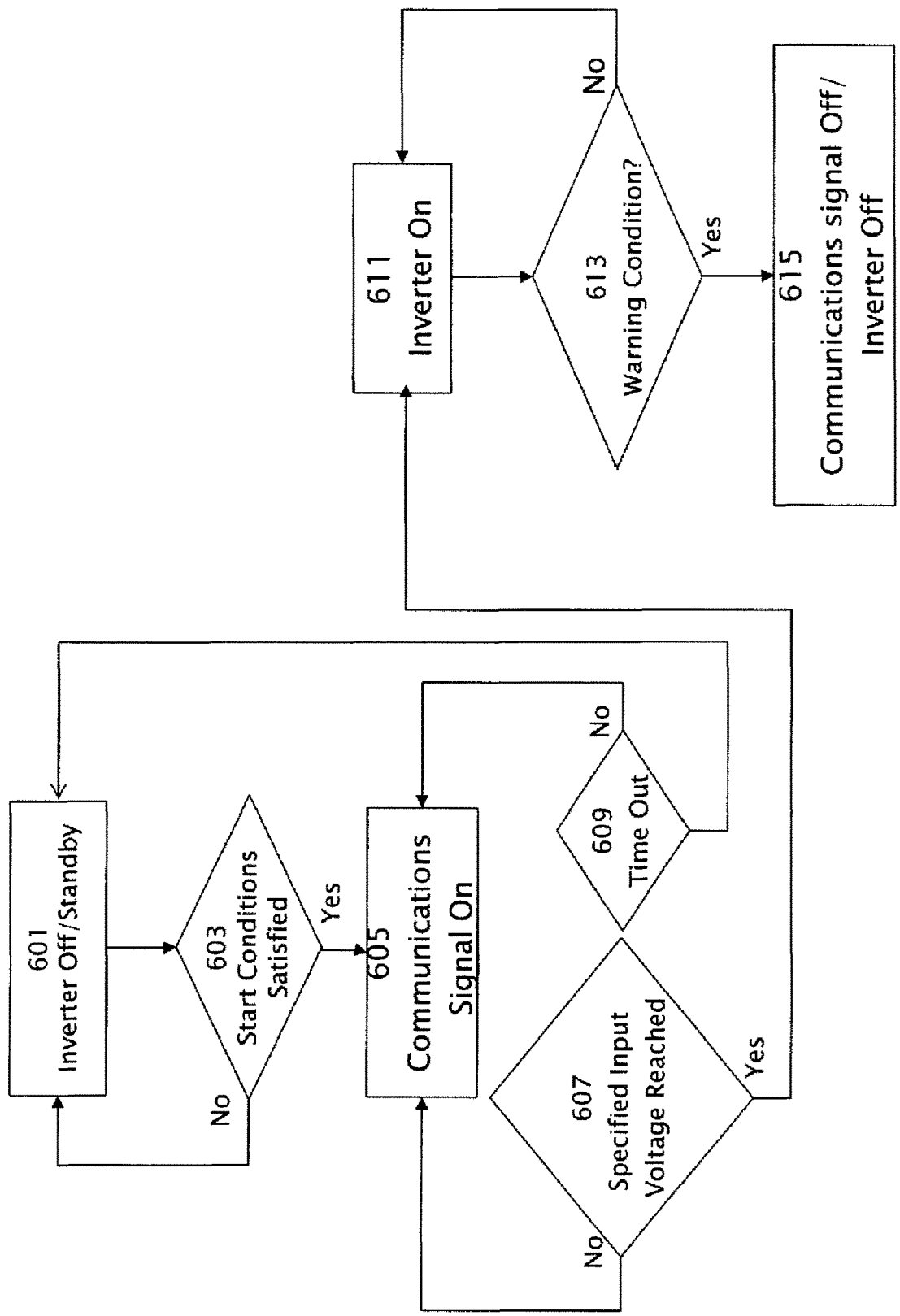
FIG. 6 is another flow diagram illustrating methods for wake-up and shutdown of a power harvesting system, according to embodiments of the present invention, the flow diagram including method steps performed by the inverter of FIG. 2A or signaling block of FIG. 4B.

Reference is now made to FIG. 6, which illustrates a method 60 performed by inverter 204 or signaling block 420 attached at the input of inverter 104. In step 601, inverter 104 is off or inverter 204 is on standby, and not converting power to its output. In decision box 603, start conditions for turning on inverter 104,204 are determined. Typically, as a safety requirement, inverter 104 delays operation (converting power to its output) until after at least 5 minutes of connection to a functioning AC-grid at its output. This safety requirement may be achieved using microcontroller 422 and at least one of relays 424 and 426 in signaling block 420. In inverter 204, a minimum voltage is required at the input to inverter 204 (e.g. if the safety output voltage of each module is 2V, and the minimal-length string allowed contains 5 modules, the inverter will wait until at least 10V are present at its DC input) and only thereafter does inverter 204 begin to charge its input, typically to a specified standard input of 400V.

In step 605, communications signal, e.g 100 Hz, is superimposed on serial string 203,423 either from signaling mechanism 420 or from inverter 204 for instance when at least a 50 Watt load is attached to the output of inverter 204. In decision box 607, when the specified input voltage is reached, e.g 400V for inverter 204, inverter 204 is turned on or inverter 104 is attached to serial string 423 by mechanism 420. In decision box 609, if a time out occurs before the minimum specified input voltage is reached of inverter 204,404 then inverter is returned to the off or standby state (step 601). Otherwise inverter 204,404 is connected or turned on in step 611. Inverter 204, 404 remains on and connected unless a warning condition (decision box 613) occurs. Possible warning conditions include, (i) disconnection from the electrical grid, (ii) electrical grid stops producing power (islanding), (iii) less than 50 Watts transferred in the last minute, (iv) input voltage to inverter 204,404 is over the maximum limit, and (v) input power is over the maximum limit. If a warning condition occurs (decision box 613) communications signal is turned off (step 615) for inverter 404 or inverter 204 is turned off or put into standby.

Figure 7:
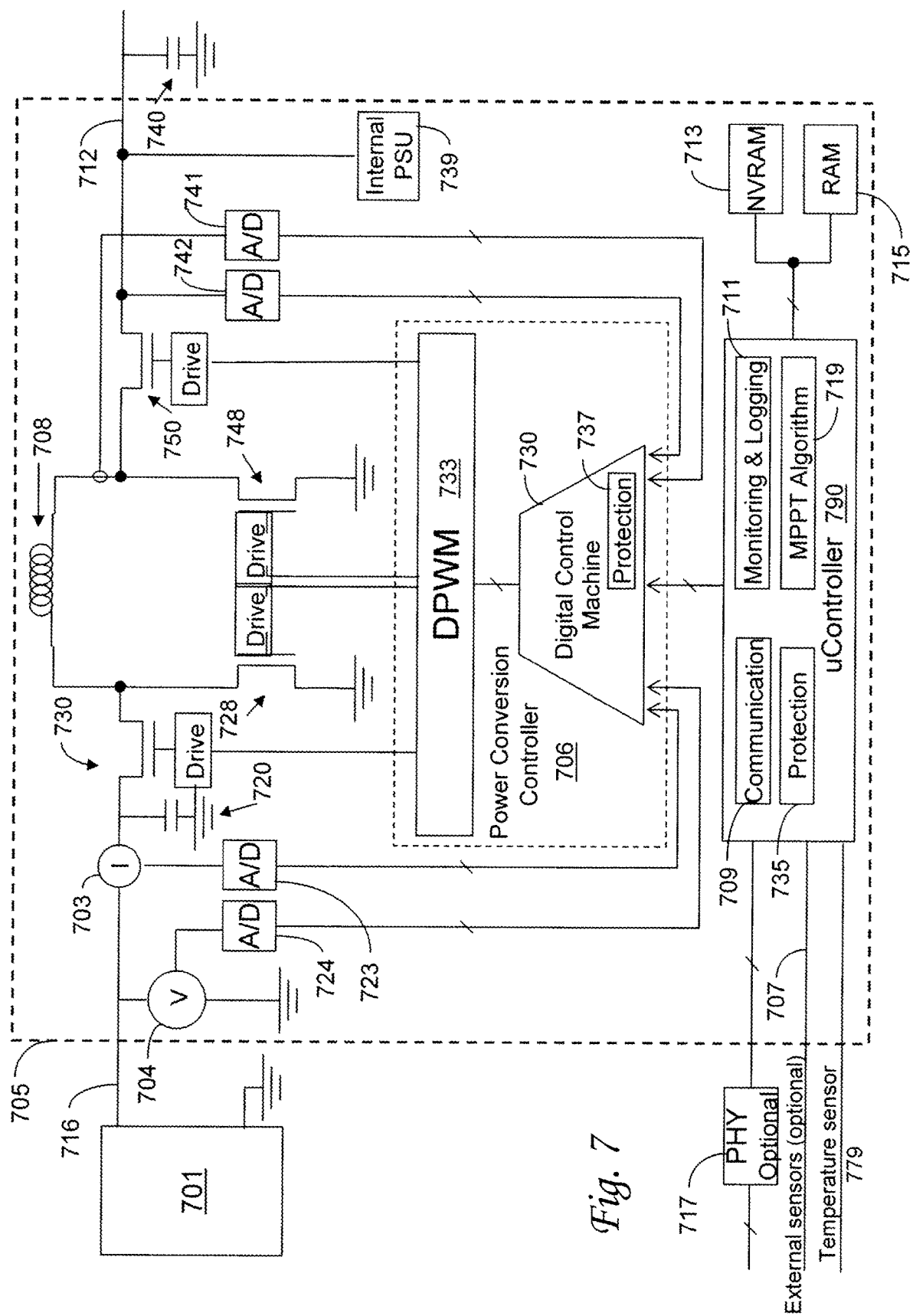
FIG. 7 illustrates a power converter, according to aspects of the invention including control features of the aspects of the invention.
Figure 8A:
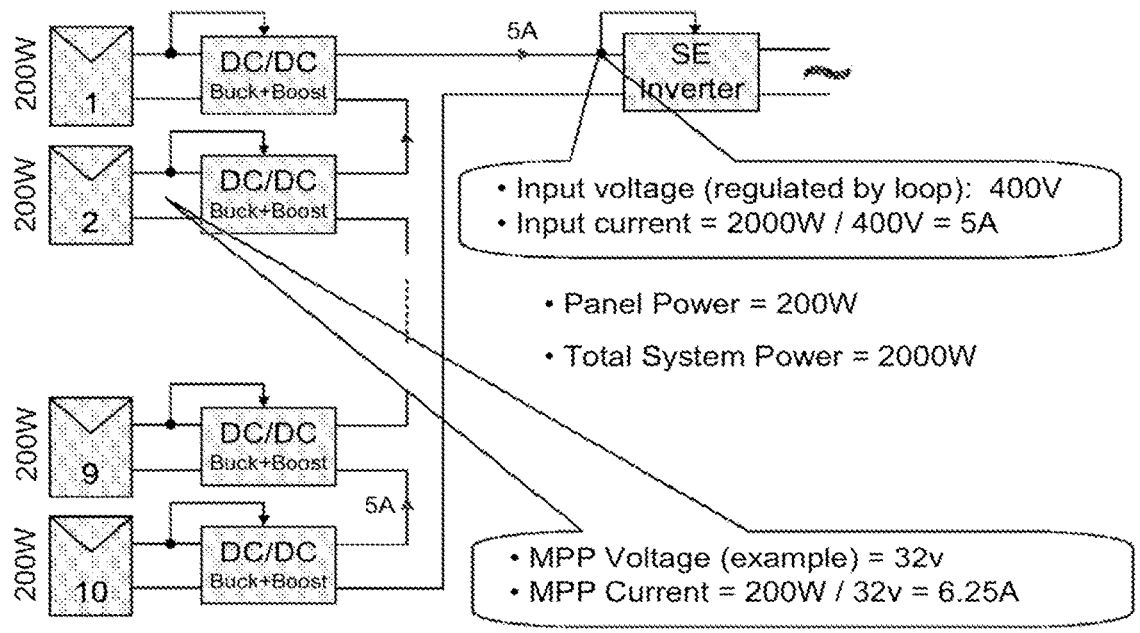
FIGS. 8A-8D illustrate aspects of the present invention incorporated from U.S. application Ser. No. 60/908,095.
Figure 8B:
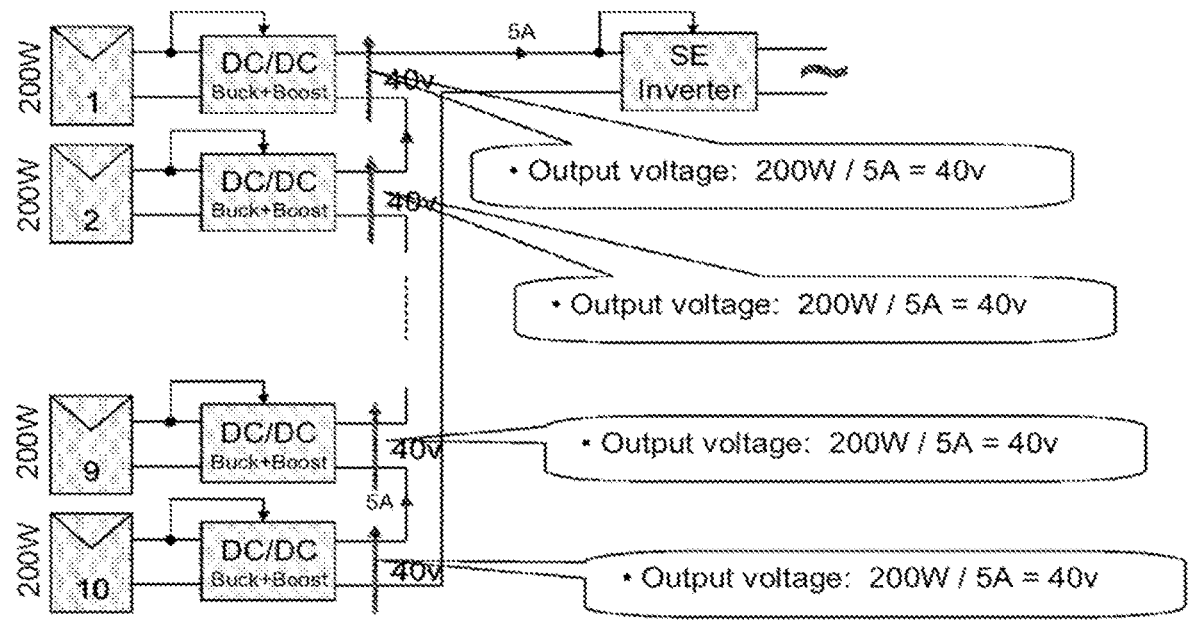
Figure 8C:
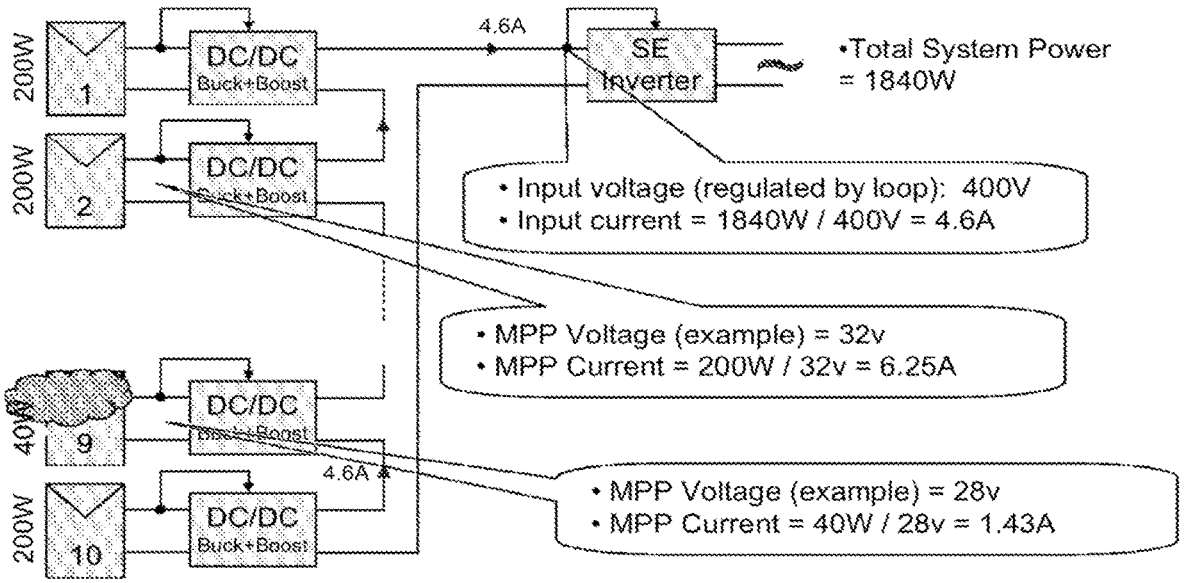
Figure 8D:
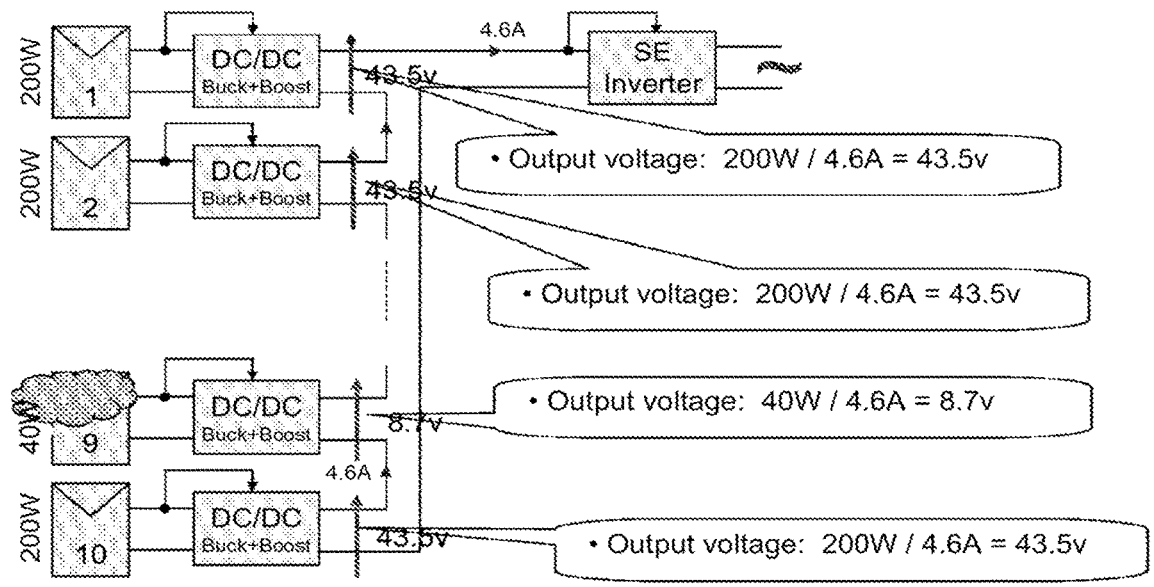

FIG. 7 illustrates a power converter, according to aspects of the invention. FIG. 7 highlights, among others, a monitoring and control functionality of a DC-to-DC converter 705, according to embodiments of the present invention. A DC voltage source 701 is also shown in the figure. Portions of a simplified buck and boost converter circuit are shown for the converter 705. The portions shown include the switching transistors 728, 730, 748 and 750 and the common inductor 708. Each of the switching transistors is controlled by a power conversion controller 706.

The power conversion controller 706 includes the pulse-width modulation (PWM) circuit 733, and a digital control machine 730 including a protection portion 737. The power conversion controller 706 is coupled to microcontroller 790, which includes an MPPT module 719, and may also optionally include a communication module 709, a monitoring and logging module 711, and a protection module 735.

A current sensor 703 may be coupled between the DC power source 701 and the converter 705, and output of the current sensor 703 may be provided to the digital control machine 730 through an associated analog to digital converter 723. A voltage sensor 704 may be coupled between the DC power source 701 and the converter 705 and output of the voltage sensor 704 may be provided to the digital control machine 730 through an associated analog to digital converter 724. The current sensor 703 and the voltage sensor 704 are used to monitor current and voltage output from the DC power source, e.g., the solar panel 701. The measured current and voltage are provided to the digital control machine 730 and are used to maintain the converter input power at the maximum power point.

The PWM circuit 733 controls the switching transistors of the buck and boost portions of the converter circuit. The PWM circuit may be a digital pulse-width modulation (DPWM) circuit. Outputs of the converter 705 taken at the inductor 708 and at the switching transistor 750 are provided to the digital control machine 730 through analog to digital converters 741, 742, so as to control the PWM circuit 733.

A random access memory (RAM) module 715 and a non-volatile random access memory (NVRAM) module 713 may be located outside the microcontroller 790 but coupled to the microcontroller 790. A temperature sensor 779 and one or more external sensor interfaces 707 may be coupled to the microcontroller 790. The temperature sensor 779 may be used to measure the temperature of the DC power source 701. A physical interface 717 may be coupled to the microcontroller 790 and used to convert data from the microcontroller into a standard communication protocol and physical layer. An internal power supply unit 739 may be included in the converter 705.

In various aspects of the invention, the current sensor 703 may be implemented by various techniques used to measure current. In one aspect of the invention, the current measurement module 703 is implemented using a very low value resistor. The voltage across the resistor will be proportional to the current flowing through the resistor. In another aspect of the invention, the current measurement module 703 is implemented using current probes which use the Hall Effect to measure the current through a conductor without adding a series resistor. After translating the current to voltage, the data may be passed through a low pass filter and then digitized. The analog to digital converter associated with the current sensor 703 is shown as the A/D converter 723 in FIG. 7. Aliasing effect in the resulting digital data may be avoided by selecting an appropriate resolution and sample rate for the analog to digital converter. If the current sensing technique does not require a series connection, then the current sensor 703 may be connected to the DC power source 701 in parallel.

In one aspect of the invention, the voltage sensor 704 uses simple parallel voltage measurement techniques in order to measure the voltage output of the solar panel. The analog voltage is passed through a low pass filter in order to minimize aliasing. The data is then digitized using an analog to digital converter. The analog to digital converter associated with the voltage sensor 704 are shown as the A/D converter 724 in FIG. 7. The A/D converter 724 has sufficient resolution to generate an adequately sampled digital signal from the analog voltage measured at the DC power source 701 that may be a solar panel.

The current and voltage data collected for tracking the maximum power point at the converter input may be used for monitoring purposes also. An analog to digital converter with sufficient resolution may correctly evaluate the panel voltage and current. However, to evaluate the state of the panel, even low sample rates may be sufficient. A low-pass filter makes it possible for low sample rates to be sufficient for evaluating the state of the panel. The current and voltage date may be provided to the monitoring and logging module 711 for analysis.

The temperature sensor 779 enables the system to use temperature data in the analysis process. The temperature is indicative of some types of failures and problems. Furthermore, in the case that the power source is a solar panel, the panel temperature is a factor in power output production.

The one or more optional external sensor interfaces 707 enable connecting various external sensors to the converter 705. External sensors are optionally used to enhance analysis of the state of the solar panel 701, or a string or an array formed by connecting the solar panels 701. Examples of external sensors include ambient temperature sensors, solar radiance sensors, and sensors from neighboring panels. External sensors may be integrated into the converter 705 instead of being attached externally.

In one aspect of the invention, the information acquired from the current and voltage sensors 703, 704 and the optional temperature and external sensors 705, 707 may be transmitted to a central analysis station for monitoring, control, and analysis using the communications interface 709. The central analysis station is not shown in the figure. The communication interface 709 connects a microcontroller 790 to a communication bus. The communication bus can be implemented in several ways. In one aspect of the invention, the communication bus is implemented using an off-the-shelf communication bus such as Ethernet or RS422. Other methods such as wireless communications or power line communications, which could be implemented on the power line connecting the panels, may also be used. If bidirectional communication is used, the central analysis station may request the data collected by the microcontroller 790. Alternatively or in addition, the information acquired from sensors 703, 704, 705, 707 is logged locally using the monitoring and logging module 711 in local memory such as the RAM 715 or the NVRAM 713.

Analysis of the information from sensors 703, 704, 705, 707 enables detection and location of many types of failures associated with power loss in solar arrays. Smart analysis can also be used to suggest corrective measures such as cleaning or replacing a specific portion of the solar array. Analysis of sensor information can also detect power losses caused by environmental conditions or installation mistakes and prevent costly and difficult solar array testing.

Consequently, in one aspect of the invention, the microcontroller 790 simultaneously maintains the maximum power point of input power to the converter 705 from the attached DC power source or solar panel 701 based on the MPPT algorithm in the MPPT module 719 and manages the process of gathering the information from sensors 703, 704, 705, 707. The collected information may be stored in the local memory 713, 715 and transmitted to an external central analysis station. In one aspect of the invention, the microcontroller 790 uses previously defined parameters stored in the NVRAM 713 in order to operate. The information stored in the NVRAM 713 may include information about the converter 705 such as serial number, the type of communication bus used, the status update rate and the ID of the central analysis station. This information may be added to the parameters collected by the sensors before transmission.

The converters 705 may be installed during the installation of the solar array or retrofitted to existing installations. In both cases, the converters 705 may be connected to a panel junction connection box or to cables connecting the panels 701. Each converter 705 may be provided with the connectors and cabling to enable easy installation and connection to solar panels 701 and panel cables.

In one aspect of the invention, the physical interface 717 is used to convert to a standard communication protocol and physical layer so that during installation and maintenance, the converter 705 may be connected to one of various data terminals, such as a computer or PDA. Analysis may then be implemented as software which will be run on a standard computer, an embedded platform or a proprietary device.

The installation process of the converters 705 includes connecting each converter 705 to a solar panel 701. One or more of the sensors 703, 704, 705, 707 may be used to ensure that the solar panel 701 and the converter 705 are properly coupled together. During installation, parameters such as serial number, physical location and the array connection topology may be stored in the NVRAM 713.

These parameters may be used by analysis software to detect future problems in solar panels 701 and arrays.

When the DC power sources 701 are solar panels, one of the problems facing installers of photovoltaic solar panel arrays is safety. The solar panels 701 are connected in series during the day when there is sunlight. Therefore, at the final stages of installation, when several solar panels 701 are connected in series, the voltage across a string of panels may reach dangerous levels. Voltages as high as 600V are common in domestic installations. Thus, the installer faces a danger of electrocution. The converters 705 that are connected to the panels 701 may use built-in functionality to prevent such a danger. For example, the converters 705 may include circuitry or hardware of software safety module that limits the output voltage to a safe level until a predetermined minimum load is detected. Only after detecting this predetermined load, the microcontroller 790 ramps up the output voltage from the converter 705.

Another method of providing a safety mechanism is to use communications between the converters 705 and the associated inverter for the string or array of panels. This communication, that may be for example a power line communication, may provide a handshake before any significant or potentially dangerous power level is made available. Thus, the converters 705 would wait for an analog or digital release signal from the inverter in the associated array before transferring power to inverter.

The above methodology for monitoring, control and analysis of the DC power sources 701 may be implemented on solar panels or on strings or arrays of solar panels or for other power sources such as batteries and fuel cells.

FIGS. 8A-8D and the following excerpts are incorporated from U.S. Provisional Application 60/908,095:

a. Safety Measures: One of the problems facing installers of PV systems is safety. Since all panels are connected in series and work is done during the day when there is sunlight, at the final stages of installation - when many panels are connected in series - the voltage across the panels might reach dangerous levels (voltages as high as 600V are common in domestic installations). Thus, the installer faces a real danger of electrocution.

b. In order to prevent such a risk in our proposed solution, the modules connected to the panels may use built-in functionality to prevent such danger. For example, the modules may limit the output voltage to a low (and thus, safe) value as long as it does not detect current drawn from the inverter. Only after detecting such power requirement, it would ramp-up the output voltage.

c. Another way to provide such a safety measure would be to use the communication ability between the modules and the inverter (e.g. power line communication) to provide a handshake which will be required before any significant (read - potentially harmful) amount of power is transmitted over the line. Thus, the modules would wait for a predetermined message from the inverter before transferring power.

d. Inverter: The distributed power harvesting specification describes, in addition to the power converting modules, the use of a novel inverter which includes a shunt regulator to dissipate any excess power that may be produced by the PV panels (or any other DC sources). It may be noted, that in a case where there is usage of all power produces by the array, also a standard inverter may be used successfully. This is the case, for example, where any excess power may be sold back to the utility company and send to the grid. Note that in this case the MPPT functionality of the inverter is not necessary.

e. Furthermore, measures can be taken in the modules to enable use with standard inverter. For example, the module might monitor the voltage at its output, and in case it notices the voltage rises above a predetermined level, stops transferring some of the power from the PV panel to its output. Thus, only the amount of power needed at the input of the inverter is sent, and all excess power is dissipated across the solar panels.

f. The present invention converts the input power of all power sources to its output. In cases where not all power is needed by the load, the excess power can be used to charge batteries in off grid applications. In grid connected application the excess power can be sold back to the power utility company. In cases where both options are not available a shunt regulator is used to dissipate the excess power and ensure that the output voltage does not rise above the determined threshold.

g. To enable the inverter to work at its optimal input voltage the excess power must be dissipated. This can be achieved by selling the excess power to the utility company if possible. Another possible option is to store the excess energy in batteries. This is especially useful in off grid solar arrays. The shunt regulator is configured to dissipate excess power if the power is not stored or soled. This is achieved by allowing current to flow through the shunt regulator once the voltage increases over the inverters maximum input voltage. The current which flows through the shunt regulator will always complement the inverters current. This will ensure that the input voltage of the inverter is constant.

h. The MPPT module is an up/down DC-DC converter with a control loop closed on the input power level. Usually the control loop has medium bandwidth and can track power changes in the array relatively fast. The control loop has certain tracking parameters that are changed at low bandwidth to optimally adapt for slow environmental changes (such as temperature, cell degradation, etc.). Since the control loop monitors the power input, the output voltage of the converter is variable and dependent of the power level transferred through the module and the output load (i.e., the current through all the modules output). The entire system's feedback loop is closed through the shared output current (the inverters input current). This allows for a fixed voltage at the inverters input. For example, suppose a 20 100W panels installation. Should we require a fixed 400V at the inverter's input, the inverter will serve as a current source with current that generates a 400V input voltage (Total power is 2000W. Total current is 2000/400 = 5A. Each module's output voltage is 100W /5A = 20V).

i. Example 1: An electronic system for maximizing electric power, comprising: a. a direct current source, b. a voltage converting electronic module connected to said direct current source, c. said module containing means for maximizing the power output of said current source, d. said module containing output terminals, whereby said system extracts maximum peak power from said direct current source and produces direct current through said output terminals.

j. Example 2: The system of example 1 wherein said direct current source is selected from the group consisting of a photovoltaic cell and a plurality of connected photovoltaic cells.

k. Example 3: The system of example 1 wherein said direct current source is selected from the group consisting of a battery and a plurality of connected batteries.
j. Example 4: The system of example 1 wherein said direct current source is selected from the group consisting of a fuel cell and a plurality of connected fuel cells.
m. Example 5: A plurality of systems described in example 1, wherein said systems are connected in series.
n. Example 6: An installation, comprising: a. the serially connected systems of example 5, b. an inverter, said inverter comprising of: i: direct current input terminals, ii: alternating current output terminals, iii: said input terminals connected to means of converting direct current to alternating current, said alternating current connected to said output terminals, c. said serially connected systems are connected to said inverters input terminals, d. said inverters output terminals connected to an alternating current load, whereby said installation utilizes said direct current sources to produce alternating current.
o. Example 7: The installation of example 6, wherein said inverter has a maximum peak power tracking unit.
p. Example8: The installation of example 6, wherein said inverter has a means of dissipating power not needed by said alternating current load.
q. Example 9: The installation of example 8, wherein said means of dissipating power is a shunt regulator.
r. Example 10: The system of example 1 wherein said module further contains safety means for prevention of electrocution.
s. Example 11: A plurality of systems described in example 10, wherein said systems are connected in series.
t. Example 12: The system of example 1 wherein said module further contains means for bypassing said module in case an event selected from the group consisting of a failure in said module and a failure in said direct current source.
u. Example 13: The system of example 12, wherein said voltage converting module uses a buck converter and a boost converter.
v. Example 14: The system of example 12, wherein said voltage converting module uses a push-pull converter.
w. Example 15: The system of example 12, wherein said voltage converting module uses a flyback converter.
x. Example 16: The system of example 1 wherein said module is comprised of an application specific integrated circuit, and discrete electronic and magnetic components.
y. Example 17: The system of example 1 wherein said module is comprised of a plurality of application specific integrated circuits, and discrete electronic and magnetic components.
z. Example 18: The system of example 1 wherein said module uses a single direct current conversion providing maximum peak power harvesting from said direct current source, whereby said modules could be connected in series to provide overall maximum power harvesting.

The following excerpts are incorporated from U.S. Provisional Application No. 60/916,815, with reference designators updated to refer to the numbering in the pending figures.

a. The term "substantially" in the context of "substantially all input power is converted to output power" refers to high power conversion efficiency greater than ninety per cent
b. The term "microcontroller" as used herein refers to a means of controlling operation of a circuit or algorithm, whether by use of central processing unit (CPU), a digital signal processing (DSP) unit, a state machine either based on discrete components, an FPGA an integrated circuit (IC), or an analog circuit.
c. One of the problems facing installers of photovoltaic solar panel arrays is safety.

Since solar panels 101 are connected in series during the day when there is sunlight, at the final stages of installation - when many panels 101 are connected in series—the voltage across panels 101 may reach dangerous levels. Voltages as high as 600V are common in domestic installations. Thus, the installer faces a real danger of electrocution. In order to prevent such a risk, modules 205 connected to panels 101 may use built-in functionality to prevent such a danger. For example, modules 101 may limit the output voltage to a low (and thus safe) level until a predetermined minimum load is detected. Only after detecting this predetermined power requirement, does microcontroller 790 ramp-up output voltage.

d. Another way to provide such a safety mechanism is to use communications between modules 205 and inverter 204 (e.g. power line communication) to provide a handshake which is required before any significant or potentially dangerous power level is available. Thus, modules 205 would wait for an analog or digital signal from inverter 204 before transferring power to inverter 204.
e. Example 1: A system for combining power from a plurality of direct-current electrical power sources, the system comprising: (a) a plurality of electrical power converters, wherein said power sources are connected respectively as inputs to said electrical power converters, wherein each said electrical power converter converts input power to output power by monitoring and controlling said input power at a maximum power level; wherein respective outputs of said electrical power converters are series connected into at least one series-connected direct-current output; and (b) an inverter which inverts said at least one series-connected direct-current output into an alternating-current output, said inverter controlling voltage of said at least one series-connected direct-current output at a previously-determined voltage by varying the amount of current drawn from said at least one series-connected direct-current output
f. Example 2: The system, according to example 1, wherein all components of said electrical power converters have a current bypass path on failure, whereby upon failure of one component of at least one of said electrical power converters and said at least one electrical power converter becoming a failed electrical power converter, current from all other said electrical power converters flows through said failed electrical power converter.
g. Example 3: The system, according to example 1, whereby for each said electrical power converter, substantially all said input power is converted to said output power, and said controlling is performed by allowing output voltage to vary.

h. Example 4: The system, according to example 3, further comprising: (c) a microcontroller which performs said controlling by adjusting duty cycle using pulse width modulation.
i. Example 5: The system, according to example 1, further comprising: (c) a shunt regulator electrically connected between said at least one series- connected direct-current output and said inverter, said shunt regulator configured to dissipate any electrical power in excess of electrical power required by a load connected to said alternating-current output.
j. Example 6: The system, according to example 1, wherein the direct-current electrical power sources are selected from the group consisting of: solar cells, solar panels, electrical fuel cells and electrical batteries.
k. Example 7: The system, according to example 1, further including for each said power source at least one sensor for performing said monitoring and said controlling of said input power, said at least one sensor selected from the group of sensors consisting of: a current sensor which senses current from said power source, a voltage sensor which senses voltage of said power source, a temperature sensor which senses temperature of said power source, a luminance sensor, a current sensor of the module output, and a voltage sensor of the module output.
l. Example 8: The system, according to example 1, wherein said at least one series-connected direct-current output is a plurality of series-connected direct-current outputs connected in parallel to said inverter.
m. Example 9: The system, according to example 7, further comprising: (c) a microcontroller which performs said monitoring and controlling of said input power wherein said at least one sensor is operatively connected to said microcontroller.
n. Example 10: The system, according to example 9, further comprising: (d) a memory for logging at least one datum resulting from said at least one sensor.
o. Example 11: The system, according to example 9, further comprising: (d) a communications interface for transferring at least one datum resulting from said at least one sensor to a central monitoring facility.
p. Example 12: The system, according to example 1, further comprising: (c) a safety mechanism attached to at least one of said electrical power converters which limits said output power when said inverter is not drawing substantial current.
q. Example 13: A method for combining power from a plurality of direct-current electrical power sources, the method comprising the steps of: (a) connecting the power sources respectively as inputs to a plurality of electrical power converters; (b) for each of said electrical power converters, converting input power to output power by monitoring and controlling said input power at a maximum power level; (c) connecting in series respective outputs of said electrical power converters into at least one series-connected direct-current output; and (d) inverting said at least one series-connected direct-current output into an alternating-current output, by controlling voltage of said at least one series-connected direct-current output at a previously-determined minimal voltage by varying the amount of current drawn from said at least one series-connected direct-current output.
r. Example 14: The method, according to example 13, whereby for each said electrical power converter, substantially all said input power is converted to said output power, and said controlling is performed by allowing output voltage to vary.
s. Example 15: The method, according to example 13, wherein all components of said electrical power converters have a current bypass path on failure, whereby upon failure of one component of at least one of said electrical power converters and said at least one electrical power converter becoming a failed electrical power converter, current from all other said electrical power converters flows through said failed electrical power converter.
t. Example 16: A direct-current (DC)-to-DC electrical power converter which converts input power from a power source to output power by monitoring and controlling said input power at a maximum power level of said power source; wherein all components of said electrical power converter have a current bypass path on failure, whereby upon failure of one component of said electrical power converter wherein said electrical power converter becomes a failed electrical power converter, substantially all current from an external current source flows through said failed electrical power converter despite said failure.
u. Example 17: An electronic system for maximizing electric power, comprising: (a) a direct current source; (b) a power converting electronic module connected to said direct current source; and (c) said module including: (i) means for maximizing the power output of said current source; (ii) output terminals; whereby the system maximizes power from said direct current source and outputs direct current through said output terminals.
v. Example 18: The electronic system, according to example 17, wherein said module includes a direct current power converter selected from the group consisting of buck and boost converters.
w. Example 19: The electronic system, according to example 17, further comprising: (d) a series connection to another said electronic system, thereby producing at least one series-connected direct-current output.
x. Example 20: The electronic system, according to example 19, further comprising: (e) a means for controlling voltage of said at least one series-connected direct-current output at a previously determined minimal voltage by varying the amount of current drawn from said at least one series-connected direct-current output.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the server arts. It is intended that the specification and examples be considered as exemplary only, with a true scope and spirit of the invention being indicated by the following claims.

While the invention has been described with respect to a limited number of embodiments, it will be appreciated that many variations, modifications and other applications of the invention may be made.

The invention claimed is:

1. An efficient solar energy power system comprising:
a plurality of solar panels, each solar panel of said plurality of solar panels having a DC photovoltaic output;
a plurality of DC photovoltaic inputs, each DC photovoltaic input configured to receive power from a respective one of said DC photovoltaic outputs of said plurality of solar panels;
a plurality of buck+boost DC-DC power converters, each buck+boost DC-DC power converter configured to receive said power from a respective one of said plurality of said DC photovoltaic inputs, and each buck+boost DC-DC power converter configured to convert substantially all of said power accepted by said respective DC photovoltaic input to converted DC power;
a control circuit configured to control each of said buck+boost DC-DC power converters to convert substantially all of said power accepted by said respective DC photovoltaic input to said converted DC power, and wherein said control circuit is configured to control each of said buck+boost DC-DC power converters into multiple configurations;
a converted DC power output coupled to said plurality of buck+boost DC-DC power converters and configured to receive said converted DC power;
a DC-AC inverter configured to receive said converted DC power from said converted DC power output; and
an AC power output configured to receive converted AC power from said DC-AC inverter.

2. The efficient solar energy power system of claim 1 wherein said plurality of solar panels comprises a string of solar panels connected serially through the plurality of buck+boost DC-DC power converters at the converted DC power output; and
wherein said control circuit is configured to provide maximum photovoltaic power point tracking control independently for each solar panel.

3. The efficient solar energy power system of claim 1 wherein said control circuit comprises a maximum photovoltaic power point tracking converter dual mode control circuit configured to provide maximum photovoltaic power point tracking control independently for each solar panel and to control each of the plurality of buck+boost DC-DC converters into a buck configuration and into a boost configuration.

4. The efficient solar energy power system of claim 1, further comprising a boundary condition control circuit configured to control said plurality of buck+boost DC-DC converters within a boundary limit of said converted DC power.

5. The efficient solar energy power system of claim 1 wherein said control circuit is configured to control each of said buck+boost DC-DC power converters within an efficiency of at least about 98% efficient photovoltaic conversion.

6. The efficient solar energy power system of claim 1, further comprising one of:
a first switch that switches operation between a buck mode DC-DC power conversion circuit and a boost mode DC-DC power conversion circuit within one of the buck+boost DC-DC converters; and
a shunt switch to bypass, at least some times during power conversion by the buck+boost DC-DC converter, one of the buck mode DC-DC power conversion circuit and the boost mode DC-DC power conversion circuit.

7. The efficient solar energy power system of claim 1, further comprising a junction box.

8. The efficient solar energy power system of claim 7 wherein said junction box comprises one of said plurality of buck+boost DC-DC power converters physically integrated to an individual solar panel.

9. The efficient solar energy power system of claim 1 wherein one of said plurality of buck+boost photovoltaic DC-DC power converters is selected from a group consisting of:
an individual panel dedicated photovoltaic DC-DC power converter; and
a multiple cell dedicated photovoltaic DC-DC power converter.

10. The efficient solar energy power system of claim 9, further comprising:
a string of said plurality of solar panels, wherein the string is formed by connecting outputs of the plurality of buck+boost DC-DC power converters in series to the converted DC power output.

11. The efficient solar energy power system of claim 1, further comprising an interconnection box for a plurality of said DC photovoltaic outputs of said plurality of solar panels.

12. The efficient solar energy power system of claim 11, further comprising an electrical connection between at least one of said plurality of solar panels and said interconnection box.

13. The efficient solar energy power system of claim 1, further comprising a switch that switches operation of one of said at least one buck+boost DC-DC power converters between a first power capability and a second power capability.

14. The efficient solar energy power system of claim 13 wherein said first power capability comprises a single mode power conversion capability and wherein said second power capability comprises a dual mode power conversion capability.

15. The efficient solar energy power system of claim 14, further comprising a shunt switch configured to bypass said dual mode power conversion capability.

16. An efficient solar energy power system comprising:
one or more solar panels each having a DC photovoltaic output;
one or more buck+boost DC-DC power converters, each buck+boost DC-DC power converter configured to receive power from a respective one of said one or more solar panels, wherein each of said one or more buck+boost DC-DC power converters includes a buck configuration DC-DC power conversion circuit responsive to said respective solar panel, and a boost configuration power conversion circuit responsive to said respective solar panel;
a control circuit configured to control each of said one or more buck+boost DC-DC power converters, at least some times, between operation of said buck configuration DC-DC power conversion circuit and operation of said boost configuration DC-DC power conversion circuit, and configured to control said one or more buck+boost DC-DC power converters to convert power with an efficiency greater than ninety percent;
a converted photovoltaic DC power output configured to receive converted DC power from said one or more buck+boost DC-DC power converters;
a DC-AC inverter configured to receive said converted DC power from said converted photovoltaic DC power output; and a photovoltaic AC power output configured to receive converted AC power from said photovoltaic DC-AC inverter.

17. The efficient solar energy power system of claim 16 wherein said control circuit comprises circuitry configured to control each of said buck+boost DC-DC power converters to convert substantially all of said power received from said respective solar panel to said converted DC power.

18. The efficient solar energy power system of claim 17 wherein said control circuit is selected from a group consisting of:
at least about 98% efficient photovoltaic conversion circuitry, at least about 98.5% efficient photovoltaic conversion circuitry, at least about 98% up to about 99% efficient photovoltaic conversion circuitry, and at least about 98.5% up to about 99% efficient photovoltaic conversion circuitry.

19. The efficient solar energy power system of claim 17 wherein said at least one of said one or more buck+boost DC-DC power converter comprises at least one DC-DC power converter configured to convert substantially all of said power received from said respective solar panel to said converted DC power.

20. The efficient solar energy power system of claim 19, further comprising:
one of said one or more strings of said plurality of solar panels connected serially by connecting outputs of the one or more buck+boost DC-DC power converters in series to the converted DC power output.

21. An efficient solar energy power system comprising:
one or more strings of a plurality of solar panels, one or more of said solar panels having multiple solar cells;
one or more buck+boost DC-DC power converters, each of said buck+boost DC-DC power converters configured to receive power from a respective one of said one or more solar panels having said multiple cells, and each of said buck+boost DC-DC power converters configured to track a maximum photovoltaic power point of said respective solar panel having said multiple cells;
a control circuit configured to control each of said one or more buck+boost DC-DC power converters between a buck configuration and a boost configuration, the control circuit further configured to control each of said plurality of buck+boost converters to track said maximum photovoltaic power point of said respective solar panel having said multiple cells;
a DC-AC inverter configured to receive converter DC power from said one or more buck+boost DC-DC power converters; and
a photovoltaic AC power output configured to receive converted AC power from said photovoltaic DC-AC inverter.

22. The efficient solar energy power system of claim 16, further comprising a junction box, wherein said junction box comprises at least one of said a plurality of buck+boost DC-DC power converters physically integrated to an individual solar panel.

23. The efficient solar energy power system of claim 16 wherein at least one of said one or more of buck+boost DC-DC power converters is selected from a group consisting of:
at least one individual panel dedicated DC-DC power converter configured to convert substantially all of said power received by respective solar panel to said converted DC power; and at least one multiple cell dedicated DC-DC power converter configured to convert substantially all of said power received by said respective solar panel, which has multiple solar cells, to said converted DC power.

24. The efficient solar energy power system of claim 23, further comprising:
a string of said plurality of solar panels, wherein the string is formed by connecting outputs of the one or more buck+boost DC-DC power converters in series to the converted DC power output.

25. The efficient solar energy power system of claim 16, further comprising an interconnection box for said DC photovoltaic outputs of said one or more solar panels.

26. The efficient solar energy power system of claim 25, further comprising an electrical connection between at least one of said one or more solar panels and said interconnection box.

27. The efficient solar energy power system of claim 16, further comprising one of:
a conversion operation switch that switches operation between said buck mode DC-DC power conversion circuit and said boost mode DC-DC power conversion circuit; and
a shunt switch operation disable element configured to bypass at least one of said buck mode DC-DC power conversion circuit and said boost mode DC-DC power conversion circuit at least some times.

28. The efficient solar energy power system of claim 16 or 21, further comprising a junction box.

29. The efficient solar energy power system of claim 21, further comprising one of:
a conversion operation switch that switches operation between a buck mode DC-DC power conversion circuit and a boost mode DC-DC power conversion circuit; and
a shunt switch configured to bypass at least one of said buck mode DC-DC power conversion circuit and said boost mode DC-DC power conversion circuit at least some times.

30. The efficient solar energy power system of claim 21, further comprising a junction box, wherein said junction box comprises said one of the one or more buck+boost DC-DC power converters physically integrated to an individual solar panel.

31. The efficient solar energy power system of claim 21, further comprising an interconnection box for DC photovoltaic outputs of said at least one of said solar panels.

32. The efficient solar energy power system of claim 31, further comprising an electrical connection between at least one of said one or more solar panels and said interconnection box.

33. An efficient method of solar energy power harvesting comprising the steps of:
creating a DC photovoltaic output from a solar panel of a plurality of solar panels;
connecting said DC photovoltaic output to a DC photovoltaic input of a photovoltaic DC-DC converter; wherein the photovoltaic DC-DC converter includes a buck+boost converter;
converting said DC photovoltaic input into a converted DC photovoltaic output using at least some times a buck mode of the photovoltaic DC-DC converter and at least other times a boost mode of said photovoltaic DC-DC converter;
controlling said photovoltaic DC-DC converter in said buck and boost modes while said photovoltaic DC-DC converter converts said DC photovoltaic input into said converted DC photovoltaic output;

controlling transitions of said photovoltaic DC-DC converter between said buck and boost mode conversion by using a maximum power peak tracking control such that substantially all power of said DC photovoltaic input is transferred to said converted DC photovoltaic output;

connecting said converted DC photovoltaic output as part of a converted DC photovoltaic input to a DC-AC inverter; and inverting said converted DC photovoltaic input into an inverted AC photovoltaic output.

34. An efficient method of solar energy power creation as described in claim 33 wherein said step of controlling transitions of said photovoltaic DC-DC converter between said buck and boost mode conversion by using said maximum power peak tracking control providing high efficiency power conversion by said photovoltaic DC-DC converter comprises a step of:

continuously controlling said photovoltaic DC-DC converter between said buck and boost modes.

35. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

alternating between said boost mode of said photovoltaic DC-DC converter at some times and said buck mode of said photovoltaic DC-DC converter at other times.

36. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

increasing at some times a photovoltaic load impedance of said DC photovoltaic input and decreasing at other times said photovoltaic load impedance of said DC photovoltaic input.

37. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

increasing at some times a voltage of said DC photovoltaic input and decreasing at other times said voltage of said DC photovoltaic input.

38. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

controlling a voltage of said converted DC photovoltaic input to said DC-AC inverter.

39. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

controlling a voltage of said converted DC photovoltaic input to said DC-AC inverter through control of said photovoltaic DC-DC converter.

40. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

protecting said DC-AC inverter through control of said photovoltaic DC-DC converter by controlling a voltage of said converted photovoltaic DC output in response to a controlled current drawn on said converted DC photovoltaic input to said DC-AC inverter.

41. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

limiting a voltage of said converted DC photovoltaic output through control of a photovoltaic DC-DC converter until a power requirement of the DC-AC inverter is detected.

42. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

controlling said photovoltaic DC-DC converter in response to a communication from said DC-AC inverter indicating it is configured to receive power.

43. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

slavedly controlling said converting in response to a detected power requirement of said DC-AC converter.

44. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

controlling said photovoltaic DC-DC converter in response to a controlled current limit at the converted DC photovoltaic input to the DC-AC inverter.

45. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

limiting operation of said photovoltaic DC-DC converter in response to a detected operating condition of said DC-AC inverter.

46. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

controlling said photovoltaic DC-DC converter within a boundary limit of said converted DC photovoltaic output.

47. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:

continuously controlling said photovoltaic DC-DC converter between said buck and boost modes by using said maximum power peak tracking control closed on the DC photovoltaic input without said photovoltaic DC-DC converter imposing controls on said converted DC photovoltaic output such that substantially all power of said DC photovoltaic input is transferred to said converted DC photovoltaic output.

48. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:
continuously controlling said photovoltaic DC-DC converter between said buck and boost modes.

49. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:
adjusting duty cycle switching of said photovoltaic DC-DC converter in response to an operating threshold between increasing and decreasing a voltage of the DC photovoltaic input as controlled by said maximum power peak tracking control.

50. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:
pulse width modulating switches in said photovoltaic DC-DC converter to increase and decrease a voltage of said DC photovoltaic input.

51. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:
maximum power peak tracking duty cycle switching of said photovoltaic DC-DC converter.

52. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:
controlling a duty cycle switching of said photovoltaic DC-DC converter in response to a controlled voltage limit at the converted DC photovoltaic input to the DC-AC inverter.

53. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step of:
controlling a duty cycle switching of said photovoltaic DC-DC converter in response to a controlled current limit at the converted DC photovoltaic input to the DC-AC inverter.

54. An efficient method of solar energy power creation as described in claim 33 wherein said step of controlling said photovoltaic DC-DC converter while said photovoltaic DC-DC converter converts said DC photovoltaic input into said converted DC photovoltaic output comprises a step selected from a group consisting of:
alternating between said boost mode of said photovoltaic DC-DC converter at some times and said buck mode of said photovoltaic DC-DC converter at other times;
increasing at some times a photovoltaic load impedance of said DC photovoltaic input and decreasing at other times said photovoltaic load impedance of said DC photovoltaic input;
increasing at some times a voltage of said DC photovoltaic input and decreasing at other times said voltage of said DC photovoltaic input;
controlling a voltage of said converted DC photovoltaic input to said DC-AC inverter;
controlling a voltage of said converted DC photovoltaic input to said DC-AC inverter through control of said photovoltaic DC-DC converter;
protecting said DC-AC inverter through control of said photovoltaic DC-DC converter by controlling a voltage of said converted photovoltaic DC output in response to a controlled current drawn on said converted DC photovoltaic input to said DC-AC inverter; limiting a voltage of said converted DC photovoltaic output through control of a photovoltaic DC-DC converter until a power requirement of the DC-AC inverter is detected;
controlling said photovoltaic DC-DC converter in response to a communication from said DC-AC inverter indicating it is configured to receive power;
slavedly controlling said converting in response to a detected power requirement of said DC-AC converter;
controlling said photovoltaic DC-DC converter in response to a controlled current limit at the converted DC photovoltaic input to the DC-AC inverter;
limiting operation of said photovoltaic DC-DC converter in response to a detected operating condition of said DC-AC inverter;
controlling said photovoltaic DC-DC converter within a boundary limit of said converted DC photovoltaic output;
continuously controlling said photovoltaic DC-DC converter between said buck and boost modes by using said maximum power peak tracking control closed on the DC photovoltaic input without said photovoltaic DC-DC converter imposing controls on said converted DC photovoltaic output such that substantially all power of said DC photovoltaic input is transferred to said converted DC photovoltaic output;
continuously controlling said photovoltaic DC-DC converter between said buck and boost modes;
adjusting duty cycle switching of said photovoltaic DC-DC converter in response to an operating threshold between increasing and decreasing a voltage of the DC photovoltaic input as controlled by said maximum power peak tracking control;
pulse width modulating switches in said photovoltaic DC-DC converter to increase and decrease a voltage of said DC photovoltaic input;
maximum power peak tracking duty cycle switching of said photovoltaic DC-DC converter;
controlling a duty cycle switching of said photovoltaic DC-DC converter in response to a controlled voltage limit at the converted DC photovoltaic input to the DC-AC inverter; and
controlling a duty cycle switching of said photovoltaic DC-DC converter in response to a controlled current limit at the converted DC photovoltaic input to the DC-AC inverter; and
all permutations and combinations of each of the above.

55. An efficient method of solar energy power creation as described in claim 33 wherein said step of controlling said photovoltaic DC-DC converter in said buck and boost modes while said photovoltaic DC-DC converter converts said DC photovoltaic input into said converted DC photovoltaic output comprises a step of:
bypassing one of said buck mode and said boost mode by controlling a switch connected to ground in said photovoltaic DC-DC converter.

56. An efficient method of solar energy power harvesting as described in claim 33, further comprising a step of physically integrating said photovoltaic DC-DC converter with an individual solar panel.

57. An efficient method of solar energy power harvesting as described in claim 33, further comprising a step of incorporating said photovoltaic DC-DC converter into said solar panel.

58. An efficient method of solar energy power creation as described in claim 33, further comprising closing the maximum power peak tracking control only on the solar panel coupled to the DC photovoltaic input, wherein the solar panel includes a plurality of connected photovoltaic cells.

59. An efficient method of solar energy power harvesting as described in claim 33, wherein said step of converting said DC photovoltaic input into a converted DC photovoltaic output comprises the step of utilizing switchmode DC-DC converter circuitry.

60. An efficient method of solar energy power harvesting as described in claim 33, wherein said step of converting said at least one DC photovoltaic input into a converted DC photovoltaic output comprises:
a step of utilizing switchmode DC-DC converter circuitry, and
a step of alternatingly switching between said boost mode of said photovoltaic DC-DC converter and said buck mode of said photovoltaic DC-DC converter.

61. An efficient method of solar energy power harvesting as described in claim 60 wherein said step of converting said DC photovoltaic input comprises a step of configuring a switch in said DC-DC converter to a constant setting to bypass said buck or boost modes during said converting.

62. An efficient method of solar energy power harvesting as described in claim 60 wherein said step of converting said DC photovoltaic input into said converted DC photovoltaic output comprises a step selected from a group consisting of:
solar power converting with at least about 98% efficiency, solar power converting with at least about 98.5% efficiency, solar power converting with at least about 98% up to about 99% efficiency, and solar power converting with at least about 98.5% up to about 99% efficiency.

63. An efficient method of solar energy power harvesting as described in claim 60, further comprising a step of
interfacing said inverted AC photovoltaic output with an AC power grid.

64. An efficient method of solar energy power creation as described in claim 33, wherein said step of converting said DC photovoltaic input into a converted DC photovoltaic output comprises the steps of:
interrupting a transmission of photovoltaic power in said photovoltaic DC-DC converter with serially connected switches; and
shunting a transmission of said photovoltaic power in said photovoltaic DC-DC converter with a switch connected to ground.

65. An efficient method of solar energy power creation as described in claim 64 wherein said step of converting said DC photovoltaic input into said converted DC photovoltaic output comprises steps of:
capacitively storing parallel energy at least some time during said step of converting; and
inductively storing series energy at least some time during said step of converting.

66. An efficient method of solar energy power creation as described in claim 33, wherein said step of converting said DC photovoltaic input into said converted DC photovoltaic output comprises a step of providing opposing modalities of photovoltaic DC-DC power conversion.

67. An efficient method of solar energy power creation as described in claim 33, further comprising a step of changing between said buck and boost modes in response to at least one photovoltaic power condition.

68. An efficient method of solar energy power creation as described in claim 67 wherein said step of changing between said buck and boost modes in response to at least one photovoltaic power condition comprises a step of causing a change in said modes at a threshold between increasing and decreasing a voltage of said DC photovoltaic input.

69. An efficient method of solar energy power creation as described in claim 33, further comprising a step of controlling said photovoltaic DC-DC converter within a boundary limit of said converted DC photovoltaic output during said converting.

70. An efficient method of solar energy power creation as described in claim 69 further comprising a step of
independently controlling a current and a voltage of said DC photovoltaic input apart from said step of controlling said photovoltaic DC-DC converter within a boundary limit of said converted DC photovoltaic output during said converting.

71. An efficient method of solar energy power creation as described in claim 69, further comprising a step of controlling a maximum photovoltaic inverter input voltage output by said photovoltaic DC-DC converter.

72. An efficient method of solar energy power creation as described in claim 69, further comprising a step of:
alternating between said boost mode of said photovoltaic DC-DC converter at some times and said buck mode of said photovoltaic DC-DC converter at other times;
increasing at some times a photovoltaic load impedance of said DC photovoltaic input and decreasing at other times said photovoltaic load impedance of said DC photovoltaic input;
controlling a voltage of said converted DC photovoltaic input to said DC-AC inverter;
controlling a voltage of said converted DC photovoltaic input to said DC-AC inverter through control of said photovoltaic DC-DC converter;
protecting said DC-AC inverter through control of said photovoltaic DC-DC converter by controlling a voltage of said converted photovoltaic DC output in response to a controlled current drawn on said converted DC photovoltaic input to said DC-AC inverter;
controlling said at least one DC photovoltaic input into said converted DC photovoltaic output by closing a maximum power peak tracking control loop on said photovoltaic output from said a string of solar cells without said photovoltaic DC-DC converter imposing controls on said converted DC photovoltaic output such that substantially all power of said DC photovoltaic input is transferred to said converted DC photovoltaic output;
limiting a voltage of said converted DC photovoltaic output through control of a photovoltaic DC-DC converter until a power requirement of the DC-AC inverter is detected;
protecting said DC-AC inverter through control of said photovoltaic DC-DC converter controlling a voltage of said converted photovoltaic DC output in response to a communication from said DC-AC inverter indicating it is configured to receive power; or
slavedly controlling said converting in response to a detected power requirement of said DC-AC converter.

73. An efficient method of solar energy power creation as described in claim 33, further comprising steps of:
serially interrupting a transmission of photovoltaic power through circuitry such that said interrupting can occur in at least two separate semiconductor switch locations in said DC-DC converter; and
shunting a transmission of said photovoltaic power to ground through circuitry such that said shunting can occur in at least two separate semiconductor switch locations in said DC-DC converter.

74. An efficient method of solar energy power creation as described in claim 33, wherein said step of converting said DC photovoltaic input comprises the step of duty cycle switching said photovoltaic DC-DC converter.

75. An efficient method of solar energy power creation as described in claim 74 wherein said step of duty cycle switching said photovoltaic DC-DC converter comprises a step of:
adjusting duty cycle switching of said photovoltaic DC-DC converter in response to an operating threshold between increasing and decreasing a voltage of the DC photovoltaic input as controlled by said maximum power peak tracking control.

76. An efficient method of solar energy power creation as described in claim 74 wherein said step of duty cycle switching a photovoltaic DC-DC converter comprises the step of:
continuously configuring the DC-DC converter between buck switching and boost switching of said photovoltaic DC-DC converter in response to an operating threshold between increasing and decreasing a voltage of the DC photovoltaic input as controlled by said maximum power peak tracking control.

77. An efficient method of solar energy power creation as described in claim 74 wherein said step of duty cycle switching a photovoltaic DC-DC converter comprises the step of
controlling a duty cycle switching of said photovoltaic DC-DC converter in response to a controlled voltage limit at the converted DC photovoltaic input to the DC-AC inverter.

78. An efficient method of solar energy power creation as described in claim 74 further comprising a step of maximum photovoltaic power point duty cycle switching a photovoltaic DC-DC converter.

79. An efficient method of solar energy power harvesting as described in claim 74 wherein said step of duty cycle switching said photovoltaic DC-DC converter comprises a step of
controlling a duty cycle switching of said photovoltaic DC-DC converter in response to a controlled current limit at the converted DC photovoltaic input to the DC-AC inverter.

80. An efficient method of solar energy power harvesting as described in claim 74 wherein said step of duty cycle switching said photovoltaic DC-DC converter comprises a step of
transiently establishing opposing photovoltaic duty cycle switching modes in said photovoltaic DC-DC converter.

81. An efficient method of solar energy power harvesting comprising the steps of:
creating a DC photovoltaic output from a solar panel of a plurality of solar panels;
connecting said DC photovoltaic output to a DC photovoltaic input of a photovoltaic DC-DC converter;
converting said DC photovoltaic input into a converted DC photovoltaic output at least some times with said photovoltaic DC-DC converter increasing a load impedance of the DC photovoltaic output from the solar panel and at least other times with said photovoltaic DC-DC converter decreasing said load impedance of said DC photovoltaic output from the solar panel;
controlling said photovoltaic DC-DC converter to increase and decrease said load impedance of said DC photovoltaic output from the solar panel while said photovoltaic DC-DC converter converts said DC photovoltaic input into said converted DC photovoltaic output;
controlling, with a maximum power peak tracking control loop, transitions of said photovoltaic DC-DC converter between said increasing and said decreasing of said load impedance of said DC photovoltaic output from said solar panel to efficiently transfer substantially all power of said DC photovoltaic input to said converted DC photovoltaic output;
connecting said converted DC photovoltaic output as part of a converted DC photovoltaic input to a DC-AC inverter; and
inverting said converted DC photovoltaic input into an inverted AC photovoltaic output.

82. An efficient method of solar energy power creation as described in claim 81, wherein said step of controlling, with a maximum power peak tracking control loop, transitions of said photovoltaic DC-DC converter between said increasing and said decreasing of said load impedance of said DC photovoltaic output from said solar panel to efficiently transfer substantially all power of said DC photovoltaic input to said converted DC photovoltaic output includes:
converting said DC photovoltaic input into said converted DC photovoltaic output by closing said maximum power peak tracking control loop on said DC photovoltaic input without said photovoltaic DC-DC converter controlling a voltage on said converted DC photovoltaic output such that substantially all power of said DC photovoltaic input is transferred to said converted DC photovoltaic output.

83. An efficient method of solar energy power harvesting, the method comprising the steps of:
creating a DC photovoltaic output from a solar panel of a plurality of solar panels;
connecting said DC photovoltaic output to a DC photovoltaic input of a photovoltaic DC-DC converter;
converting said DC photovoltaic input into a converted DC photovoltaic output with said photovoltaic DC-DC converter;
controlling said photovoltaic DC-DC converter by closing a maximum power peak tracking control loop on the DC photovoltaic input at least some times while said photovoltaic DC-DC converter converts said DC photovoltaic input into said converted DC photovoltaic output;
connecting said converted DC photovoltaic output as part of a converted DC photovoltaic input to a DC-AC inverter, wherein said controlling of said photovoltaic DC-DC converter further includes controlling a current of said converted DC photovoltaic output based on an input requirement of said DC-AC inverter; and
inverting said converted DC photovoltaic input into an inverted AC photovoltaic output.

84. An efficient method of solar energy power harvesting as described in claim 83:
- wherein said step of creating said DC photovoltaic output from said solar panel of said plurality of solar panels comprises a step of creating said DC photovoltaic output from said solar panel in a string of said plurality of solar panels; and
- wherein said step of controlling said photovoltaic DC-DC converter by closing said maximum power peak tracking control loop on the DC photovoltaic input at least some times while said photovoltaic DC-DC converter converts said DC photovoltaic input into said converted DC photovoltaic output comprises closing said maximum power peak tracking control loop on only said solar panel in said string of said plurality of solar panels while said photovoltaic DC-DC converter converts said DC photovoltaic input into said converted DC photovoltaic output.

85. An efficient method of solar energy power harvesting as described in claim 83, further comprising the steps of:
- controlling said photovoltaic DC-DC converter within a boundary limit of said converted DC photovoltaic output during said converting.

86. An efficient method of solar energy power harvesting as described in claim 83 wherein said step of controlling said photovoltaic DC-DC converter by closing said maximum power peak tracking control loop on the DC photovoltaic input at least some times while said photovoltaic DC-DC converter converts said DC photovoltaic input into said converted DC photovoltaic output comprises a step of:
- bypassing one of a buck converter and a boost converter by controlling a switch connected to ground in said photovoltaic DC-DC converter.

87. An efficient method of solar energy power creation as described in claim 83, wherein said step of controlling said photovoltaic DC-DC converter includes:
- converting said at least one DC photovoltaic input into said converted DC photovoltaic output by closing a maximum power peak tracking control loop on said DC photovoltaic input without said photovoltaic DC-DC converter controlling a voltage on said converted DC photovoltaic output such that substantially all power of said DC photovoltaic input is transferred to said converted DC photovoltaic output.

* * * * *

UNITED STATES PATENT AND TRADEMARK OFFICE
CERTIFICATE OF CORRECTION

| | | |
|---|---|---|
| PATENT NO. | : 11,579,235 B2 | Page 1 of 1 |
| APPLICATION NO. | : 13/430388 | |
| DATED | : February 14, 2023 | |
| INVENTOR(S) | : Adest et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 3926 days.

Signed and Sealed this
Seventh Day of January, 2025

Derrick Brent
*Acting Director of the United States Patent and Trademark Office*